(12) United States Patent
Lu et al.

(10) Patent No.: US 9,190,493 B2
(45) Date of Patent: Nov. 17, 2015

(54) PHOTOPATTERNABLE MATERIALS AND RELATED ELECTRONIC DEVICES AND METHODS

(71) Applicant: Polyera Corporation, Skokie, IL (US)

(72) Inventors: Shaofeng Lu, Wilmette, IL (US); Daniel Batzel, Skokie, IL (US); Chun Huang, Arlington Heights, IL (US); Minhuei Wang, Kaohsiung (TW); Meko McCray, Chicago, IL (US); Yu Xia, Northbrook, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 0 days.

(21) Appl. No.: 14/332,332

(22) Filed: Jul. 15, 2014

(65) Prior Publication Data

US 2015/0021597 A1 Jan. 22, 2015

Related U.S. Application Data

(60) Provisional application No. 61/846,177, filed on Jul. 15, 2013.

(51) Int. Cl.

| C08F 2/46 | (2006.01) |
|---|---|
| C08G 61/04 | (2006.01) |
| H01L 29/66 | (2006.01) |
| H01L 29/786 | (2006.01) |
| G03F 7/038 | (2006.01) |
| C08G 65/40 | (2006.01) |
| C08G 65/48 | (2006.01) |

(52) U.S. Cl.
CPC ...... *H01L 29/66742* (2013.01); *C08G 65/4006* (2013.01); *C08G 65/48* (2013.01); *G03F 7/0384* (2013.01); *H01L 29/7869* (2013.01)

(58) Field of Classification Search
CPC .. H01L 29/667; H01L 27/7869; C08G 65/48; C08G 65/4006; G03F 7/0384
USPC .................................................. 522/1; 520/1
See application file for complete search history.

(56) References Cited

U.S. PATENT DOCUMENTS

| 5,235,044 A | 8/1993 | Mercer et al. ................ 534/551 |
|---|---|---|
| 5,387,657 A | 2/1995 | Hefner, Jr. et al. ........... 525/523 |
| 7,442,760 B2 | 10/2008 | Roberts et al. ............... 528/423 |
| 8,143,093 B2 | 3/2012 | Ye ............................... 438/104 |
| 2004/0062947 A1 | 4/2004 | Lamansky et al. ............ 428/690 |
| 2010/0200857 A1* | 8/2010 | Shimada ....................... 257/59 |
| 2011/0266534 A1 | 11/2011 | Yan et al. ....................... 257/40 |

FOREIGN PATENT DOCUMENTS

| WO | 2009/080797 | 7/2009 |
|---|---|---|
| WO | 2012/088316 | 6/2012 |
| WO | 2013/083506 | 6/2013 |

OTHER PUBLICATIONS

Hamciuc, C. et al., "Aromatic Polyethers Containing 1,3,4-Oxadiazole Rings," *Revue Roumaine de Chimie*, 2006, 51(1), 53-59.

\* cited by examiner

*Primary Examiner* — Ling Choi
*Assistant Examiner* — Jessica E Whiteley
(74) *Attorney, Agent, or Firm* — Karen K. Chan

(57) ABSTRACT

The present polymeric materials can be patterned with relatively low photo-exposure energies and are thermally stable, mechanically robust, resist water penetration, and show good adhesion to metal oxides, metals, metal alloys, as well as organic materials. In addition, these polymeric materials can be solution-processed (e.g., by spin-coating), and can exhibit good chemical (e.g., solvent and etchant) resistance in the cured form.

15 Claims, 11 Drawing Sheets

PHOTOPATTERNABLE MATERIALS AND RELATED ELECTRONIC DEVICES AND METHODS

CROSS-REFERENCE TO RELATED APPLICATIONS

This application claims priority to and the benefit of U.S. Provisional Patent Application Ser. No. 61/846,177, filed on Jul. 15, 2013, the disclosure of which is incorporated by reference herein in its entirety.

BACKGROUND

There has been a growing interest in developing electronic devices using metal oxides as the semiconductor component. These devices can offer advantages such as structural flexibility (e.g., foldability or bendability), potentially much lower manufacturing costs, and the possibility of low-temperature ambient manufacturing processes on large areas. Particularly, metal oxide semiconductors such as indium gallium zinc oxide (IGZO) can exhibit high charge carrier mobility and be processed at temperatures far lower than those required for silicon. Thus, metal oxide semiconductors can be used to enable new devices such as electronic paper, rigid or flexible organic light-emitting diode (OLED) displays, ultra-high resolution displays, radio-frequency identification (RFID) technologies, and transparent displays and circuits.

One of the key benefits to using metal oxides is the potential to use both vapor-phase and solution-phase deposition techniques to deposit the semiconductor as well as other materials needed to fabricate these devices. Yet, to further realize the processing advantages of metal oxide semiconductors, all active components of the device should be mechanically flexible and, preferably, most of the components of the device should be compatible with, if not processable by, solution-phase deposition fabrication.

For example, thin-film transistors (TFTs) based upon various solution-processed or vapor-deposited metal oxide semiconductors have been developed. However, critical components in TFTs are the layers in the proximity of the oxide semiconductor channel layers, which include the gate dielectric layer, the etch-stop, and/or the passivation layer, depending on the TFT device architecture (see FIG. 1).

As far as the gate dielectric layer is concerned, it comprises an electrically insulating material that enables the creation of the gate field between the source electrode and the gate electrode. Thus, the gate dielectric layer functions to prevent leakage currents from flowing from the channel to the gate electrode when a voltage is applied to the gate. In addition to exhibiting low-gate leakage properties, a good dielectric material also needs to be air- and moisture-stable, and should be robust enough to withstand common device fabrication process conditions, with properties that are tunable depending on the type of semiconductor employed in the TFT channel. Particularly, for vapor-deposited metal oxide semiconductor-based TFTs, the dielectric material must be able to withstand sputtering conditions and thermal annealing of the semiconductor, a process typically requiring relatively high temperatures (~250-300° C.).

Regarding the other layers in contact with the channel, in the case of an etch-stop (ES) transistor structure, the material used for the etch stop layer, first and foremost, must be able to prevent damage of the oxide channel when the source/drain electrical contacts are defined via photolitography. The ES material must exhibit strong adherence to the metal oxide layer, and should be able to withstand conditions required to thermally anneal the oxide layer, without compromising the charge transport property of the oxide channel layer. Furthermore, in the ES architecture, a second layer acting as a passivation layer typically is deposited on top of the metal oxide/electrode surface. Therefore, the ES layer, in addition to showing strong adherence to the oxide channel layer, also must adhere strongly to the passivation layer. Furthermore, the ES layer should act as a moisture barrier for the oxide channel layer while planarizing its surface. The ES material also must be able to sustain device processing conditions that take place on top of it. In an alternative transistor architecture known as back-channel-etch (BCE) structure, the oxide semiconductor is placed in direct contact with the passivation layer. This passivation layer should have properties similar to those used in the ES architecture although the BCE structure requires adhesion of the passivation material directly to the oxide layer and not to the ES layer.

Although some polymers have been employed as dielectrics for metal oxide TFTs, several limitations of current-generation polymeric dielectric have yet to be overcome. For example, very few polymeric dielectric materials are sufficiently soluble to be solution-processed, especially via inexpensive printing techniques. Among those that are solution-processable, they often cannot survive the conditions used in subsequent processing steps, which significantly limits their application in device fabrication. For TFT device fabrication, the deposition of overlying layers such as the semiconductor layer, the conductor layer(s), and other passive layers by solution-phase processes may require solvents, temperatures, or deposition conditions that compromise the integrity of the dielectric materials. Similarly, most known solution-processable dielectric materials cannot survive vapor-phase deposition methods (e.g., sputtering), which are commonly used to process metals and metal oxides. In addition, currently available polymeric dielectric materials often fail to achieve high surface smoothness, which is a prerequisite for stable TFT performance and operation.

With respect to passivation materials, a few polymeric materials have been envisioned to be used as both the ES layer and the passivation layer. However, it has remained a challenge to identify materials that show excellent thermal stability, photopatternability, and good adhesion to both inorganic (e.g, metals, metal alloys, and metal oxides) and organic materials, while conferring chemical protection to the oxide channel layer. Particularly, conventional photoresists, while providing excellent photopatternability, fail to enable the other requirements.

Accordingly, there is a desire in the art to identify appropriate organic materials and/or design and synthesize new organic materials that are compatible with diverse substrates, conductors, and/or semiconductors such that they could be employed in the whole metal oxide TFT fabrication process to meet one or more device requirements including photopatternability, low current leakage densities, high thermal stability, resistance to harsh chemicals used in patterning steps, tuned surface energies, good adhesion, good solution-processability, and/or low permeation to water.

SUMMARY

In light of the foregoing, the present teachings provide polymeric materials that can possess one or more desirable properties and characteristics which make them suitable as active (e.g., dielectric) and/or passive (e.g., passivation or etch-stop) materials in an electronic device such as a thin film field-effect transistor, particularly, a metal-oxide thin-film transistor.

Specifically, the present teachings relate to a polymer having the formula:

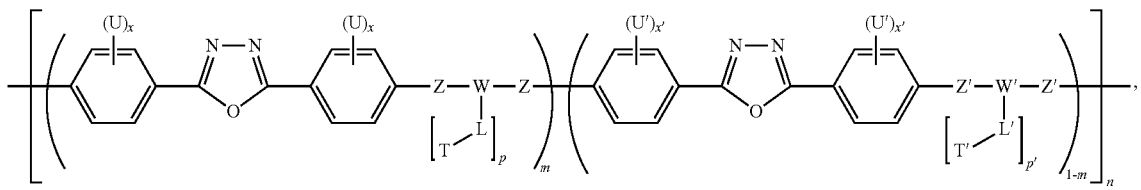

wherein L, L', T, T', U, U', W, W', Z, Z', m, n, p, p', x and x' are as defined herein; photopatternable compositions including such polymer, devices including an organic layer that is a crosslinked product of such polymer, and methods of fabricating such devices.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
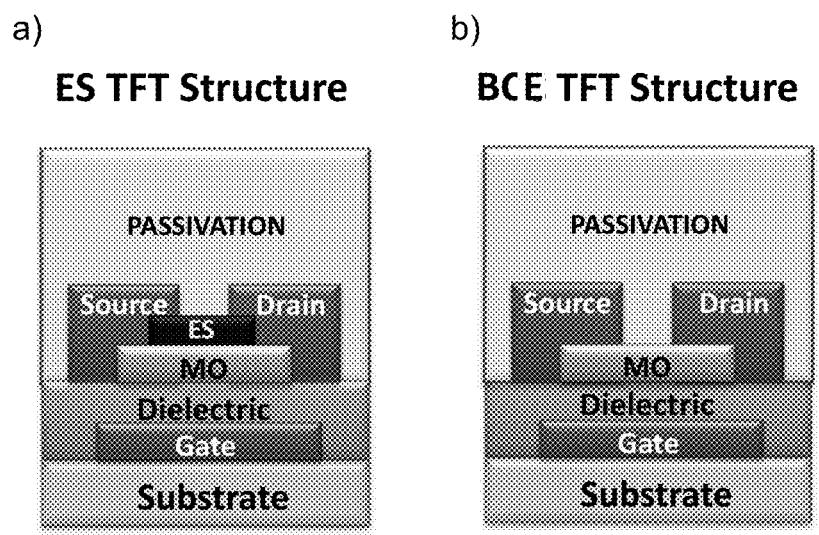
FIG. 1 illustrates the structure of (a) an etch-stop (ES) thin film transistor (TFT) and (b) a back-channel-etch (BCE) TFT. In the illustrated architectures, both types of devices have a bottom-gate top-contact configuration, i.e., the source and drain electrodes are defined on top of the metal oxide (MO) semiconductor layer.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

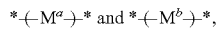

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

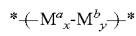

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)). A polymer typically comprises a backbone with optional pendant groups.

As used herein, a "pendant group" refers to a moiety that is substituted on the backbone of a polymer.

As used herein, a "crosslinkable" group refers to a functional group which is capable of reacting irreversibly. The crosslinking reaction can be effected by thermal, chemical, or radiative means. For example, a compound having a crosslinkable group can be crosslinked by heat (in the case of a compound having a thermally crosslinkable group) or by UV (in the case of a compound having a photo-crosslinkable group), microwave, X-ray or electron radiation. In some embodiments, a compound (e.g., a polymer) can be capable of self-crosslinking, that is, no auxiliary reagents are required. In some embodiments, a compound can form crosslinks upon reaction with another reagent (e.g., a photoacid generator or a free radical initiator). In some embodiments, a compound can be crosslinked via more than one mechanism.

As used herein, a "photopolymer" is a polymer having at least one crosslinkable group that can be cured (via photo-crosslinking) by flood exposure to light or by exposure to irradiation at selective wavelengths, often in the G (435.8 nm), H (404.7 nm), or I (365.4 nm) line of the spectrum, or other types of radiation.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group."

Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butyryl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group), a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Throughout the specification, structures may or may not be presented with chemical names. Where any question arises as to nomenclature, the structure prevails.

In one aspect, the present teachings relate to metal oxide thin film transistors having one or more organic layers and their fabrication methods. The present transistors generally include a substrate, a gate electrode, a gate dielectric layer, a metal oxide semiconductor as the active channel layer, source and drain electrodes, and at least one of an etch-stop layer and a passivation layer. The gate dielectric layer, the passivation layer, and if present, the etch-stop layer can be composed of an organic material. More specifically, at least one of the dielectric layer, the passivation layer, and the etch-stop layer is composed of the polymeric material described herein. As known in the art, the gate electrode, and the source and drain electrodes can be arranged in different configurations relative to the gate dielectric layer and the active semiconductor channel layer to provide, for example, a top-gate top-contact structure, a top-gate bottom-contact structure, a bottom-gate top-contact structure, or a bottom-gate bottom-contact structure.

The metal oxide semiconductor active channel layer can be prepared from an oxide of indium, gallium, and zinc (IGZO). IGZO offers various advantages including high field-effect mobility and optical transparency. However, IGZO thin film transistors (IGZO TFTs) also suffer from unreliable device operation due to its sensitivity to the environment. Specifically, adsorption/desorption of small molecular species present in ambient air onto the exposed back channel layer as well as light sensitivity (subgap photoresponse) can change the carrier concentration in the IGZO films. This results in a shift of the TFT threshold voltage ($V_{TH}$), which over time leads to a nonuniformity problem. Identifying and/or designing an organic gate dielectric material that can alleviate some of the known problems in IGZO TFTs while maintaining their advantages such as high mobility has proven difficult.

In addition, state-of-the-art methods for fabricating IGZO TFTs typically involve both depositing the IGZO channel layer and processing the IGZO channel layer post-deposition at high temperatures (for example, an "activating" step after deposition often is necessary to repair any defects introduced when the IGZO is patterned to form the channel). Therefore, for an organic dielectric material to be useful in current IGZO TFTs, it must be thermally stable at about 250° C. or higher. Polymers having rigid backbones, for example, those incorporating (poly)cyclic (hetero)aromatic groups, tend to have good thermal stability. However, these polymers also have poor leakage properties due to their extended pi-conjugated system, and therefore non-negligible electrical conductivity.

Furthermore, to the inventors' knowledge, an etch-stop material which offers chemical resistance against common wet etchants (for metallic contacts) and affords protection to the metal oxide layer underneath, that can be photopatterned directly without using a photoresist has not been reported.

Unexpectedly, the inventors have found that polymers according to the present teachings can be used as photopatternable etch-stop materials, passivation materials, and/or gate dielectric materials in metal oxide TFTs with good device performance and enhanced environmental stability.

Polymers according to the present teachings generally have the formula:

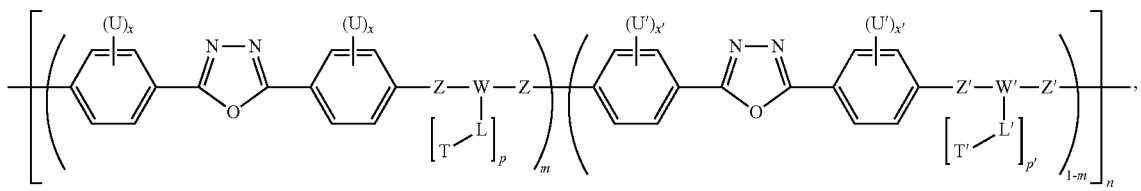

wherein:

U and U', at each occurrence, independently are selected from the group consisting of a halogen, CN, a $C_{1-6}$ alkyl group, and a $C_{1-6}$ haloalkyl group;

W and W' independently are $-Ar[-Y-Ar]_q-$, wherein:
  Ar, at each occurrence, independently is a divalent $C_{6-18}$ aryl group;
  Y, at each occurrence, independently is selected from the group consisting of $-O-$, $-S-$, $-S(O)_2-$, $-(CR'R'')_r-$, $-C(O)-$, and a covalent bond, wherein R' and R'', at each occurrence, independently are selected from the group consisting of H, a halogen, CN, a $C_{1-10}$ alkyl group, and a $C_{1-10}$ haloalkyl group; and r is selected from 1, 2, 3, 4, 5, 6, 7, 8, 9 and 10; and
  q is selected from 0, 1, 2, 3, 4, 5, 6, 7, 8, 9 and 10;

Z and Z' independently are selected from the group consisting of $-O-$, $-S-$, and $-Se-$;

L and L', at each occurrence, independently are selected from the group consisting of $-O-$, $-S-$, a divalent $C_{1-10}$ alkyl group, a divalent $C_{6-18}$ aryl group, and a covalent bond;

T and T', at each occurrence, independently are Q or R, wherein:
  Q is a crosslinkable group comprising an ethenyl moiety, an ethynyl moiety, a dienyl moiety, an acrylate moiety, a coumarinyl moiety, an epoxy moiety, or a combination thereof; and
  R is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN, provided that W comprises at least one -L-T group that is -L-Q;

p is 1, 2, 3, 4, 5, 6, 7 or 8;
p' is 0, 1, 2, 3, 4, 5, 6, 7 or 8;
x and x' independently are 0, 1, 2, 3 or 4;
m is a real number, wherein 0<m≤1; and
n is an integer ranging from 10 to 500. The present polymers can have a molecular weight ($M_w$) ranging from about 1,000 to about 50,000.

In certain embodiments, the phenyl groups in the repeat units

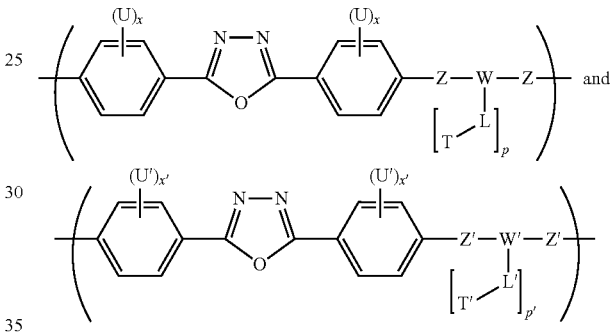

can be unsubstituted, that is, each of x and x' can be 0, and the polymer can have the formula:

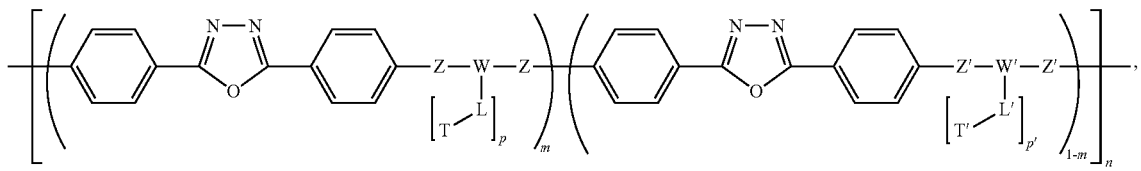

wherein L, L', T, T', W, W', Z, Z', m, n, p and p' are as defined herein. In other embodiments, at least one of the phenyl groups can be substituted with 1 and up to 4 halo, CN, $C_{1-6}$ alkyl group, and $C_{1-6}$ haloalkyl groups. For example, U and U', at each occurrence, independently can be selected from the group consisting of F, Cl, $CH_3$, and $CF_3$; and x and x', at each occurrence, independently can be 0, 1, 2 or 4. To illustrate, the present polymers can have any one of the following formulae:

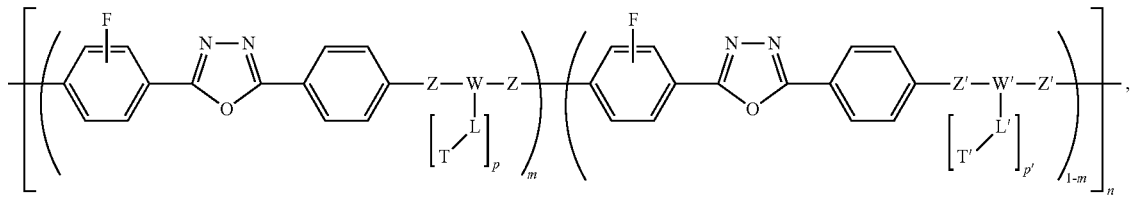

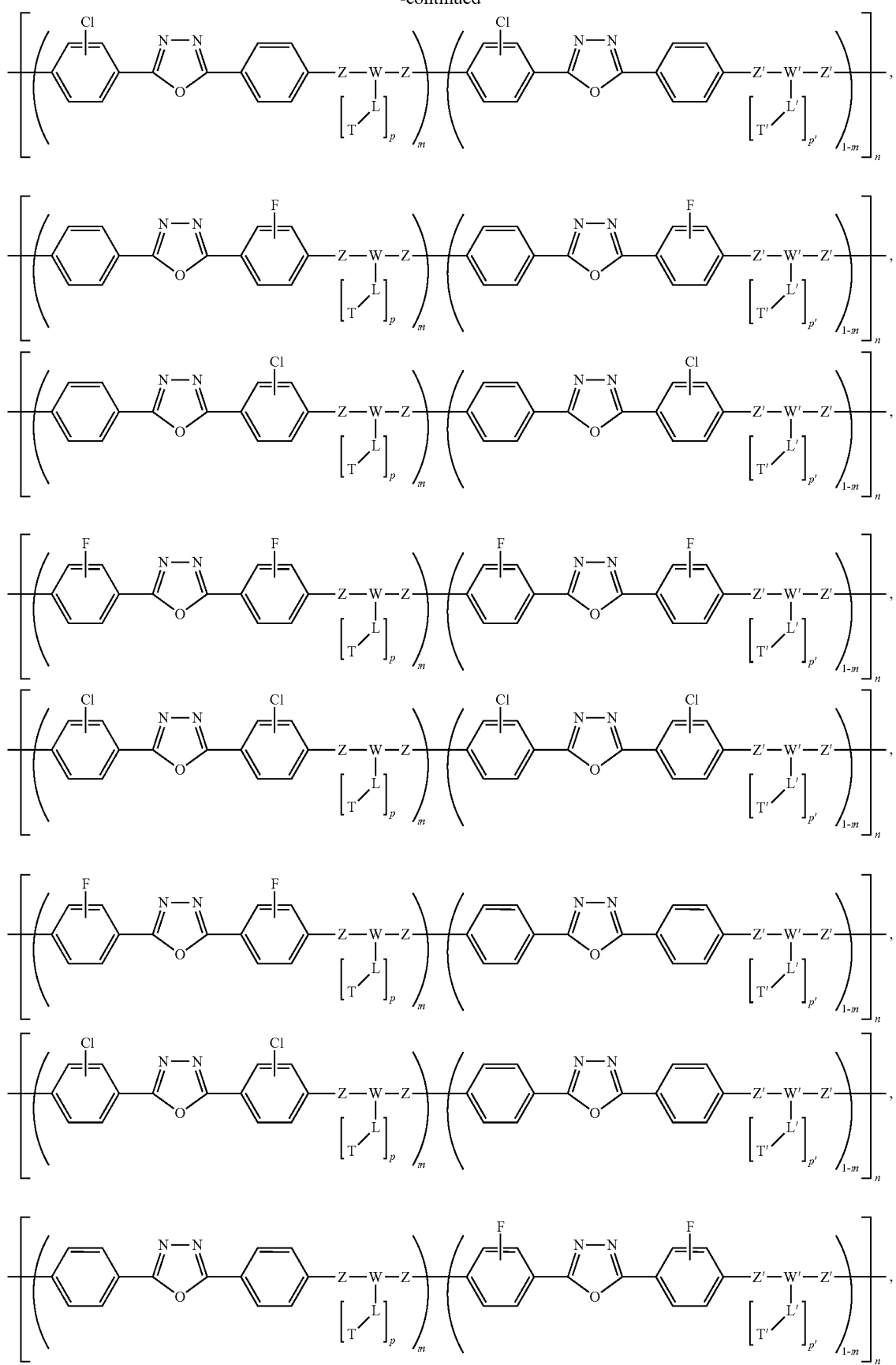

-continued
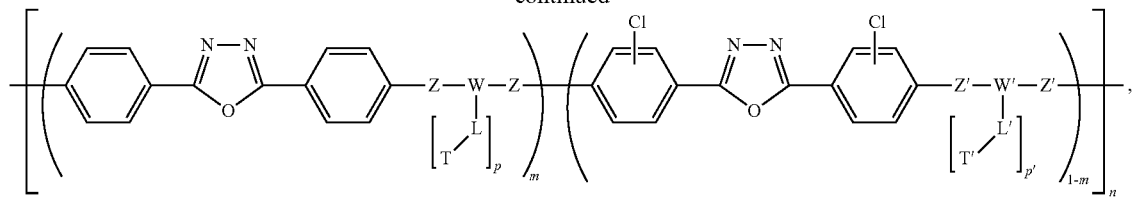
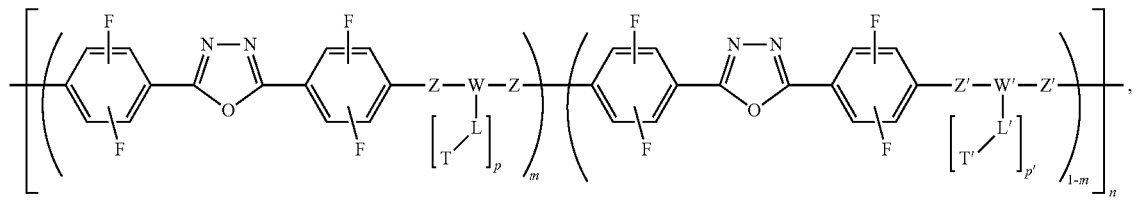
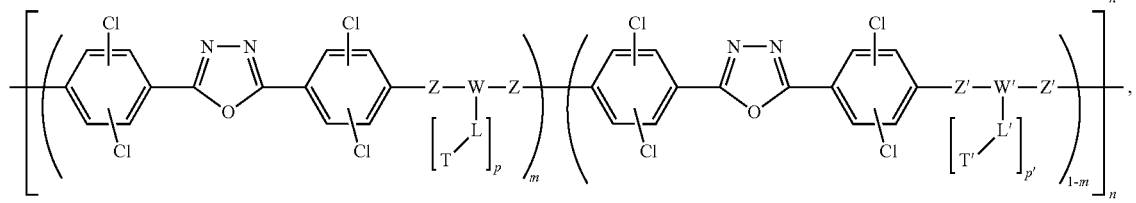
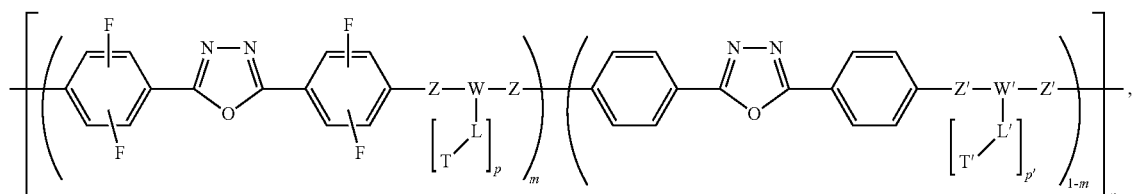
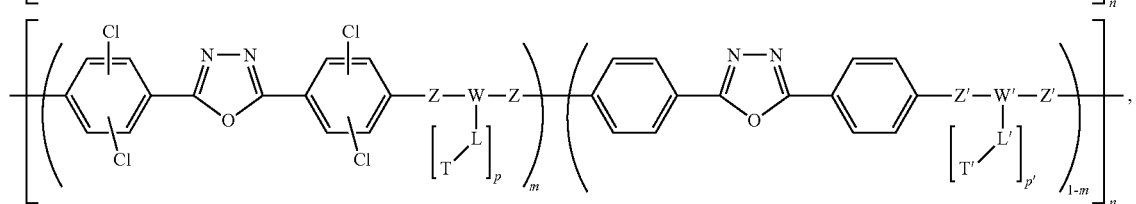
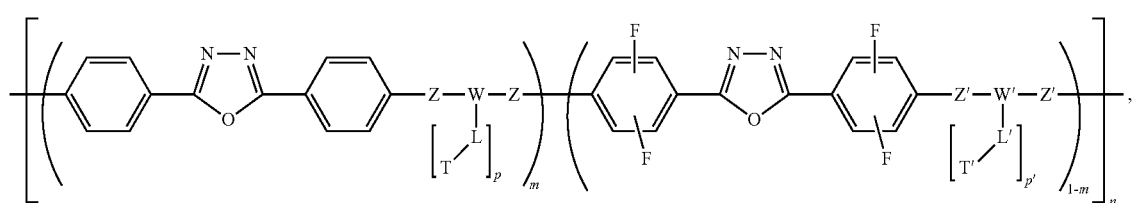
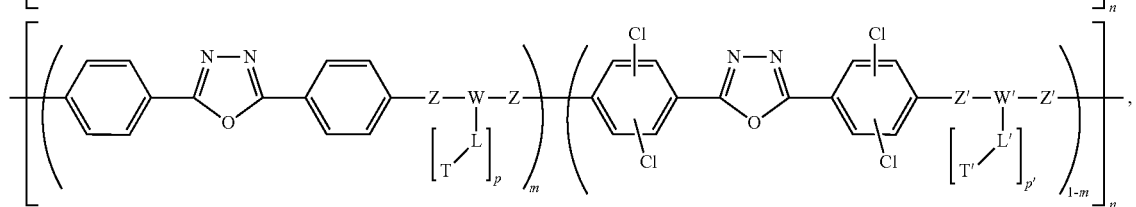
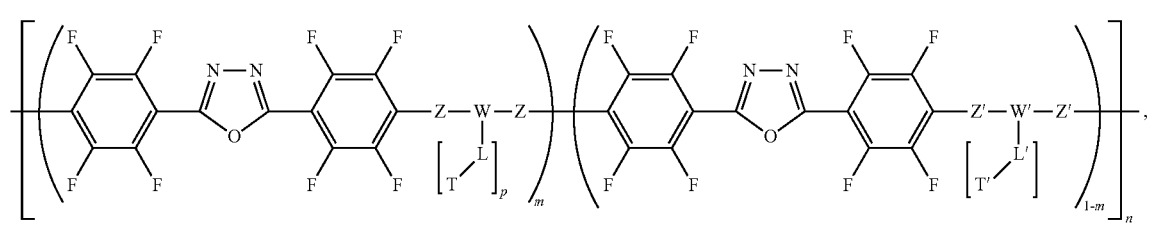

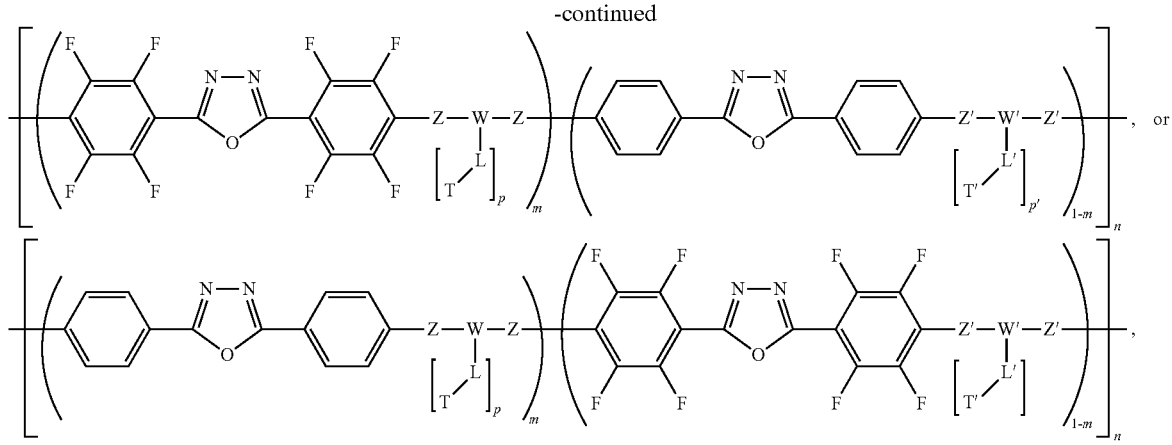

wherein L, L', T, T', W, W', Z, Z', m, n, p and p' are as defined herein.

The present polymers comprise at least one photo-crosslinkable group (Q), which is present as a functional group (-L-Q) on the moiety —Z—W—Z—. Additional photo-crosslinkable moieties can be present, either on the moiety —Z—W—Z—, or on the co-repeat unit —Z'—W'—Z'—. Accordingly, the present polymers can be considered a photopolymer as defined herein.

Examples of crosslinkable groups Q are functional groups which include a double bond, a triple bond, a precursor which is capable of in-situ formation of a double or triple bond, or a heterocyclic addition-polymerizable radical. In certain embodiments, Q can be a functional group that comprises an ethenyl moiety, an ethynyl moiety, a dienyl moiety, an acrylate moiety, a coumarinyl moiety, a cyclic ether moiety (e.g., epoxy, oxetane, etc.), or a combination thereof.

For example, suitable crosslinkable groups can include, but are not limited to

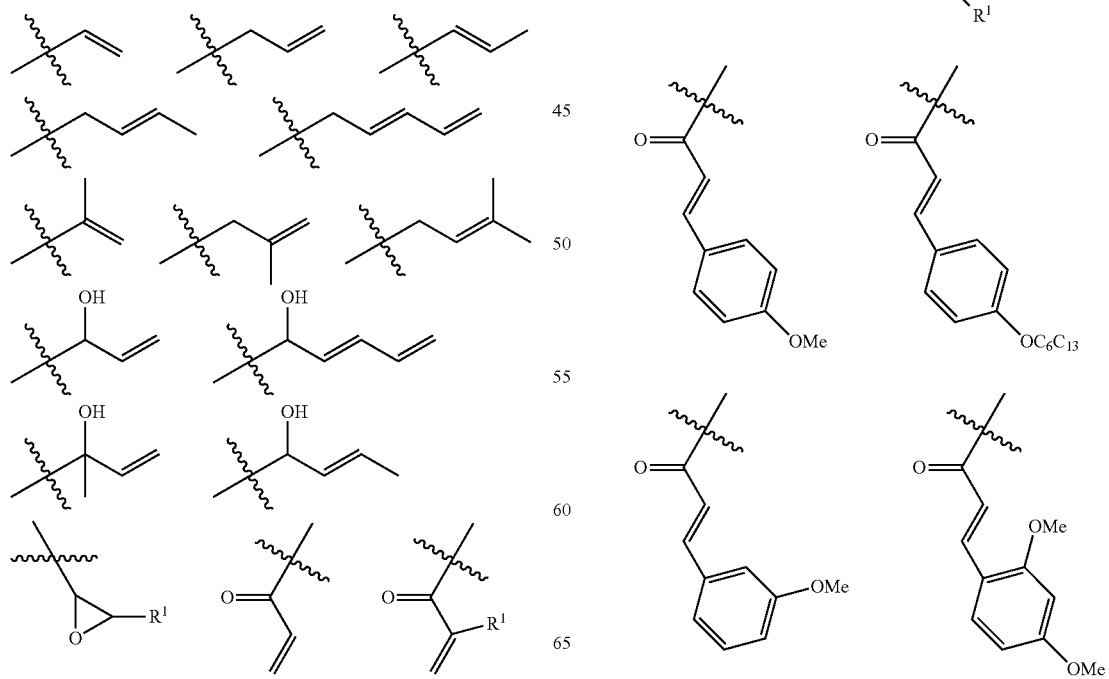

-continued

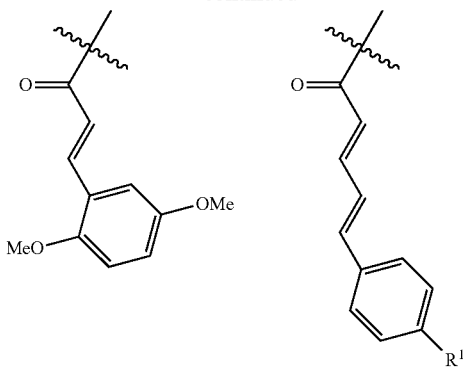
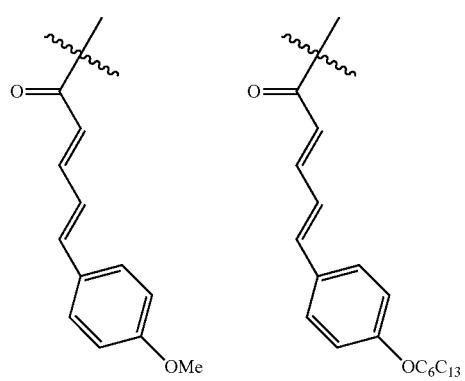
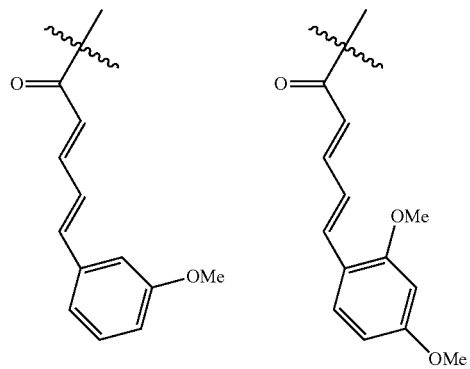
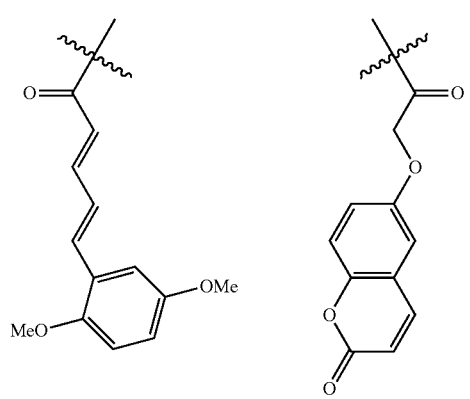

-continued

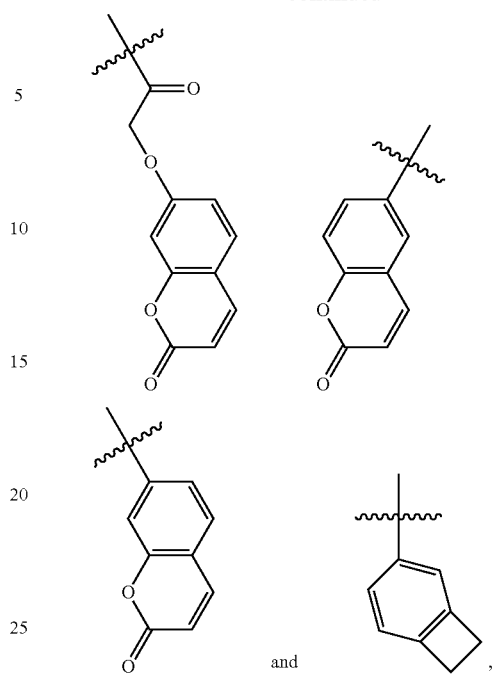

and wherein $R^1$ is H or a $C_{1-20}$ alkyl group.

The moieties —Z—W—Z— and —Z'—W'—Z'— can be selected from various arylene ethers, arylene ether ketones, arylene ether sulfones, arylene thioethers, arylene thioether ketones, and arylene thioether sulfones. For example, Z and Z' can be O or S, while W and W' can be selected from the group consisting of —Ar[—O—Ar]$_q$—, —Ar—S—Ar—, —Ar—CH$_2$—Ar—, —Ar—C(CH$_3$)$_2$—Ar—, —Ar—C(CF$_3$)$_2$—Ar—, —Ar—C(O)—Ar—, and —Ar[—Ar]$_q$—, wherein q is 1, 2, 3 or 4, and each Ar independently can be a divalent phenyl group or a divalent naphthalenyl group. In particular embodiments, W and W' can be one of the following groups:

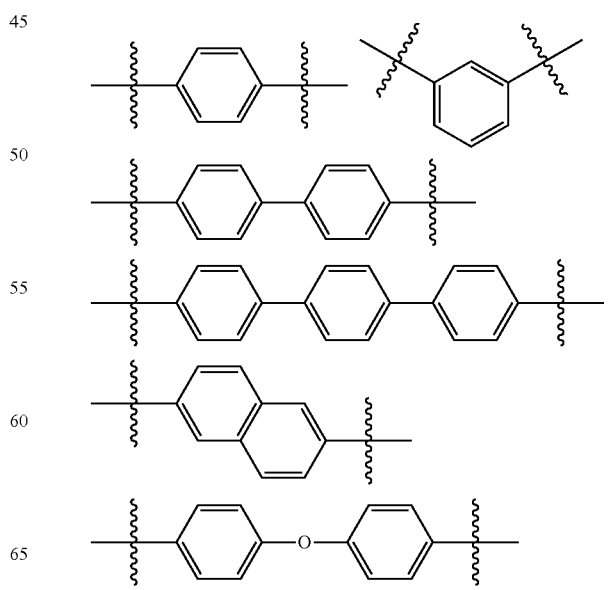

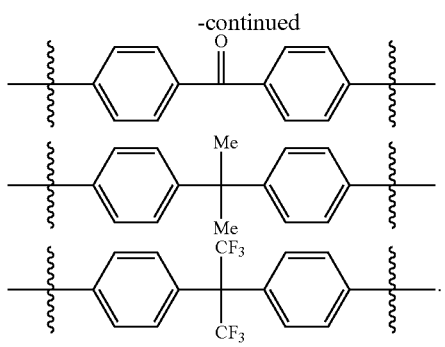
To illustrate, the present polymer can be a homopolymer of:
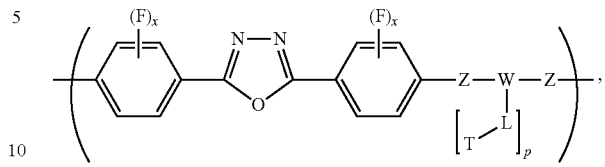
where x can be 0 or 4, which, in particular embodiments, can be a homopolymer of:
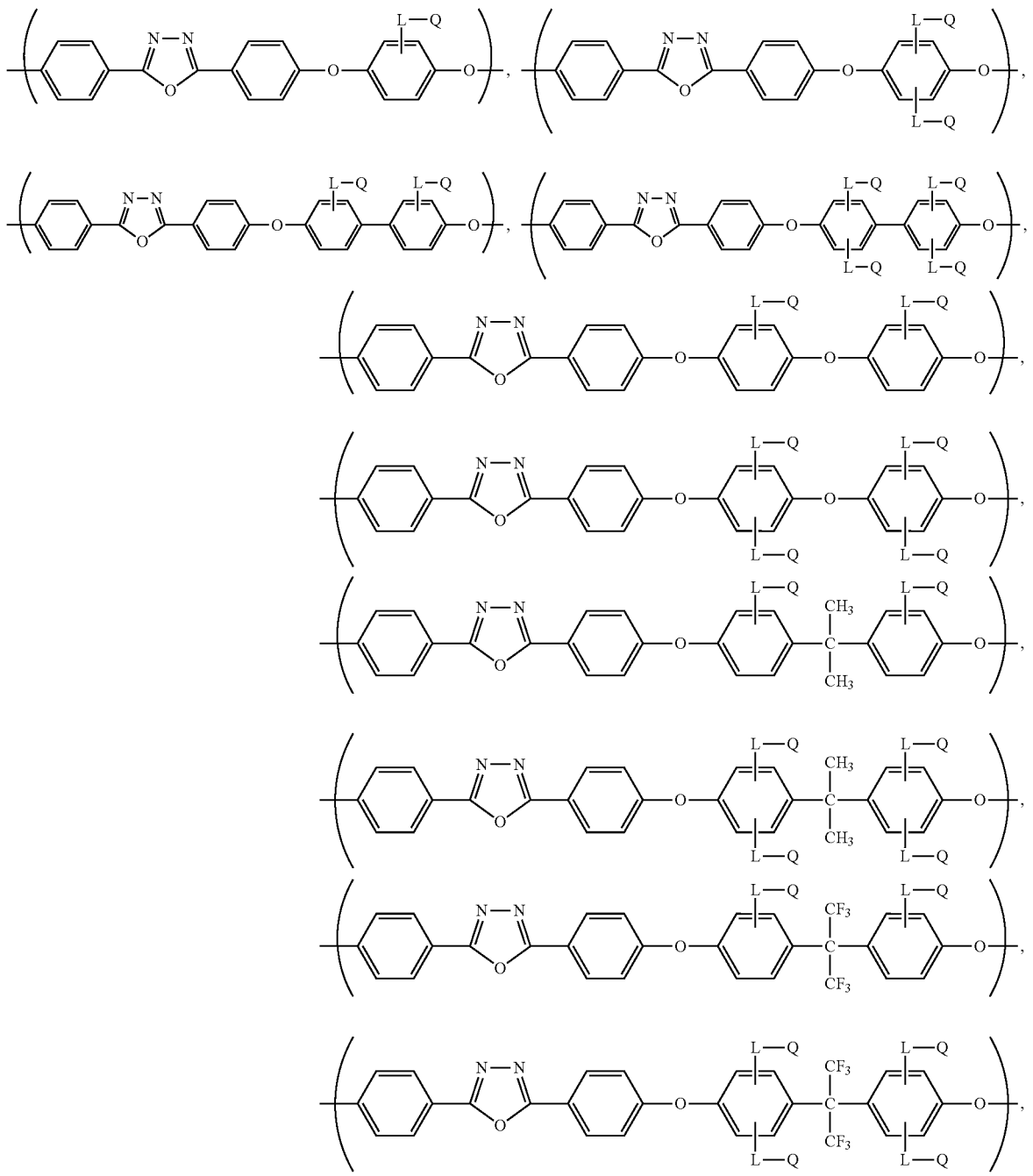

-continued
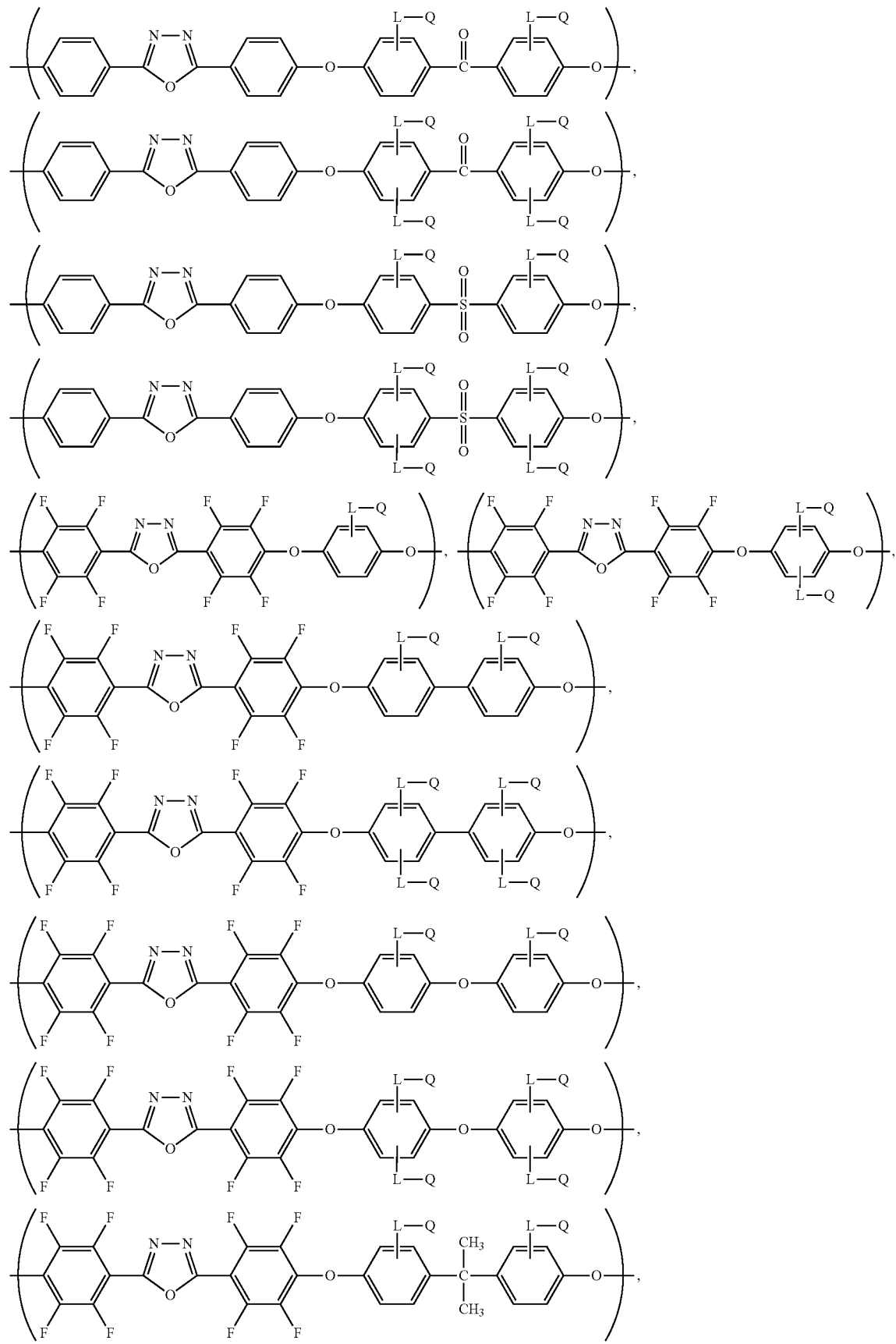

-continued
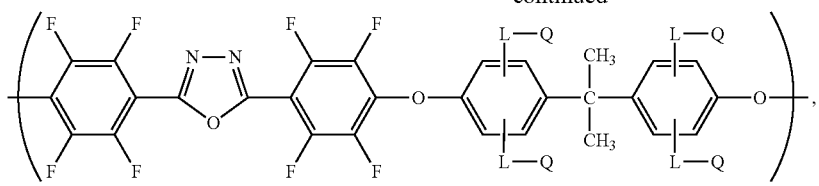
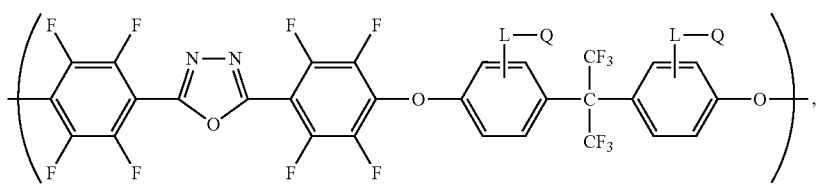
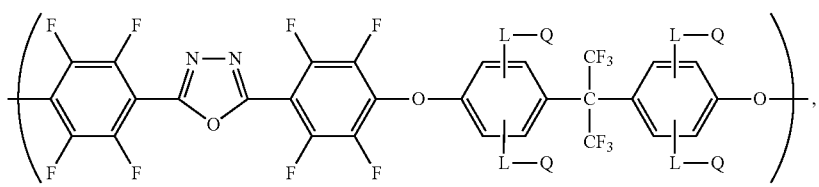
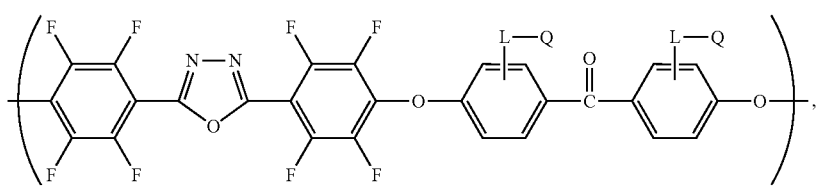
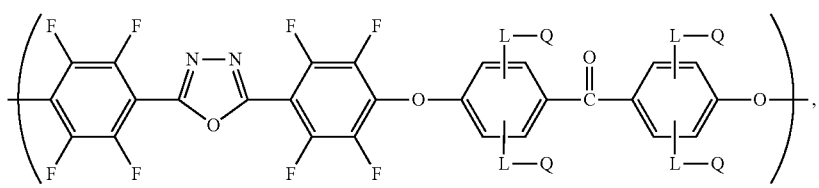
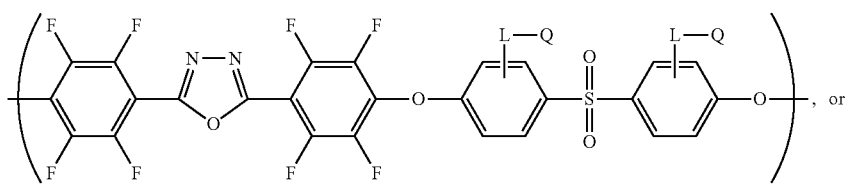, or
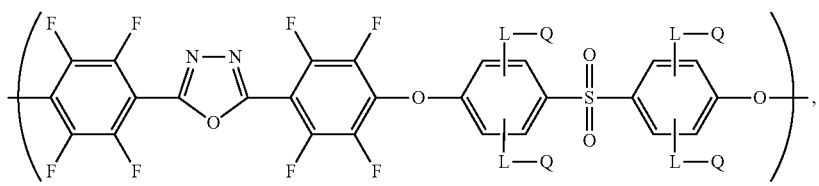, wherein L and Q are as defined herein. For example, each -L-Q group can be selected from:
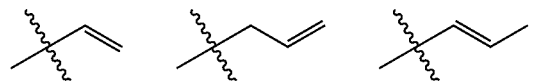
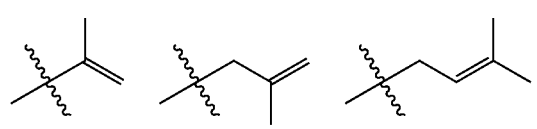
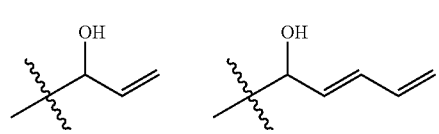
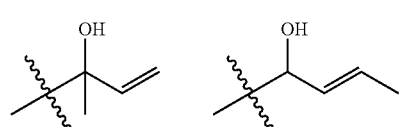
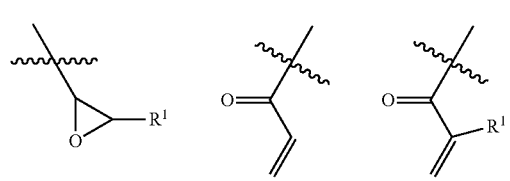
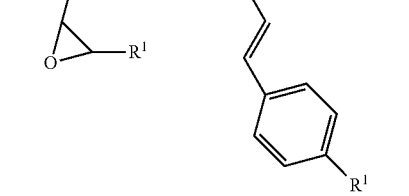
-continued
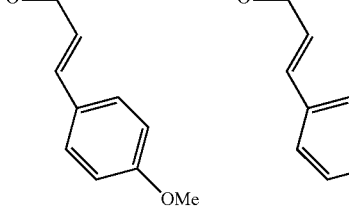
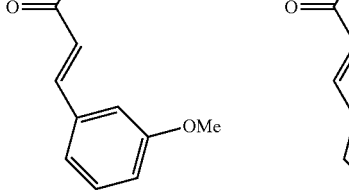
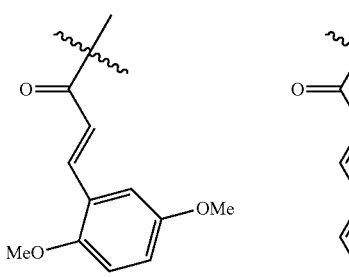
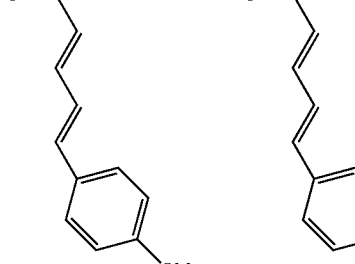

-continued
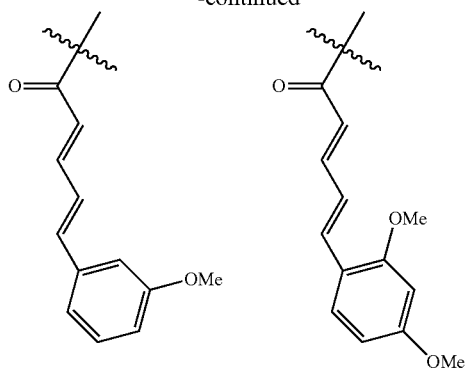
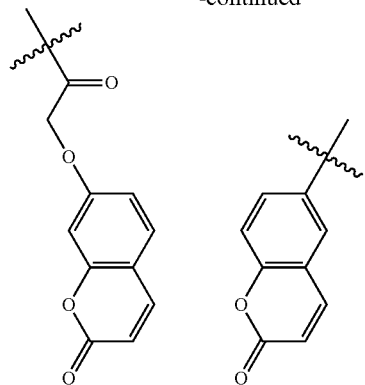
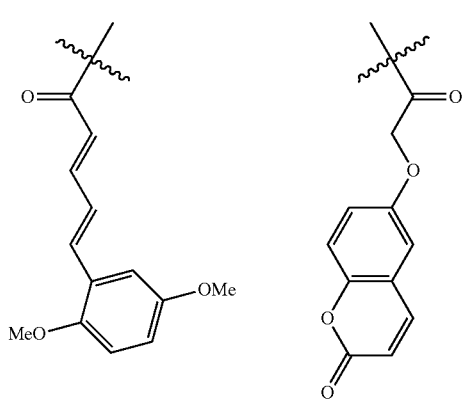
wherein R¹ is H or a $C_{1-20}$ alkyl group.
In particular embodiments, the present polymer can be a homopolymer of:
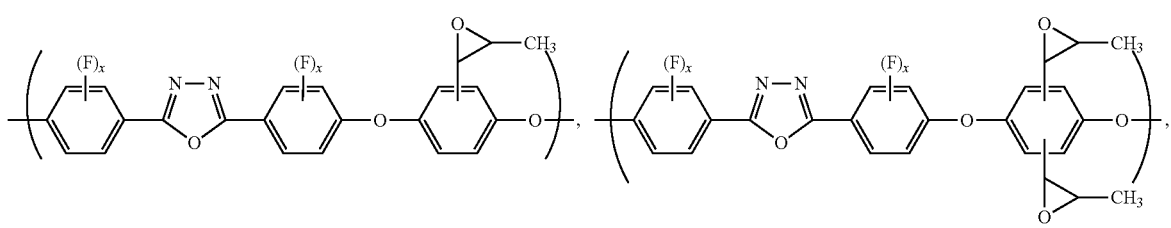
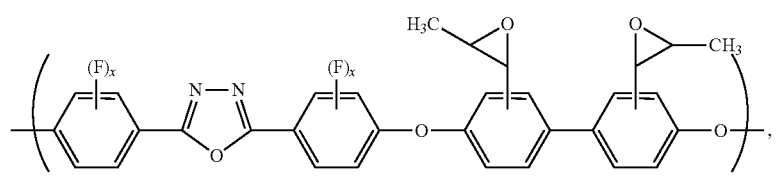
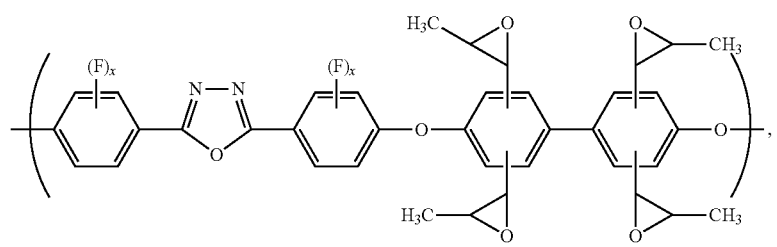

-continued
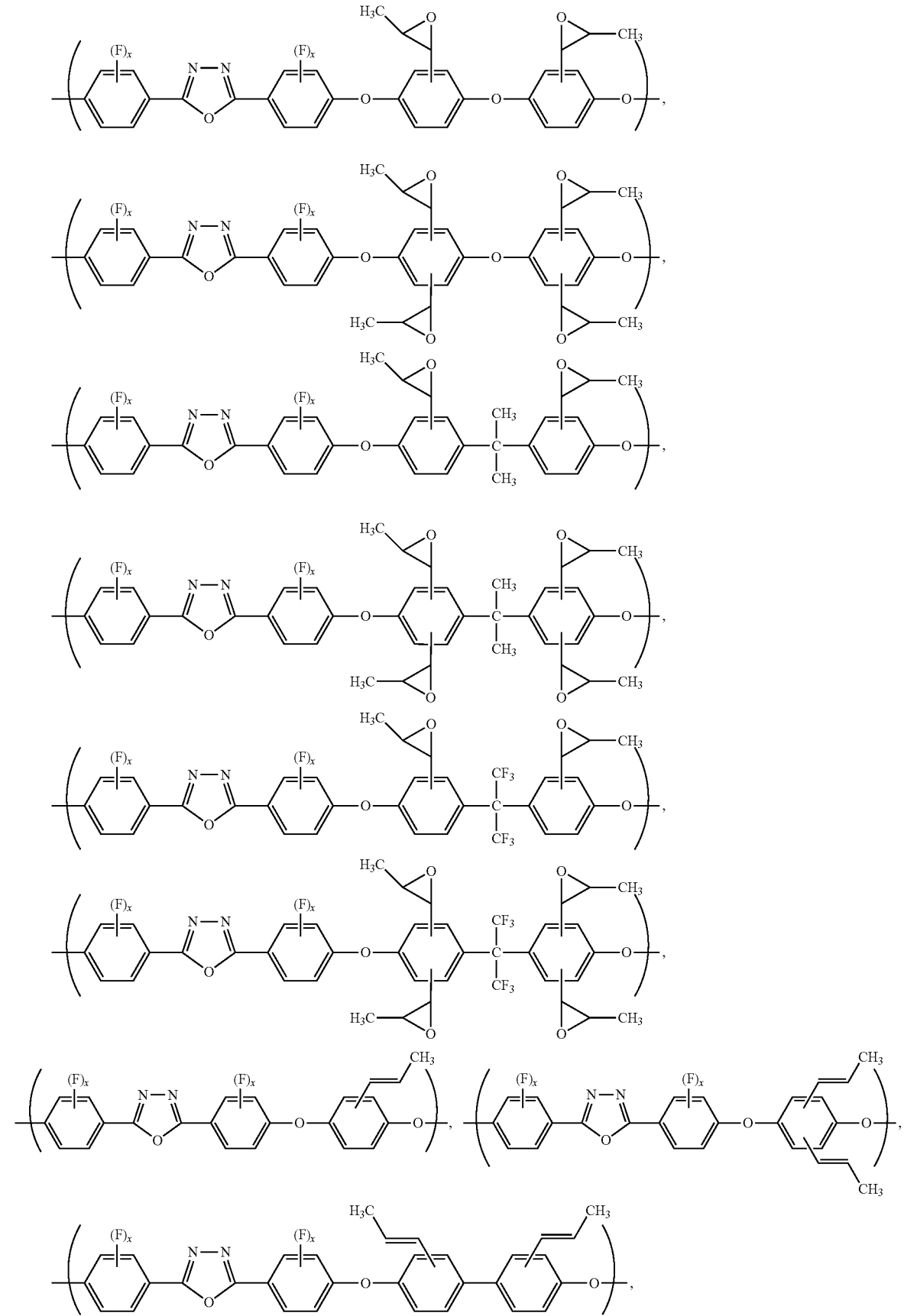

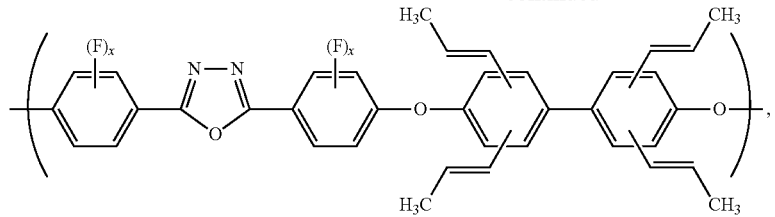
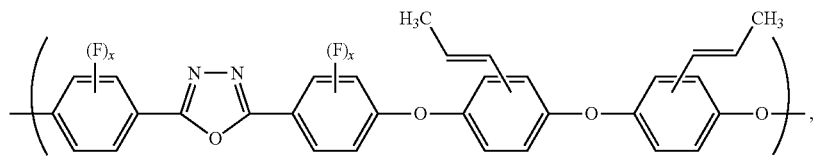
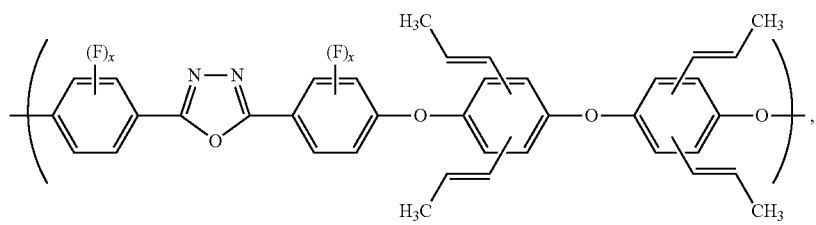
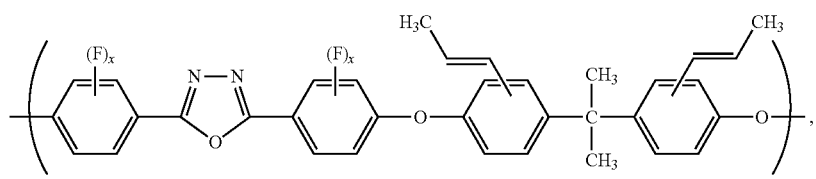
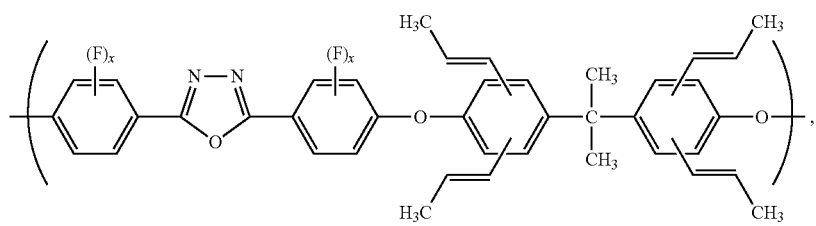
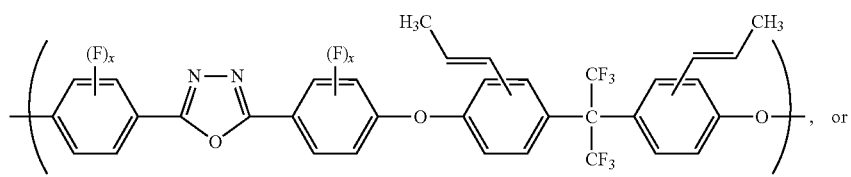
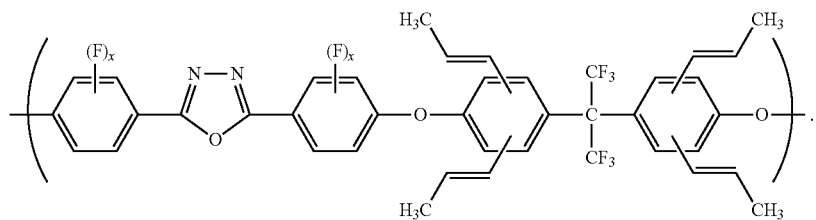

In other embodiments, the present polymer can be a copolymer of:
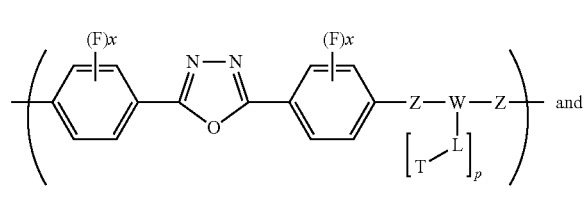
x = 0 or 4
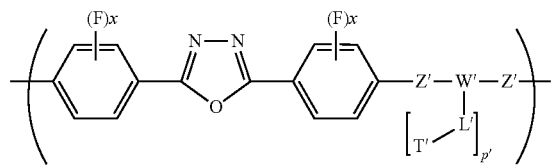
x = 0 or 4
(i.e., m < 1),
where the moieties
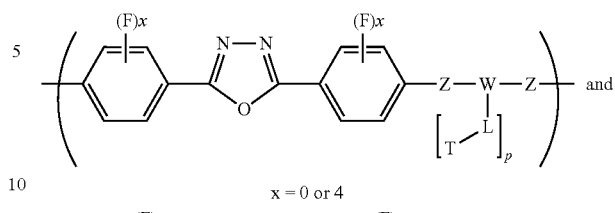
x = 0 or 4
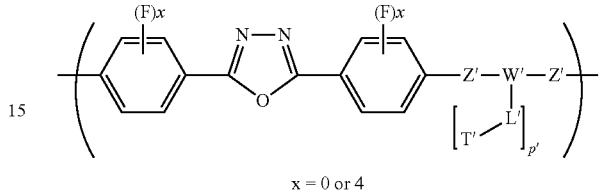
x = 0 or 4
are different. In some embodiments, both moieties can comprise a photocrosslinkable group. Copolymers according to such embodiments independently can be selected from the group consisting of:
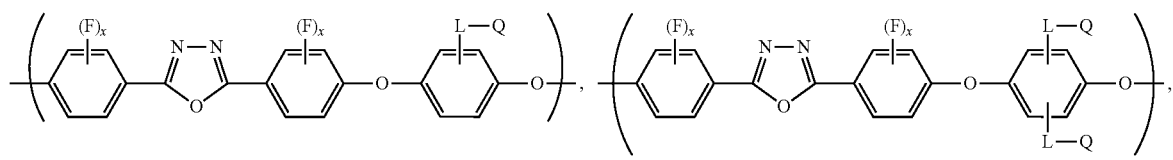
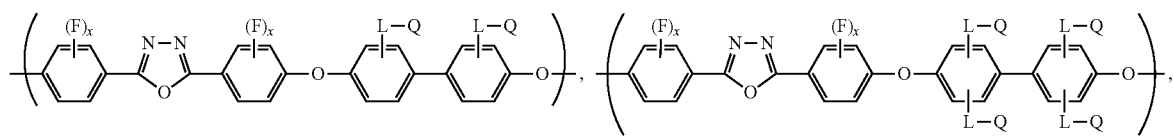
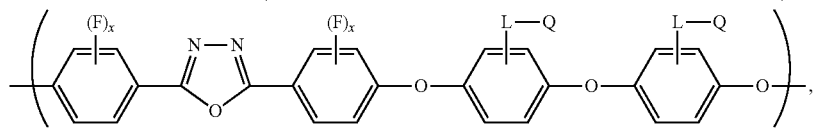
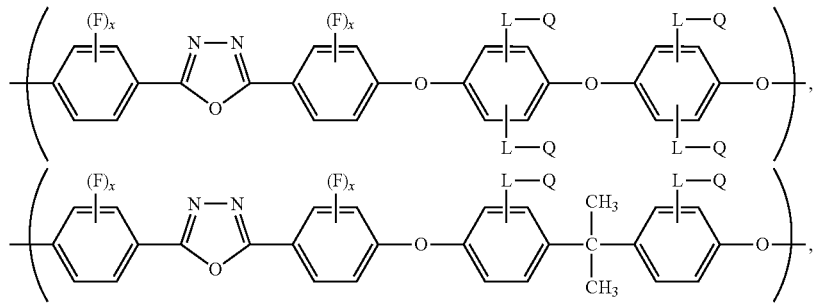
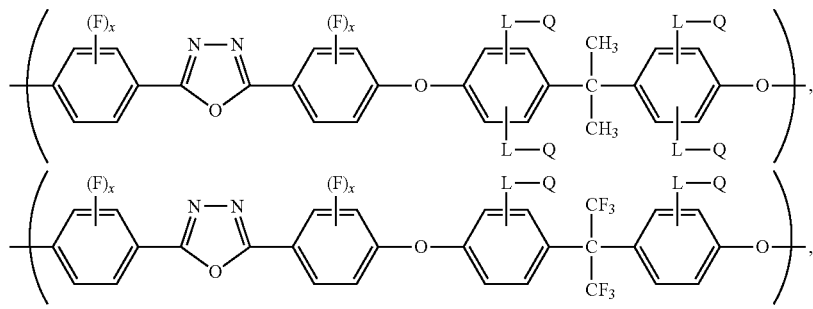

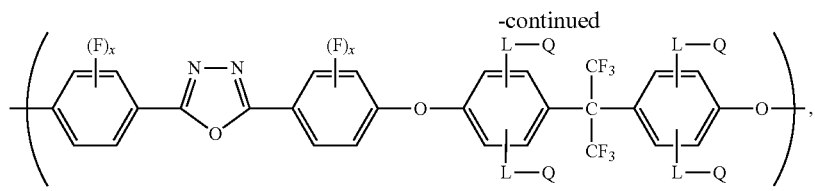
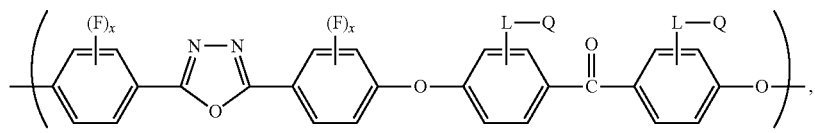
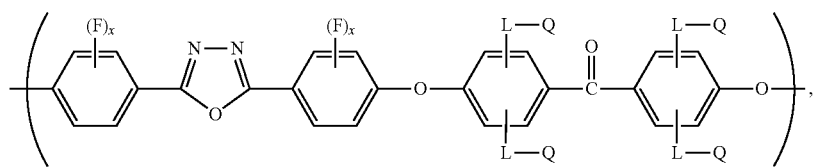
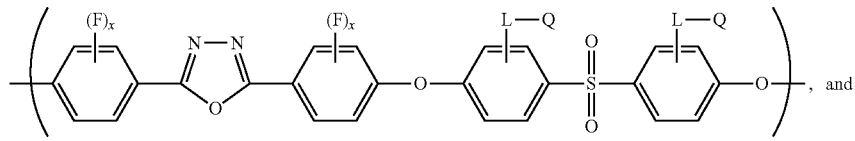
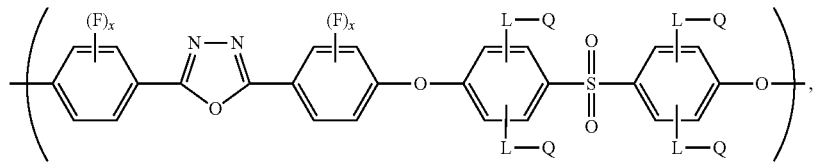
wherein x is 0 or 4, and L and Q are as defined herein. For example, each -L-Q group independently can be selected from:
 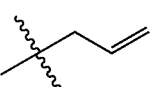 
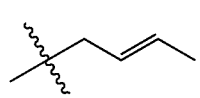 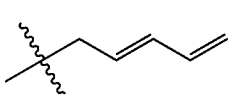
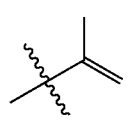 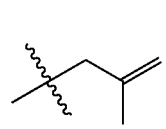 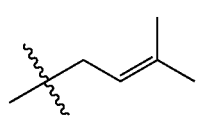
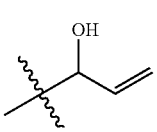 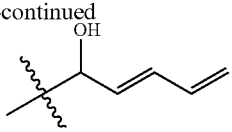
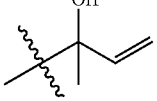 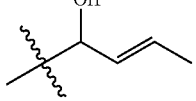
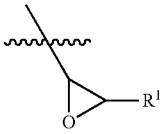 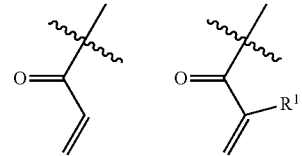
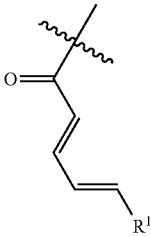 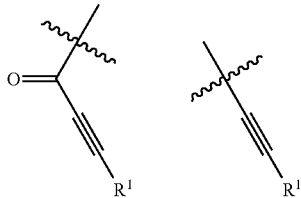

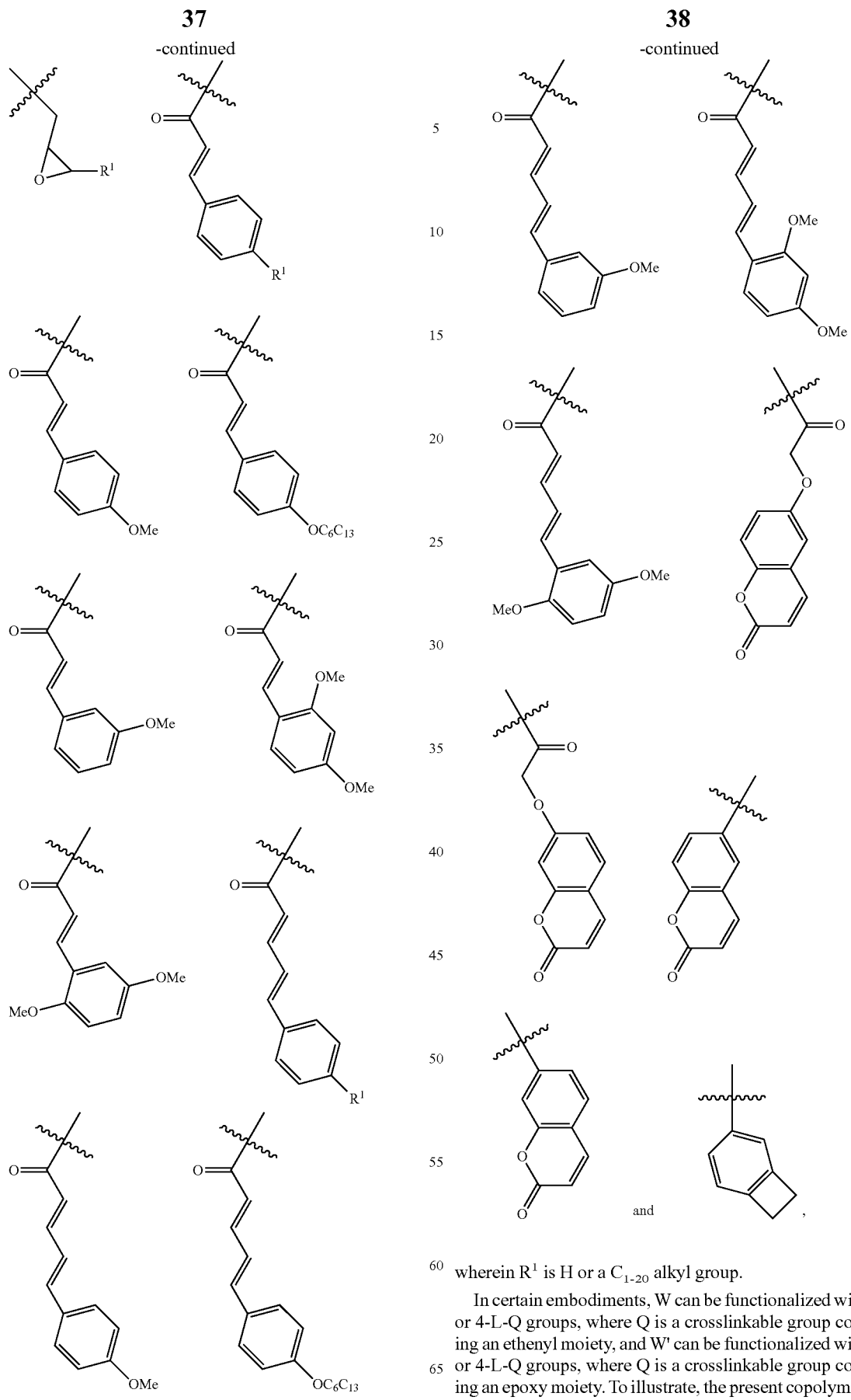
wherein $R^1$ is H or a $C_{1-20}$ alkyl group.
In certain embodiments, W can be functionalized with 1, 2, or 4-L-Q groups, where Q is a crosslinkable group comprising an ethenyl moiety, and W' can be functionalized with 1, 2, or 4-L-Q groups, where Q is a crosslinkable group comprising an epoxy moiety. To illustrate, the present copolymers can be selected from a copolymer of:

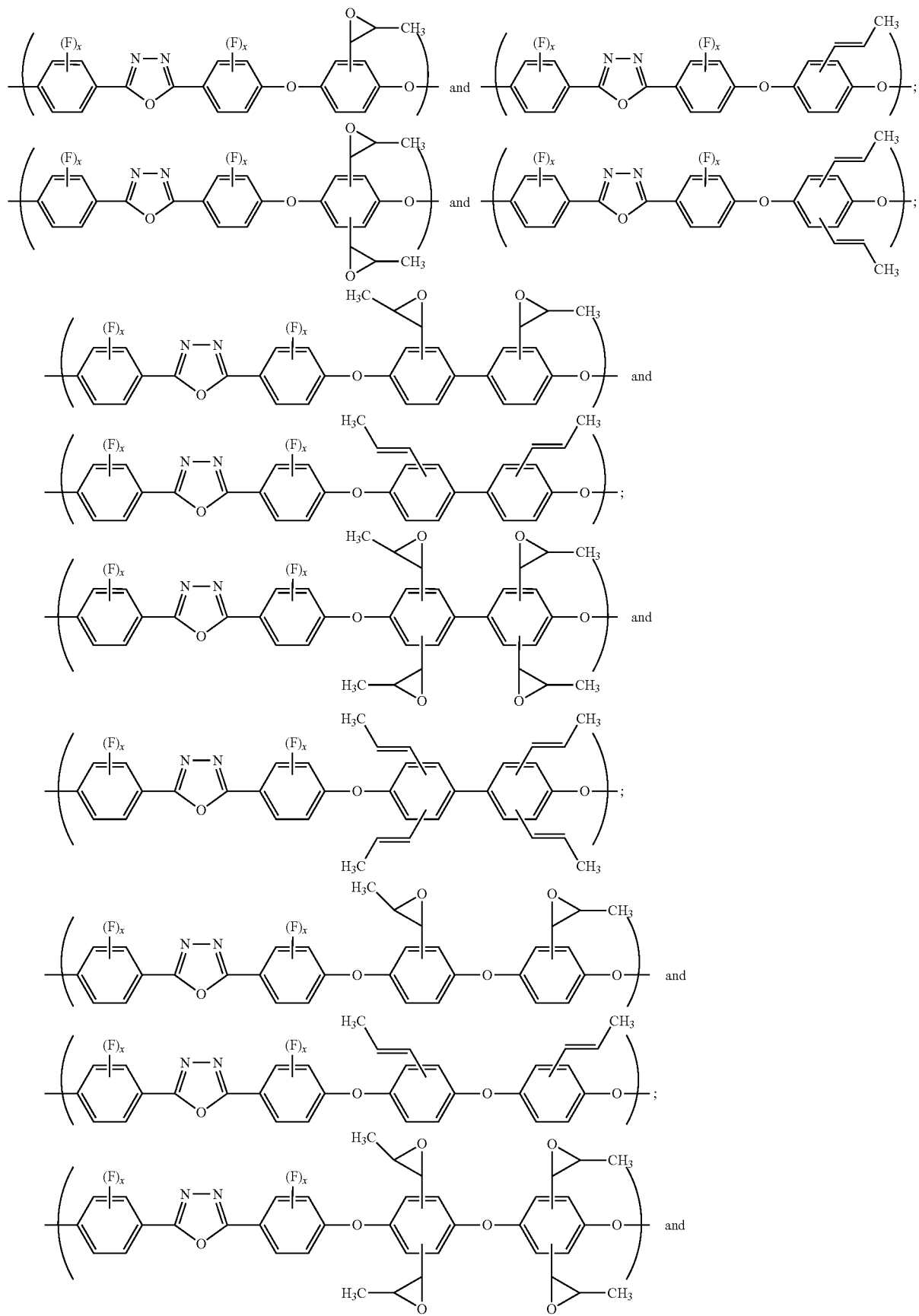

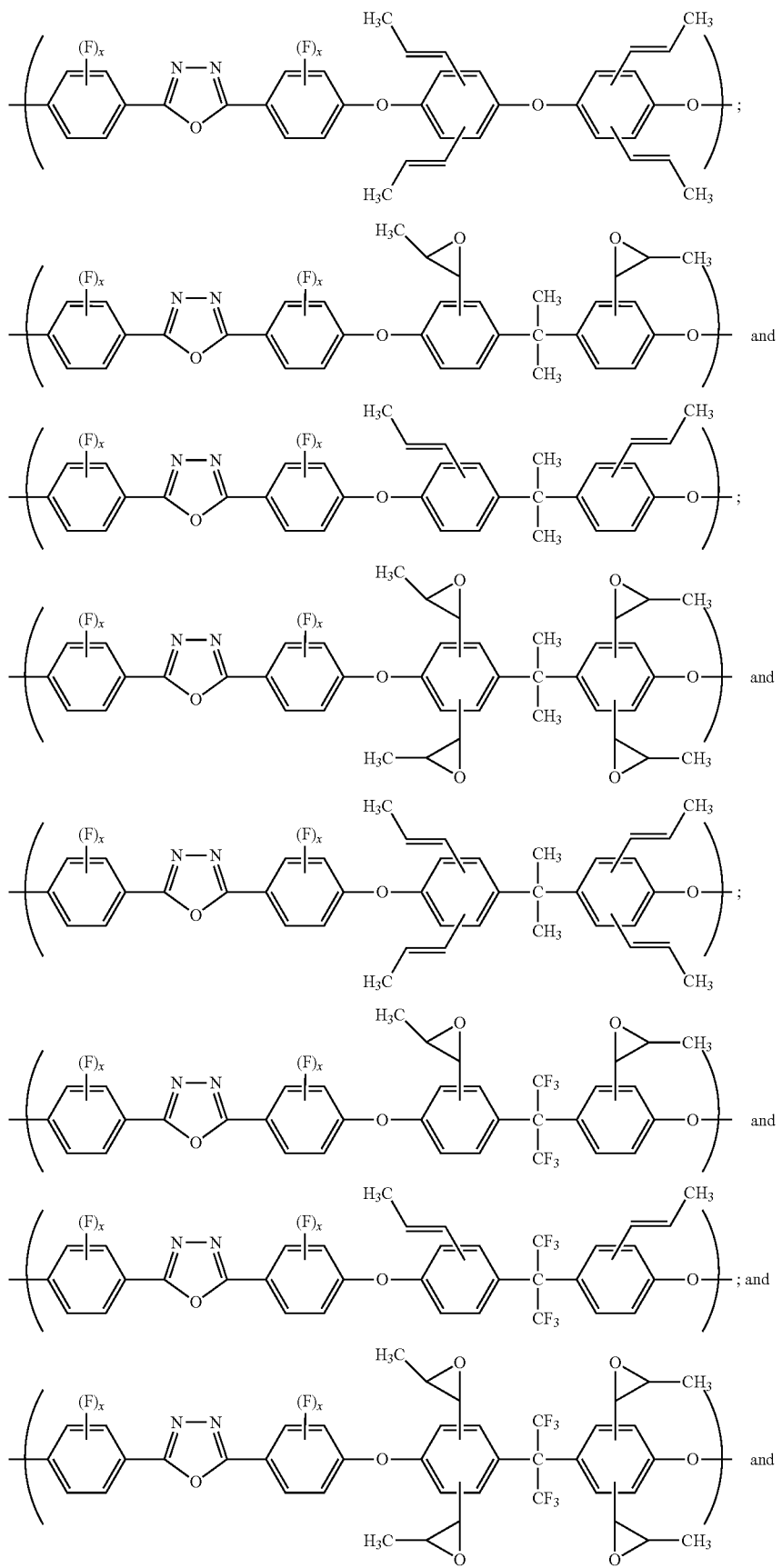

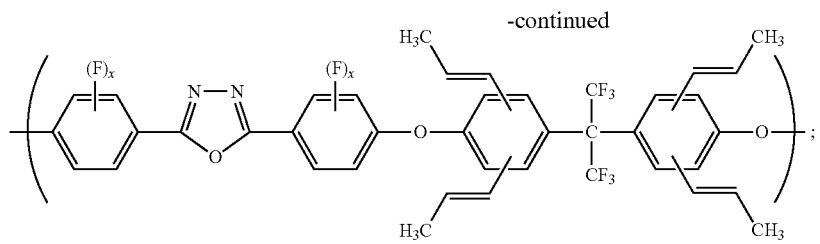
where x is 0 or 4.
To illustrate, in particular embodiments, the present copolymers can be selected from a copolymer of:
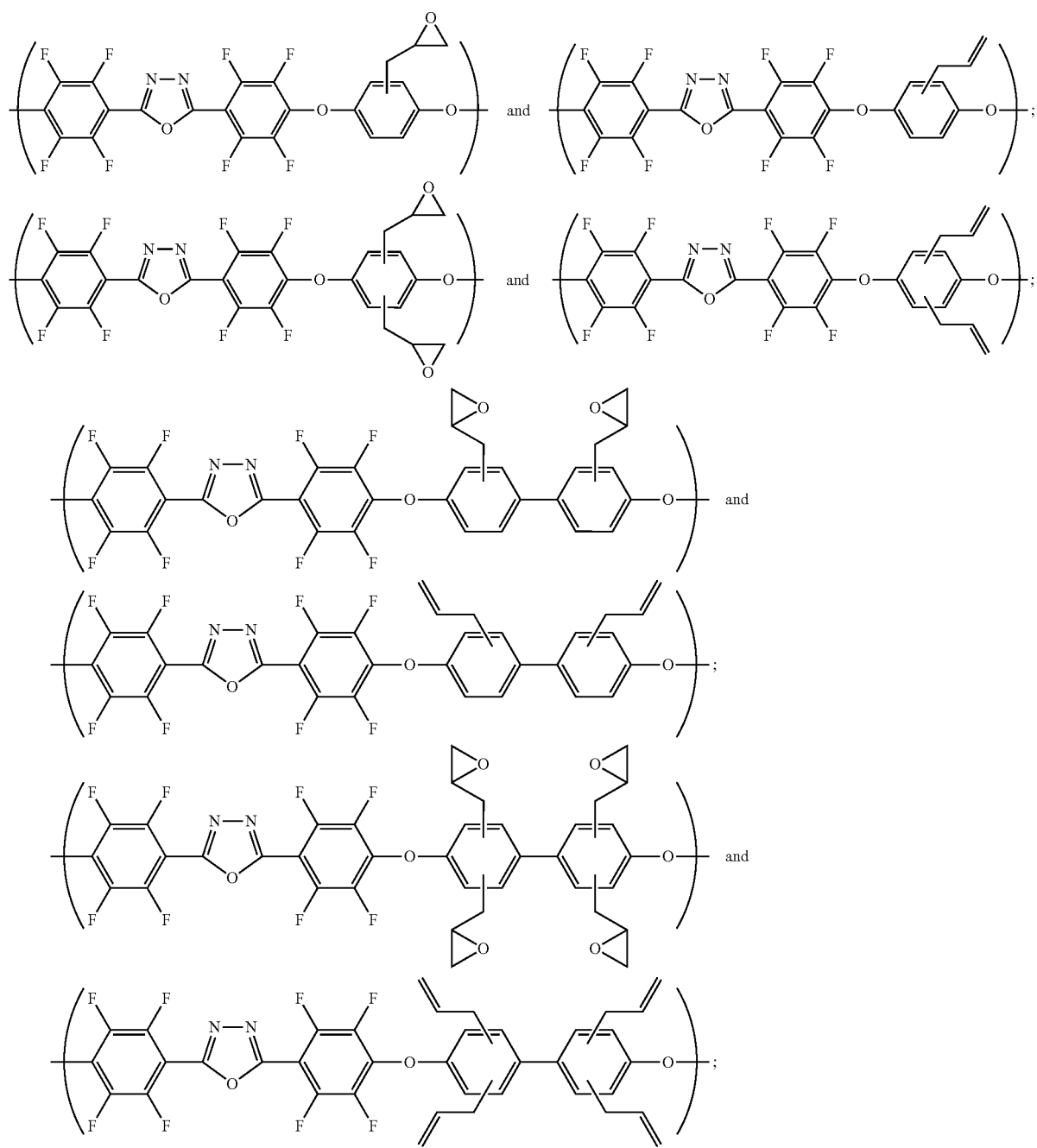

-continued
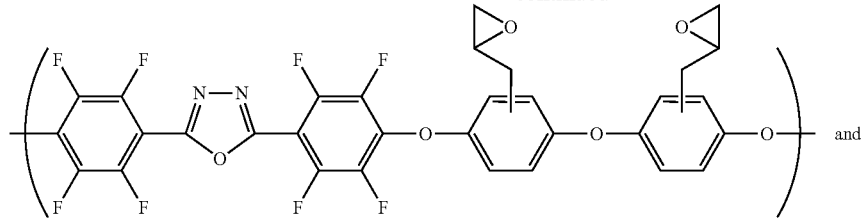 and
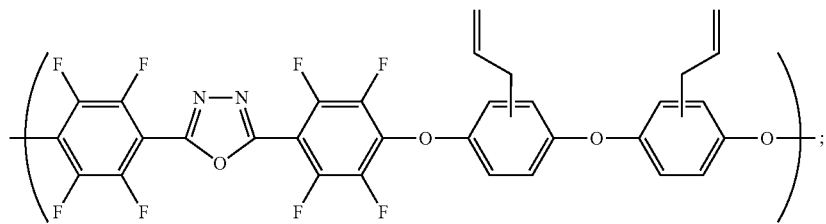;
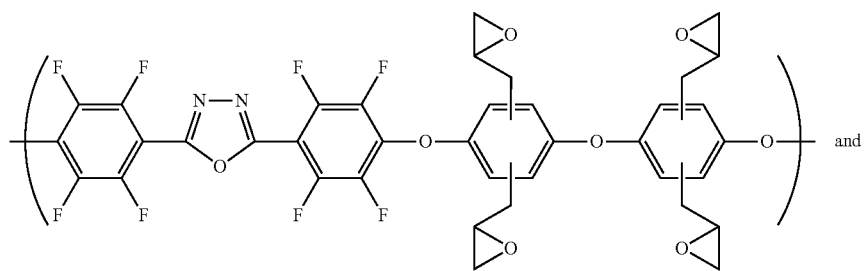 and
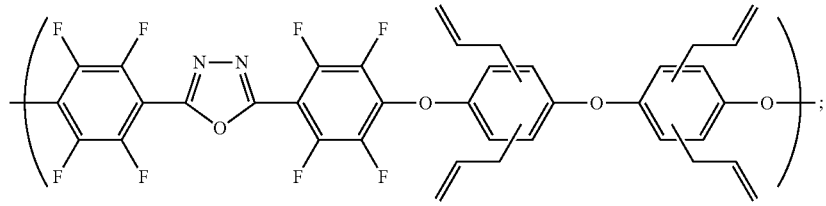;
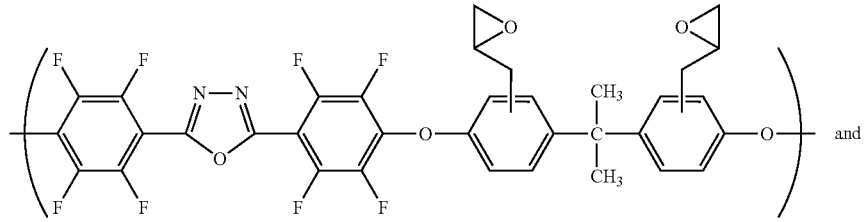 and
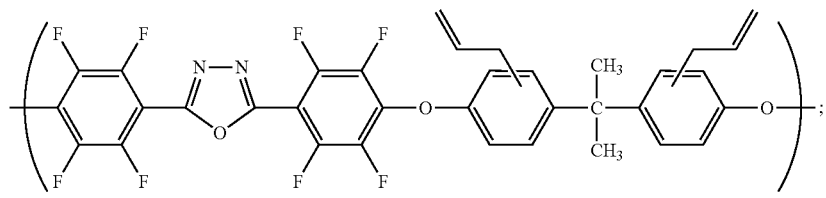;
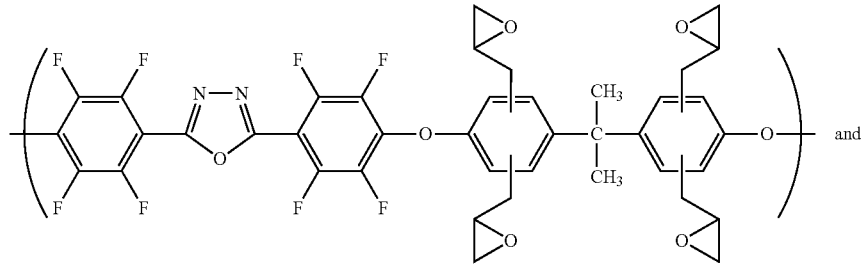 and -continued

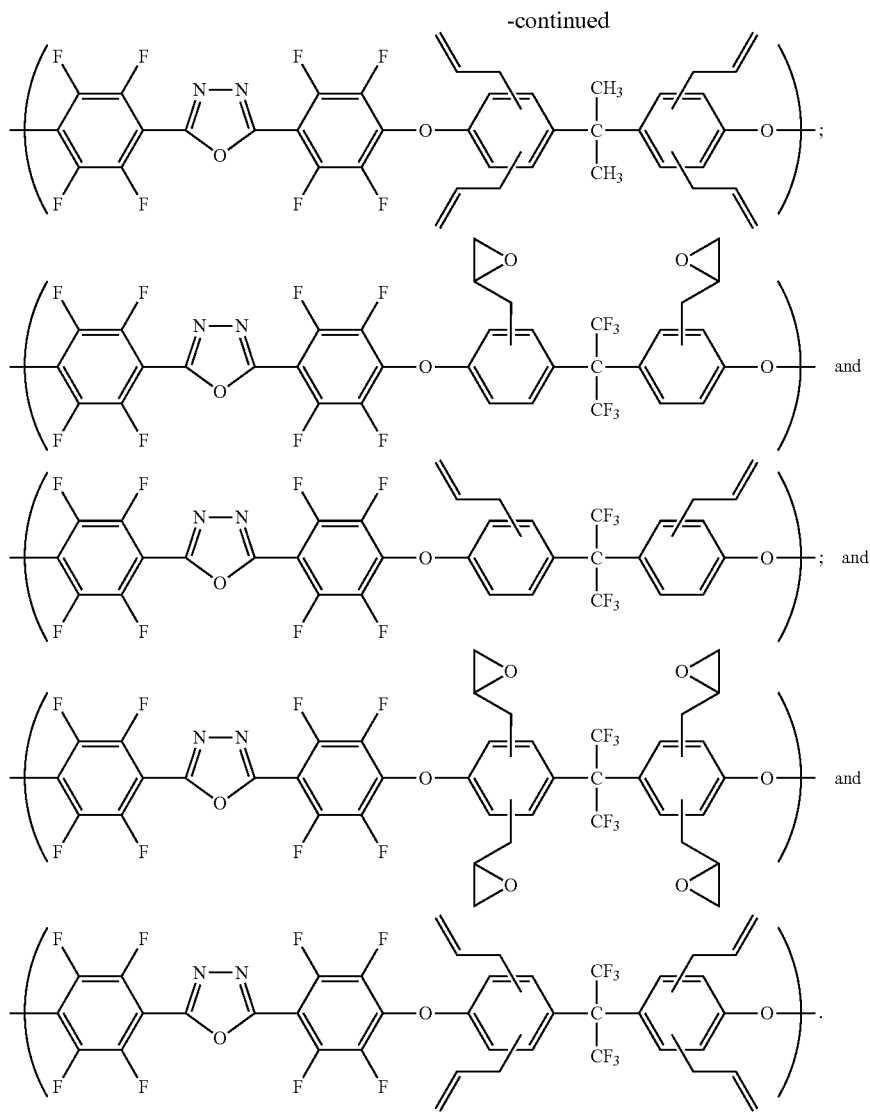

Better thermal stability generally has been observed with rigid polymers such as those having extended aryl groups in the backbone. However, the presence of the extended aryl groups in the backbone makes the polymer conductive. Without wishing to be bound by any particular theory, it is believed that the conductivity of the polymer can be significantly reduced if the extended aryl groups are not in the same plane, that is, if the aryl groups are twisted relative to each other. This can be achieved, for example, by substituting the aryl groups with various chemical groups to introduce steric hindrance.

Accordingly, in certain embodiments, either the repeat unit —Z—W—Z— or if present, the co-repeat unit —Z'—W'—Z'—, or both the repeat units, can be substituted with at least one -L-T group where T is R and where R is a $C_{1-10}$ alkyl group, a $C_{1-10}$ alkoxy group, or a $C_{1-10}$ haloalkyl group.

Various embodiments of the present polymers can be solution-processed into thin films, where the thin films subsequently can be crosslinked via actinic (e.g., UV) radiation, into physically robust and ambient-stable active or passive materials suitable for use in various electronic, optical, and optoelectronics devices. For example, the polymer materials according to the present teachings can be used (either by itself or with at least one other dielectric material) as the dielectric layer in a thin film transistor, as a passivation material (for example, to encapsulate the source and drain electrodes in a transistor), or as an etch-stop material (for example, to protect an underlying metal oxide semiconductor layer during the patterning (etching) step of the metal layer on top to define source and drain electrodes).

When used as a dielectric material, the present organic materials can exhibit a wide range of desirable properties and characteristics including, but not limited to, low leakage current densities, high breakdown voltages, low hysteresis, large capacitance values, uniform film thickness, solution-processability, fabricability at low temperatures and/or atmospheric pressures, thermal stability, air and moisture stability, resistance to harsh reagents, and/or compatibility with diverse gate materials and/or semiconductors. When used as passivation or interfacial materials, the present organic materials can exhibit desirable properties and characteristics including, but not limited to, high decomposition temperature, high optical clarity, low shrinkage, low moisture absorption, low oxygen penetration, uniform film thickness, solution-processability, fabricability at low temperatures and/or atmospheric pressures, and good adhesion to adjacent materials. When used as etch-stop materials, the present organic materials can exhibit desirable properties and characteristics including, but not limited to, chemical resistance to common wet etchants, photopatternability (without the need for photoresist, hence reducing manufacturing steps), high decomposition temperature, high optical clarity, low shrinkage, low moisture absorption, low oxygen penetration, uniform film thickness, solution-processability, fabricability at low temperatures and/or atmospheric pressures, and good adhesion to diverse adjacent materials (metal oxides, metals or metal alloys, and organic materials).

Prior to photocrosslinking, the polymers according to the present teachings generally are soluble in common organic solvents but can become significantly less soluble or insoluble in the same solvents after undergoing crosslinking. As used herein, a compound can be considered soluble in a solvent when at least 1 mg of the compound can be dissolved in 1 ml of the solvent. Compounds wherein less than 1 mg of the compound can be homogeneously dissolved in 1 ml of the solvent are considered insoluble.

More specifically, the polymers disclosed herein (prior to crosslinking) can have satisfactory solubility in various common organic solvents, thereby affording formulations that are suitable for solution-phase processes. Examples of organic solvents that can be used to formulate the present polymers include, but are not limited to, aromatic hydrocarbon solvents such as benzene, cyclohexylbenzene, toluene, xylene, and mesitylene; aliphatic hydrocarbons such as hexanes, cyclopentane, cyclohexane, n-nonane, n-decane, n-undecane, n-dodecane; alcohol solvents such as methanol, ethanol, propanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-butanone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate (PGMEA), methyl lactate, ethyl lactate and γ-butyrolactone; ether solvents such as diisopropyl ether, dibutyl ether, ethyl propyl ether, diethyl ether, bis(2-methoxyethyl)ether, dioxane, anisole, phenetole, and veratrole; and amide solvents such as N-methylpyrrolidinone, dimethyl formamide, and dimethylacetamide. Preferred solvents can include diethyl carbonate, cyclopentanone, PGMEA, anisole, cyclohexanone, dimethylacetamide, diacetone alcohol, tetramethylurea, methylbenzoate, γ-butyrolactone, ethylbenzoate, and propylene carbonate. Any of these solvents can be used either singly or in combination, or as mixtures with water.

Accordingly, the present polymers can be mobilized in a liquid medium to provide a composition (a photopatternable composition) for forming a photopatternable material. The composition can be a solution, a dispersion, a suspension, an emulsion, or a gel, although in most embodiments, the composition is a solution or a dispersion suitable for solution-phase processes. The liquid medium can include solid and/or gaseous components, that is, the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

In addition to the present polymers, the photopatternable composition can include other components that can be used to selectively modify the processability of the composition (e.g., viscosity, photocuring speed, and/or absorption wavelengths) and/or the properties of the resulting material (e.g., dielectric properties, thermal stability, and/or decomposition temperature). For example, the composition can include initiators, photosensitizers, and/or additional crosslinking agents to enhance its photopatternability (e.g., by speeding up curing time or reducing curing temperature or radiation dosage) and/or to increase the crosslinking density of the present polymers. Examples of initiators can include radical initiators such as azobisisobutyronitrile (AIBN), photoacid generators (PAGs) such as triphenylsulfonium triflate, or radical photoinitiators such as diphenyl(2,4,6-trimethylbenzoyl)phosphine oxide (TPO). Some commercially available PAGs are:

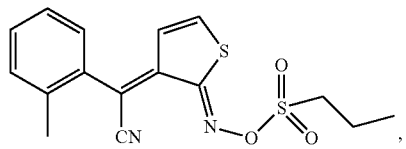

Irgacure PAG 103

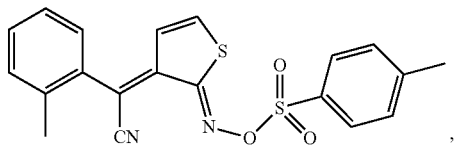

Irgacure PAG 121

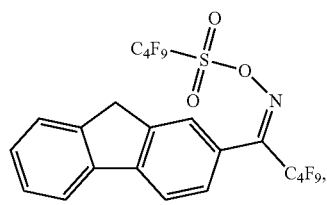

CGI 1907

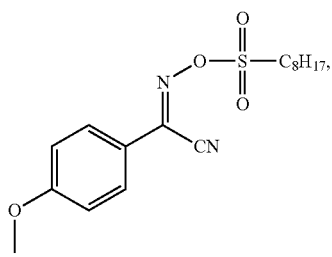

CGI 725

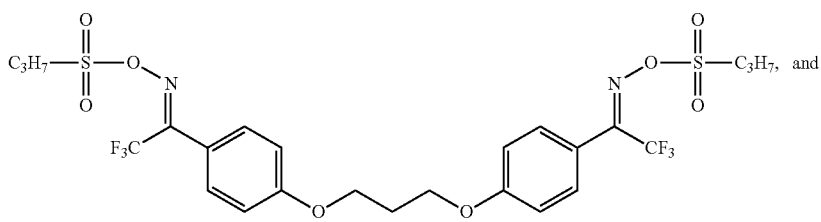

Irgacure PAG 203

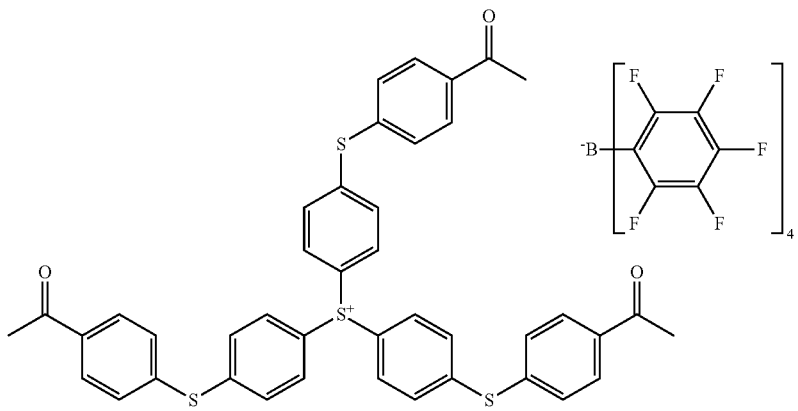

Irgacure PAG 290

Examples of photosensitizers include benzophenones, thioxanthenones, anthraquinones, fluorenones, acetophenones, and coumarin derivatives. Depending on the photochemistry, certain photosensitizers also can be used as initiators.

To illustrate, in certain embodiments, a crosslinked film according to the present teachings can be deposited from a photopatternable composition, where the photopatternable composition includes (a) a polymer according to the present teachings, and (b) a photoacid generator dispersed in a liquid medium (e.g., an organic solvent or mixtures thereof). The polymer can be present in the photopatternable composition at a concentration between about 1 wt. % and about 20 wt. %, and the photoacid generator can be present in the photopatternable composition at a concentration between about 0.05 wt. % and about 1 wt. %.

In certain embodiments, the composition can include a small molecule crosslinker or a second crosslinkable polymer, where the small molecule crosslinker or the second crosslinkable polymer can include the same crosslinkable group as the present polymers (e.g. epoxides). By including the small molecule crosslinker or the second crosslinkable polymer, the resulting composition can lead to a more densely crosslinked film with increased mechanical strength and stronger chemical resistance.

In particular embodiments, a composition according to the present teachings can comprise an epoxide polymer such as those described in U.S. patent application Ser. No. 13/742,867:

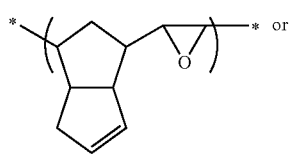 or

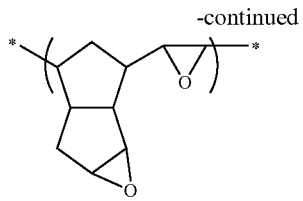

or a diglycidyl ether polymer such as:

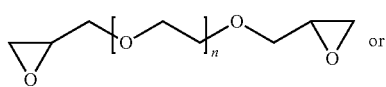 or poly(ethylene glycol) diglycidyl ether

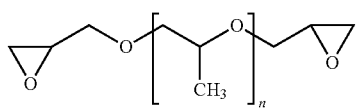

poly(propylene glycol) diglycidyl ether, and/or a small molecule crosslinker such as:

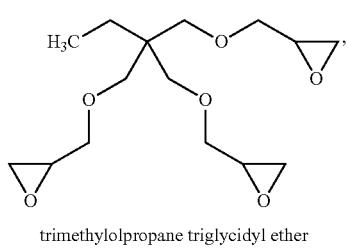

trimethylolpropane triglycidyl ether

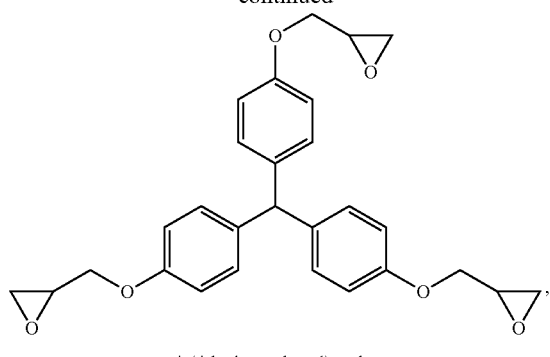
tris(4-hydroxyphenyl)methane triglycidyl ether

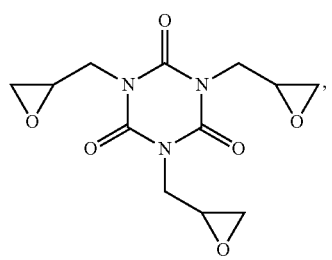
tris (2,3-epoxypropyl) isocyanurate

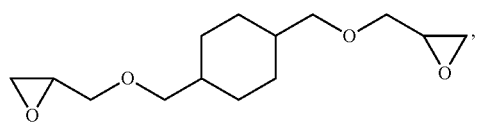
1,4-cyclohexanedimethanol diglycidyl ether

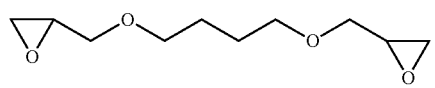
1,4-butanediol diglycidyl ether

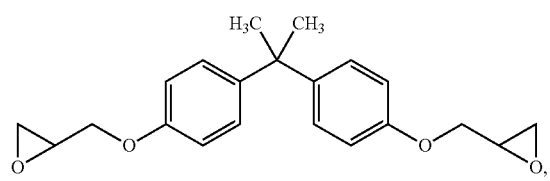
bisphenol A diglycidyl ether

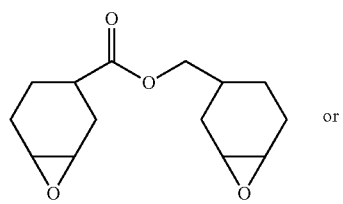
3,4-epoxycyclohexylmethyl 3,4-epoxycyclohexanecarboxylate or

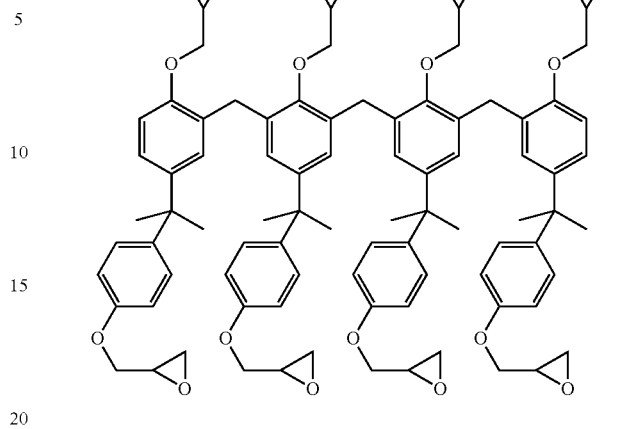
SU8

Another class of crosslinkers useful in the present composition is bismaleimides, examples of which include:

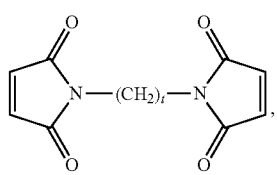
t = 1-10

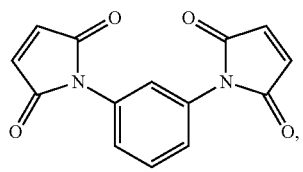

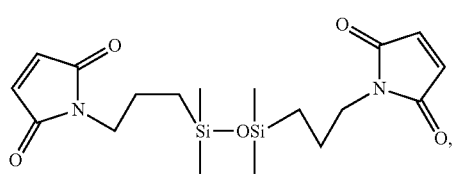

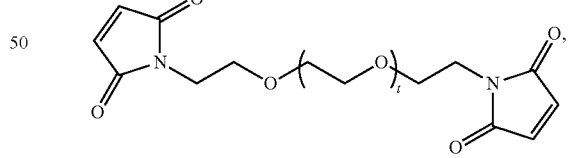
t = 1-10

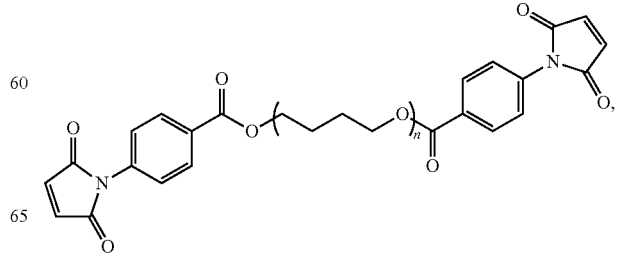

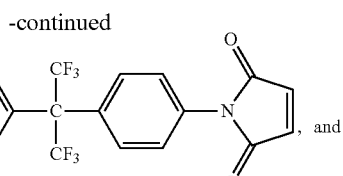

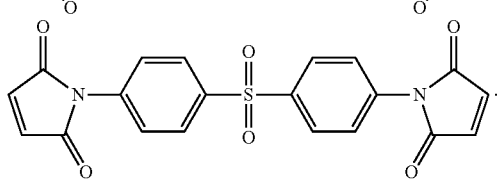

As used herein, "solution-processable" or "solution-processed" refers to the ability of a compound, for example, the present polymers, to be processed via various solution-phase processes. A solution-processable composition comprising the present polymers can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For noncontact printing techniques such as inkjet printing, the solubility requirement generally can be less stringent and a solubility range as low as about 1-4 mg/ml can suffice. For gravure printing, a higher solubility range may be necessary, often in the range of about 50-100 mg/ml. Other contact printing techniques such as screen-printing and flexo printing can require even higher solubility ranges, for example, about 100-1000 mg/ml.

Polymers of the present teachings can be photopatterned directly (without using a photoresist). Accordingly, a patterned layer can be formed by depositing a photopatternable composition according to the present teachings to provide an uncrosslinked film, subjecting the uncrosslinked film to actinic radiation in an imagewise pattern such that the polymer in the photopatternable composition in exposed areas becomes crosslinked; and removing the unexposed areas (which remain uncrosslinked and soluble). More specifically, the process can include depositing a solution comprising a present polymer to form a polymeric film of desired thickness, exposing the polymeric film to radiation (e.g., H, I, or G line wavelengths) through a photomask (one having the desired imagewise pattern) to provide crosslinked areas and uncrosslinked areas, and stripping the uncrosslinked areas. Subsequent to the formation of the crosslinked matrix, the film material of the present teachings can be subjected to further patterning and processing steps, by which additional layers, including additional dielectric, semiconductor and/or conducting layers, can be formed on top of the material.

As mentioned above, the present polymers can exhibit low leakage current densities. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a metal-oxide-semiconductor (MOS) structure. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

Polymers of the present teachings and their crosslinked products can have low leakage current densities as measured from standard MIS and MIM capacitor structures. For example, polymers of the present teachings and their crosslinked products can have a leakage current density of less than or equal to about $2 \times 10^{-3}$ A/cm$^2$ at 1 MV/cm, less than or equal to about $5 \times 10^{-4}$ A/cm$^2$ at 1 MV/cm, or less than or equal to about $2 \times 10^{-4}$ A/cm$^2$ at 1 MV/cm.

Polymers of the present teachings can have relatively high decomposition temperatures. For example, polymers of the present teachings can have a decomposition temperature greater than about 300° C., a decomposition temperature greater than about 350° C., or a decomposition temperature greater than about 400° C. The decomposition temperature ($T_d$) of a polymer can be defined as the temperature in a thermogravimetric analysis (TGA) plot where the polymer loses ~5% of the initial mass.

Dielectric materials prepared from polymers of the present teachings can allow surface planarization and filling of pinholes before crosslinking, hence improving surface smoothness (for example, achieving a sub-nanometer surface roughness), and accordingly, device performance and operation. Pinholes also can be filled by depositing two or more layers of dielectric materials sequentially on top of one another, hence forming a multilayer dielectric material that can have very good surface uniformity and can be essentially pinhole-free over a large area.

For example, certain embodiments of a dielectric material according to the present teachings can be a multi-layer laminate having two or more layers of dielectric materials sequentially deposited on top of each other (although one or more interlayers can be present), where at least one of the layers is prepared from a composition including a polymer according to the present teachings. For example, the multi-layer laminate can include at least one layer prepared from a composition including the present polymers alone in a liquid medium, and at least one layer prepared from a dielectric polymer or an inorganic (e.g., metal oxide) dielectric material. In embodiments where the dielectric material is a multi-layer laminate including both organic (such as the present polymer) and inorganic (such as silicon nitride or oxide) sublayers, a hybrid layer (such as a blend of the present polymer with metal oxide particles or a small molecule silane, phosphonate, or thiolate) can be present to improve adhesion between the sublayers.

The present teachings further provide articles of manufacture, for example, composites, that includes a polymeric material of the present teachings and a substrate component and/or a semiconductor component. The substrate component can be selected from, but is not limited to, doped silicon, an indium tin oxide (ITO), ITO-coated glass, ITO-coated polyimide or other plastics, copper, molybdenum, chromium, aluminum or other metals alone or coated on a polymer or other substrate. The composite can include a semiconductor component, particularly, a metal oxide semiconductor such as IGZO.

Particularly, the present polymers can be used, in whole or in part, as the etch-stop layer of a metal oxide thin film transistor, preferably, an IGZO thin film transistor, wherein the etch-stop layer comprises a polymer of the present teachings and is positioned directly adjacent to a metal oxide semiconductor layer.

A typical thin film transistor (TFT) includes a number of layers and can be configured in various ways. For example, a TFT can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

FIG. 1 illustrates two possible structures of a bottom-gate top-contact metal oxide TFT, wherein the source and drain electrodes are defined on top of the metal oxide (MO) semiconductor layer. FIG. 1*a* shows an etch stop (ES) structure, and FIG. 1*b* shows a back-channel-etch (BCE) structure. As shown, in the ES structure, an etch stop layer is deposited on top of the metal oxide layer to protect the metal oxide layer from the subsequent processing (e.g., patterning) steps used to form the source and drain electrodes. In the BCE structure, the source and drain electrodes are directly patterned (usually via dry etching) above the metal oxide layer. A high-temperature annealing step often is performed afterwards to repair the damage introduced during the patterning step. In both structures, a passivation layer can be deposited over the source and drain electrodes and the metal oxide channel.

Accordingly, an aspect of the present teachings relates to a method of fabricating a metal oxide thin film transistor, wherein the gate dielectric layer, the passivation layer, and/or the etch-stop layer (if present) comprises the polymer described herein.

Figure 2:
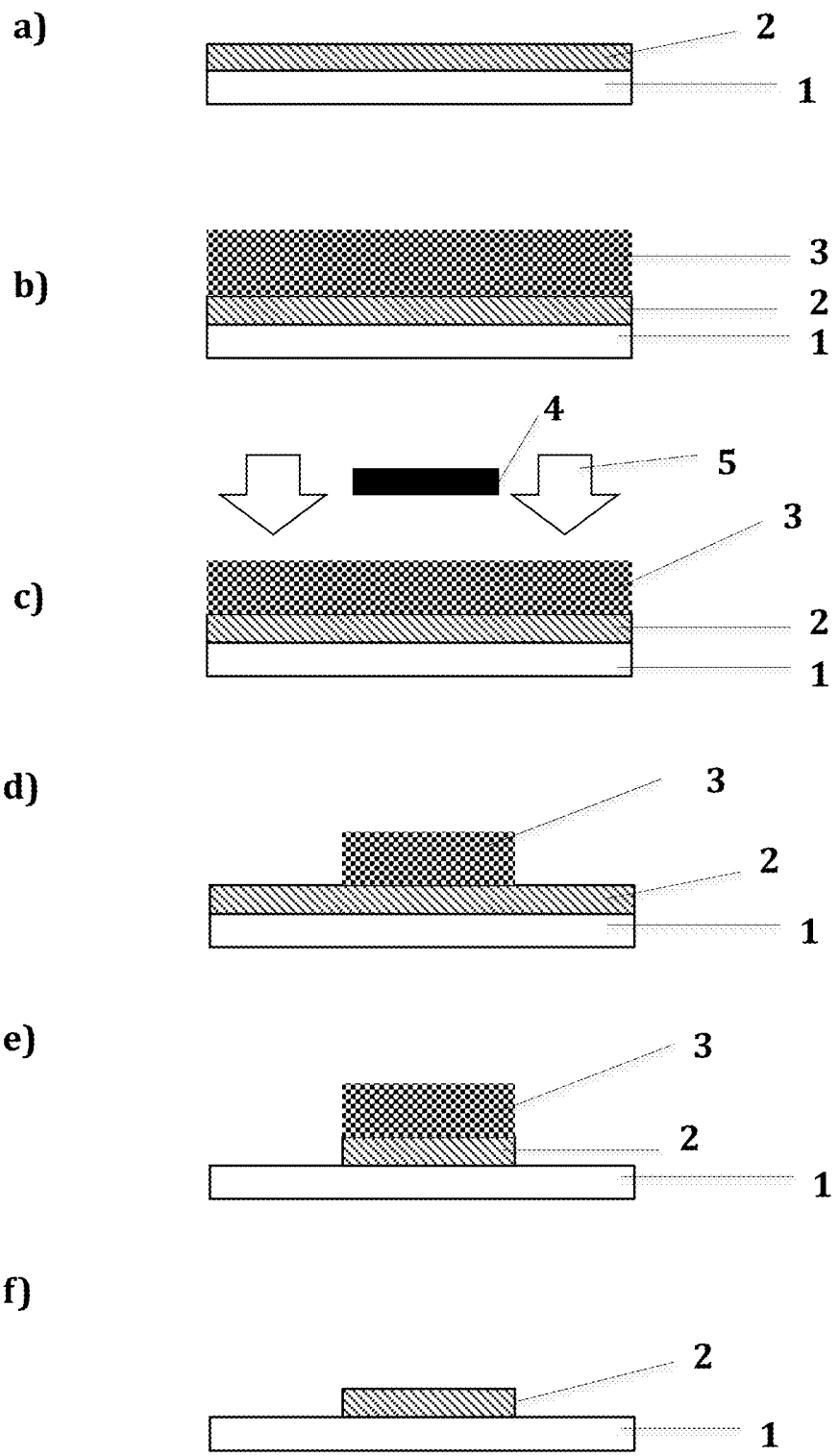
FIG. 2 illustrates the process flow of how to fabricate a metal oxide thin film transistor using the present polymers as the etch-stop layer, the passivation layer, and/or the gate dielectric layer.
Figure 2:
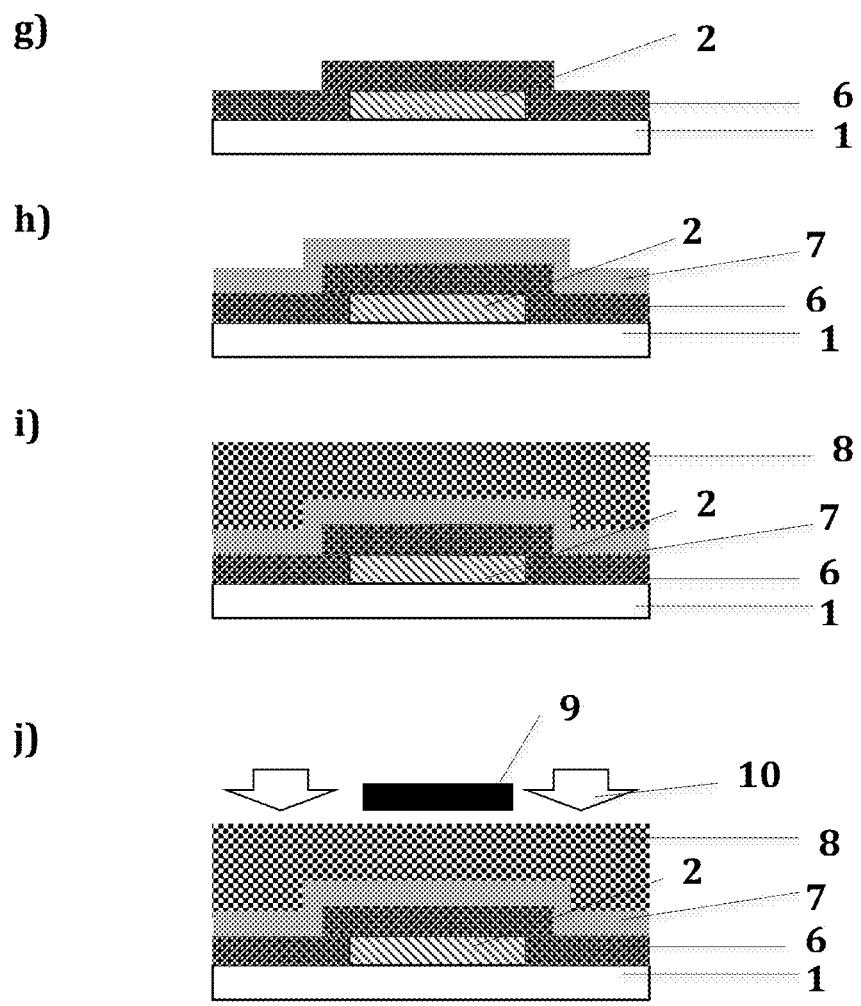
Figure 2:
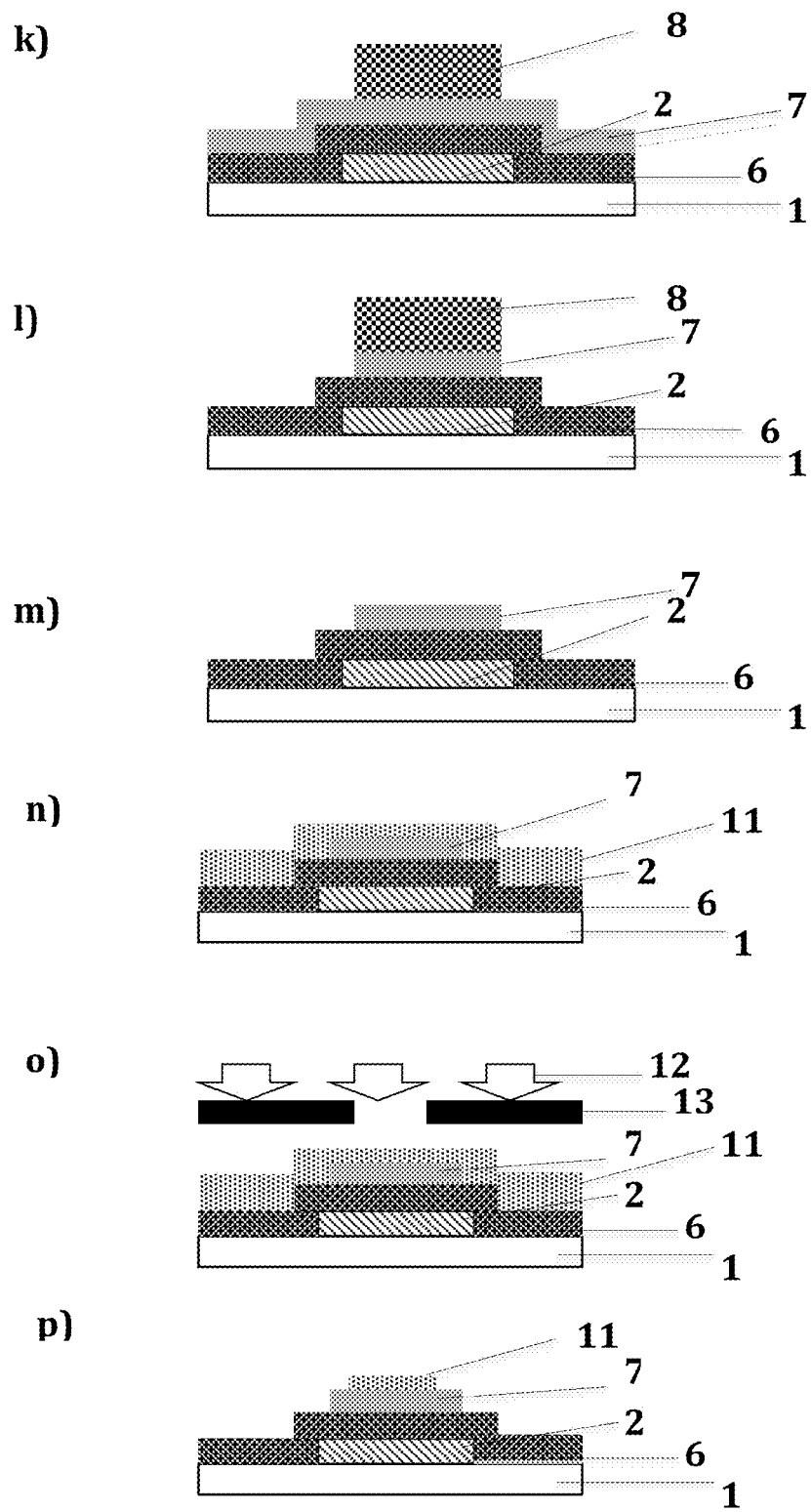
Figure 2:
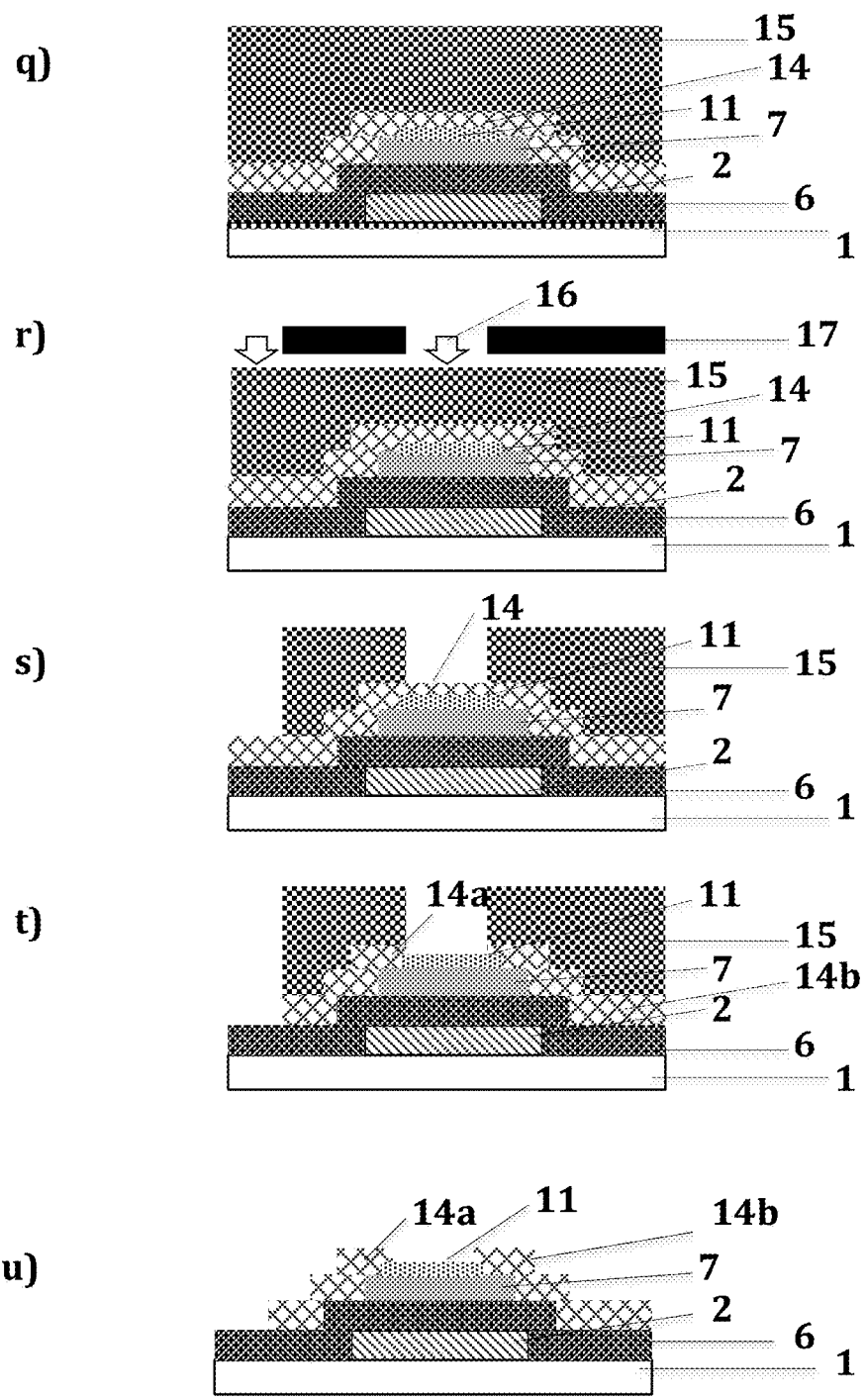
Figure 2:
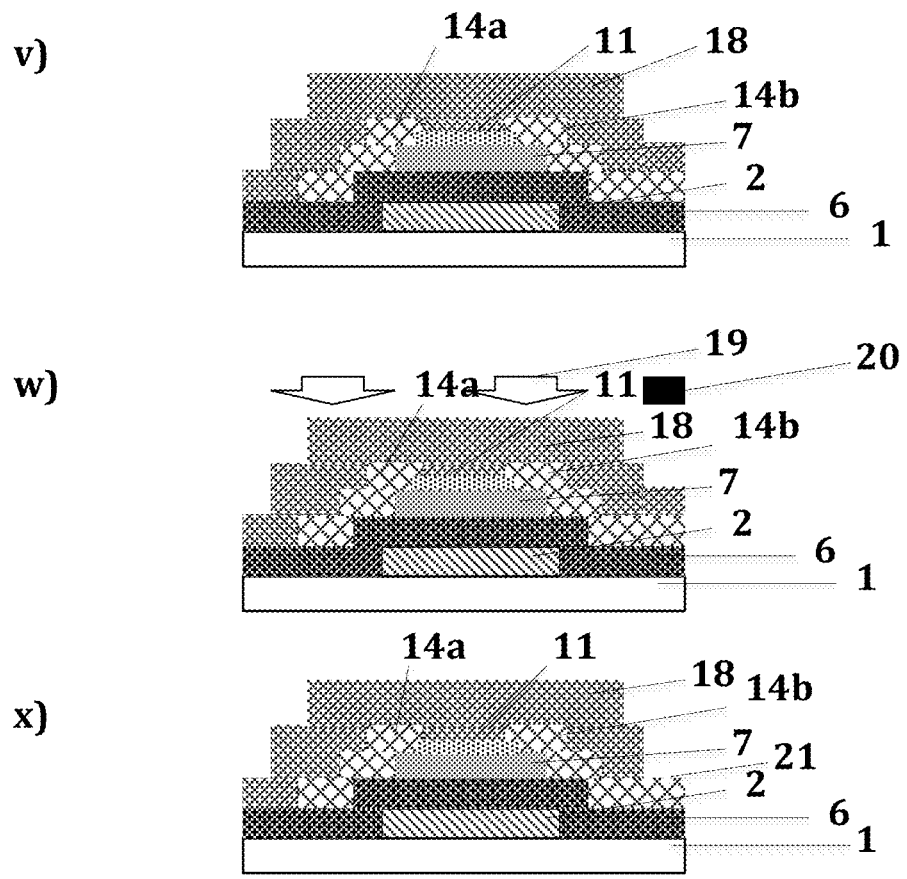

FIG. 2 illustrates a method of fabricating an etch-stop (ES) type bottom-gate top-contact metal oxide TFT. As shown in FIG. 2*a*, a conductive layer (typically one or more metals) is deposited on a substrate (1) as the gate electrode (2). In FIG. 2*b*, a photoresist layer (3) is deposited on top of the gate electrode. For illustrative purposes, a positive-type photoresist layer is used; however, a negative-type photoresist also can be used as appreciated by one skilled in the art. The photoresist layer is then exposed through a mask (4) to UV radiation (5) as shown in FIG. 2*c*. FIGS. 2*d*-2*f* show the remaining steps of the photolithography process. Specifically, the photoresist is developed to provide the desired pattern (FIG. 2*d*), and the metallic layer is etched (e.g. via wet etching) to adopt the same pattern as the patterned photoresist (FIG. 2*e*). The photoresist is then removed to provide the patterned gate electrode (FIG. 2*f*).

Next, a dielectric layer (6) is deposited on top of the gate electrode as shown in FIG. 2*g*. In embodiments where the dielectric layer is prepared from the present polymer, a composition comprising the present polymer in an organic solvent (optionally comprising additional components such as a sensitizer and/or a photoacid generator) can be solution-processed (e.g., spin-coated) onto the composite comprising the gate electrode and the substrate. To improve its dielectric properties and mechanical robustness, this polymeric layer can be heated and/or irradiated to induce crosslinking. For example, this polymeric layer first can be soft-baked at a low temperature (e.g., between about 100-150° C.) for a short period of time (e.g., between about 30 seconds and 5 minutes). Then, it can be exposed to UV radiation, followed by a hard baking step (e.g., at about 250-350° C. and for about 10 minutes to 1 hour). Similar steps can be followed in embodiments where a different crosslinkable electrically insulating polymer is used as the dielectric layer. Alternatively, a conventional insulating material such $SiO_x$ may be used, deposited via a vapor-phase process such as plasma-enhanced chemical vapor deposition (PECVD).

After the dielectric layer is formed, a metal oxide semiconductor layer (7) is deposited as shown in FIG. 2*h*. Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium-gallium-oxide (IGO), indium-ittrium-oxide (IYO), indium tin zinc oxide (ITZO), tin oxide ($SnO_2$), and zinc oxide (ZnO). In conventional processes, the metal oxide semiconductor layer is sputtered from a target. However, solution-phase processes have been described, for example, in U.S. Pat. No. 8,017,458. An annealing step (between about 250-400° C., preferably below about 300° C.) can be performed to improve the semiconducting properties of the metal oxide layer.

To pattern the metal oxide layer, a photoresist (8) can be used as shown in FIG. 2*i*-2*m*. The process generally is similar to the patterning of the gate electrode, which includes depositing the photoresist (FIG. 2*i*), exposure through a mask (9) to UV radiation (10) (FIG. 2*j*), developing the photoresist (FIG. 2*k*), etching the metal oxide semiconductor (FIG. 2*l*), and stripping the photoresist (FIG. 2*m*). Various photoresist materials (both positive-type and negative-type) and etchants (both dry and wet etchants) for different metals and metal oxide semiconductors are known in the art.

FIGS. 2*n*-2*p* illustrate how an etch-stop layer (11) comprising the present polymer can be formed and photopatterned. First, the present polymer is deposited from a solution-phase composition (which optionally can include additional components such as a photoacid generator), for example, by spin-coating (FIG. 2*n*). After deposition, this polymeric layer is exposed to UV radiation (12) through a photomask (13) to induce photocrosslinking in the exposed areas (FIG. 2*o*). The desired pattern is developed by removing the unexposed, soluble areas (FIG. 2*p*). To further improve the mechanical robustness of the patterned etch stop layer, an additional annealing step (e.g., at about 100-400° C.) can be performed.

FIGS. 2*q*-2*u* illustrate how the source and drain electrodes can be formed. Briefly, similar to the gate electrode, a conductive layer (14) (typically, one or more metals) is deposited. A photoresist layer (15) is coated on top (FIG. 2*q*), followed by exposure to UV radiation (16) through a shadow mask (17) (FIG. 2*r*), developing the photoresist (FIG. 2*s*) to transfer the pattern of the shadow mask to the photoresist, etching the conductive layer to define the source and drain electrodes (14*a*, 14*b*) until the etch-stop layer is exposed (FIG. 2*t*), and finally, removing the photoresist (FIG. 2*u*).

In embodiment where the metal oxide TFT has a back-channel-etch structure, the source and drain electrodes can be deposited through a mask directly on top of the metal oxide semiconductor layer. In such embodiment, no etch-stop layer is needed.

FIGS. 2v-2x illustrate how a passivation layer (18) comprising the present polymer can be formed and photopatterned. First, the present polymer is deposited from a solution-phase composition (which optionally can include additional components such as a photoacid generator), for example, by spin-coating, over the source and drain electrodes and the metal oxide semiconductor layer (or the etch-stop layer for an etch-stop structure TFT) (FIG. 2v). After deposition, this polymeric layer is exposed to UV radiation (19) through a photomask (20) to induce photocrosslinking in the exposed areas. In FIG. 2w, the entire passivation layer is crosslinked but for an area where a via hole (21) is to be located. The unexposed area is developed to form the via hole (FIG. 2x).

Various embodiments of the transistors described herein can be arranged in an array which can be used as switching devices or peripheral drivers in active matrix liquid crystal displays (AMLCDs) and as pixel drivers for active matrix organic light-emitting diodes (AMOLEDs).

In the following examples, photopatternable polymeric materials according to the present teachings were prepared and characterized by various analytical techniques including nuclear magnetic resonance (NMR) spectroscopy, elemental analysis, gel permeation chromatography (GPC), thermogravimetric analysis (TGA), optical microscopy, scanning electron microscopy (SEM), and metal-insulator-semiconductor (MIS) device leakage and capacitance measurements, to demonstrate, among other things, their dielectric properties, thermal stability, chemical resistance, and compatibility with oxide semiconductors and photolithography processes. Electronic devices, for example, metal oxide thin film transistors, incorporating these polymeric films also have been fabricated and characterized, data of which are provided below.

The following examples are provided to illustrate further and to facilitate the understanding of the present teachings and are not in any way intended to limit the invention.

Example 1

Synthesis of Polymers 1 and 2

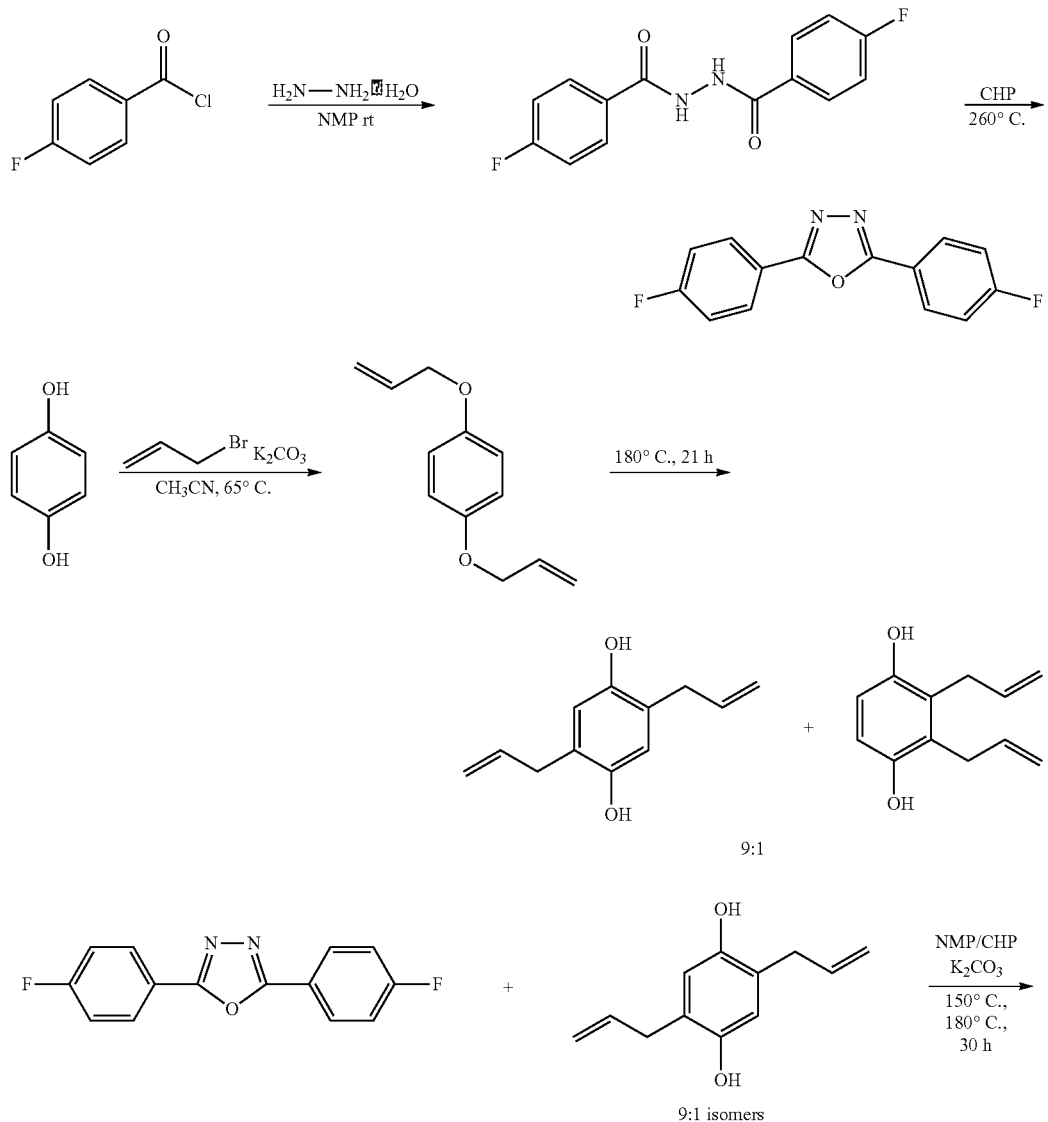

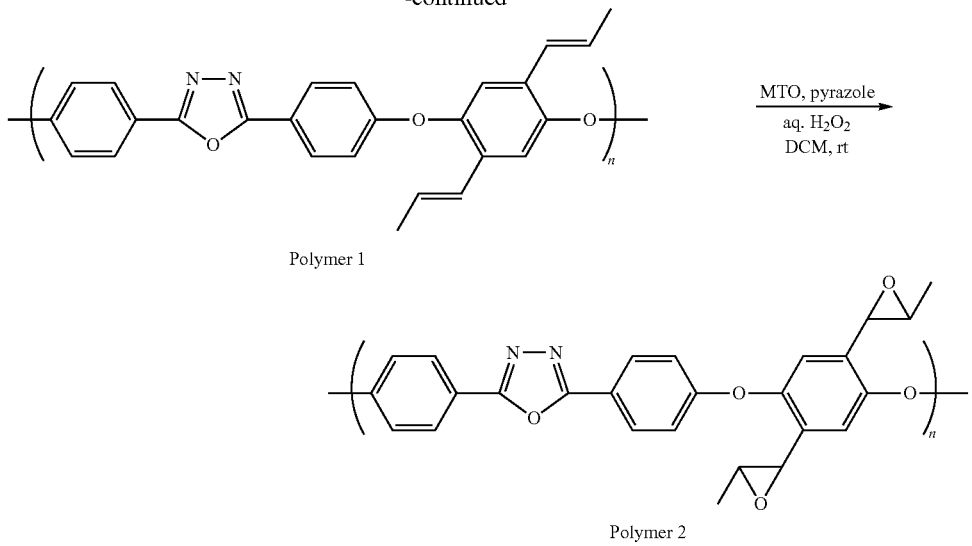

Polymer 1

Polymer 2

Step 1a. Synthesis of 1,4-bis(4-fluorophenyl)hydrazide: A round-bottom flask was charged with 4-fluorobenzoyl chloride (101.67 g, 0.64 mol) and N-methylpyrrolidone (NMP, 540 ml). The reaction mixture was then cooled by ice water. Hydrazine monohydrate ($H_2N-NH_2.H_2O$, 15.55 ml, 0.32 mol) was added dropwise. The reaction mixture was stirred at room temperature (rt) overnight and then precipitated into water (600 ml). The solid was collected by filtration, suspended with ethyl acetate (AcOEt, 400 ml), vigorously stirred for 10 min, filtered, and dried at 80° C. under vacuum to constant weight (75.71 g, yield 85.6%).

$^1$H NMR (CDCl$_3$, 500 MHz): δ=9.10 (br, 2H), 7.94-7.88 (m, 4H), 7.22-7.16 (m, 4H).

Step 1b. Synthesis of 2,5-bis(4-fluorophenyl)-1,3,4-oxadiazole: A round-bottom flask equipped with a Dean-Stark trap and a condenser was charged with crude 1,4-bis(4-fluorophenyl)hydrazide from Step 1a (75.71 g, 0.274 mol) and 1-cyclohexyl-2-pyrrolidone (CHP, 95 ml). The mixture was heated to 260° C. and held overnight. After cooling down, a white precipitate formed. The mixture was diluted with methanol (MeOH, 100 ml) and filtered to give a white solid after drying at 80° C. under vacuum (33.0 g, yield 46.6%). $^1$H NMR (CDCl$_3$, 500 MHz): δ=8.19-8.13 (m, 4H), 7.27-7.22 (m, 4H). Elemental Analysis for $C_{14}H_8F_2N_2O$: Calcd. C, 65.12; H, 3.12; N, 10.85. Found: C, 65.11; H, 3.20; N, 10.88. Mp (uncorrected): 201° C.-203° C.

Step 2a. Synthesis of 1,4-bis(allyloxy)benzene: A round-bottom flask was charged with hydroquinone (11 g, 0.1 mol), potassium carbonate ($K_2CO_3$, 31.8 g, 0.23 mol) and anhydrous acetonitrile (CH$_3$CN, 100 ml) under nitrogen and the mixture was heated to 65° C. with vigorous stirring. Allyl bromide (19.9 ml, 0.23 mol) was added dropwise into the mixture and the reaction was kept at 65° C. for 18 h. After cooling down, the mixture was filtered and concentrated. It was re-dissolved in a small amount of hexane and quickly passed through a short plug of silica gel with a 10:1 mixture of hexane:AcOEt as the eluent to give a pale yellow solid (15.1 g, yield 79%). $^1$H NMR (CDCl$_3$, 500 MHz): δ=6.87 (s, 4H), 6.11-6.02 (m, 2H), 5.45-5.39 (m, 2H), 5.32-5.26 (m, 2H), 4.50 (dt, J=5.4 Hz, 1.5 Hz, 4H).

Step 2b. Synthesis of 2,5-bisallyl-1,4-hydroquinone and 2,3-bisallyl-1,4-hydroquinone: 1,4-Bis(allyloxy)benzene from Step 2a (10.5 g, 55.2 mmol) was stirred at 180° C. under nitrogen and then cooled down. Crude NMR showed ~1:1 mixture of 2,5-bisallyl-1,4-hydroquinone and 2,3-bisallyl-1,4-hydroquinone. $^1$H NMR (CDCl$_3$, 500 MHz): δ=6.62 (s, 2H), 6.58 (s, 2H), 6.00-5.90 (m, 4H), 5.16-5.06 (m, 8H), 4.59 (s, 4H), 3.40 (d, J=6.4 Hz, 4H), 3.31 (d, J=6.4 Hz, 2H). The mixture was then recrystallized from trichloroethylene (13 ml) to give a white solid (~2 g) which was determined to be a 9:1 mixture of 2,5-bisallyl-1,4-hydroquinone and 2,3-bisallyl-1,4-hydroquinone by HPLC.

Step 3a. Synthesis of Polymer 1: A round-bottom flask equipped with a Dean-Stark trap and a condenser was charged with 2,5-bis(4-fluorophenyl)1,3,4-oxadiazole from Step 1b (1.29 g, 5.0 mmol), the 9:1 mixture of 2,5-bisallyl-1,4-hydroquinone and 2,3-bisallyl-1,4-hydroquinone from Step 2b (951 mg, 5.0 mmol), $K_2CO_3$ (1.23 g, 8.9 mmol), NMP (13 ml) and CHP (13 ml). The reaction mixture was stirred at 150° C. for 16 hours and then at 180° C. for 30 hours more. After dilution with NMP (5 ml), the mixture was filtered while hot and the filtrate was precipitated into 120 ml of MeOH. After filtration, the solid was boiled in 100 ml of water for 10 min with vigorous stirring and filtered while hot. After washing with MeOH, the solid was dried under vacuum at 80° C. overnight. Finally a light brown solid was obtained (1.93 g, yield 94%). $^1$H NMR (CDCl$_3$, 500 MHz): δ=8.26-7.85 (m, 4H), 7.25-7.14 (m, 2H), 7.14-6.78 (m, 4H), 6.56-6.05 (m, 4H), 1.88-1.71 (m, 6H). Elemental Analysis for $(C_{26}H_{20}N_2O_3)_n$: Calcd. C, 76.46; H, 4.94; N, 6.86. Found: C, 74.96; H, 5.09; N, 6.78.

Step 3b. Synthesis of Polymer 2: A round-bottom flask equipped with a condenser was charged with pyrazole (59.4 mg, 0.87 mmol), methyltrioxorhenium (MTO, 9 mg, 0.036 mmol), Polymer 1 from Step 3a (817 mg, 2 mmol) and dichloromethane (DCM, 20 ml) under nitrogen. After stirring for 0.5 h, $H_2O_2$ (35 wt %, 1.6 ml, 8 mmol) was added and the reaction mixture was stirred at rt for 6 hours. The mixture was then precipitated into MeOH. A yellow solid was collected, re-dissolved into CHCl$_3$ (125 ml), filtered and re-precipitated into MeOH (150 ml). After filtration and drying, a pale tan solid was obtained (500 mg, yield 57%). $^1$H NMR (CDCl$_3$, 500 MHz): δ=8.35-7.80 (m, 4H), 7.25-6.68 (m, 6H), 3.83-3.58 (m, 2H), 2.91-2.69 (m, 2H), 1.35-0.83 (m, 6H). Elemental Analysis for $(C_{26}H_{20}N_2O_5)_n$: Calcd. C, 70.90; H, 4.58; N, 6.36. Found: C, 66.27; H, 4.38; N, 5.98.

Example 2A
Synthesis of Polymers 3, 4 and 5
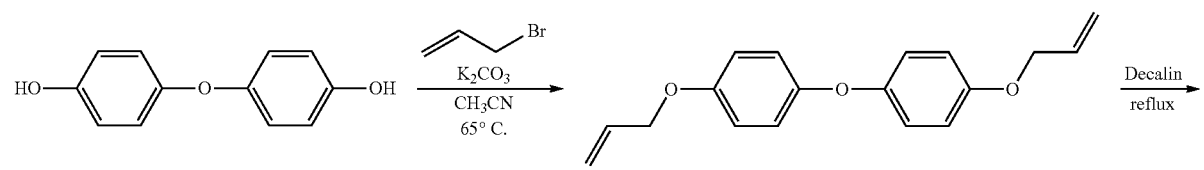
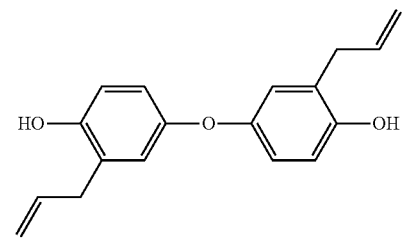
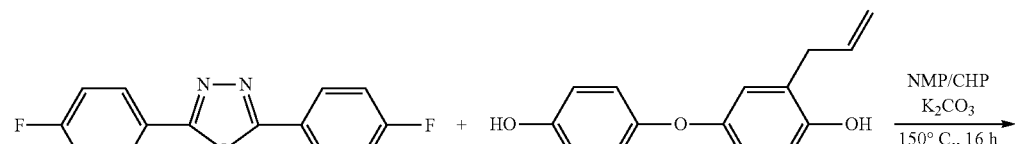
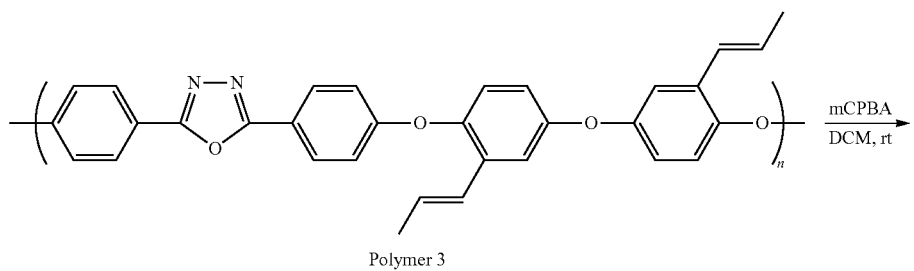
Polymer 3
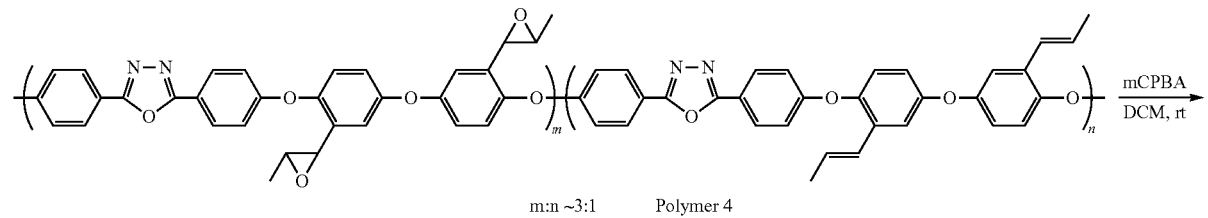
m:n ~3:1    Polymer 4
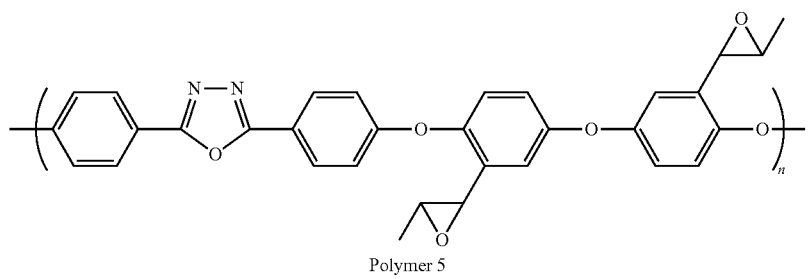
Polymer 5

Step 1a—Synthesis of 4,4'-bis(allyloxy)-diphenylether: A round-bottom flask was charged with 4,4'-bis(hydroxy)-diphenylether (24.24 g, 0.12 mol), $K_2CO_3$ (38.7 g, 0.28 mol) and anhydrous acetonitrile ($CH_3CN$, 120 ml) under nitrogen and the mixture was heated to 65° C. with vigorous stirring. Allyl bromide (25.2 ml, 0.29 mol) was added dropwise into the mixture and the reaction was kept at 65° C. for 18 h. After cooling down, the mixture was filtered and concentrated. It was mixed with MeOH (50 ml), sonicated and filtered. After drying under vacuum, a white solid was obtained (29.83 g, yield 88%). $^1$H NMR ($CDCl_3$, 500 MHz): δ=6.94-6.85 (m, 8H), 6.11-6.02 (m, 2H), 5.45-5.39 (m, 2H), 5.32-5.28 (m, 2H), 4.52 (dt, J=5.4 Hz, 1.5 Hz, 4H).

Step 1b—Synthesis of 4,4'-bis(hydroxy)-3,3'-diallyl-diphenylether: 4,4'-Bis(allyloxy)-diphenylether from Step 1a (5.65 g, 20 mmol) was mixed with decalin (100 ml) and heated to reflux under nitrogen for 23 hours. After cooling down, MeOH (50 ml×2) was added to extract the target compound. After concentration, the crude product was dry loaded to a column for purification. After gradual change of the eluent from 100% hexane to 10:1, 5:1 and then 2:1 mixtures of hexane:AcOEt, the crude was purified to give a pale yellow oil (4.6 g, yield 81%). $^1$H NMR ($CDCl_3$, 500 MHz): δ=6.83-6.69 (m, 6H), 6.07-5.92 (m, 2H), 5.23-5.10 (m, 4H), 5.00 (br s, 2H), 3.37 (d, J=6.3 Hz, 4H).

Step 2a—Synthesis of Polymer 3: A round-bottom flask equipped with a Dean-Stark trap and a condenser was charged with 2,5-bis(4-fluorophenyl)1,3,4-oxadiazole (1.95 g, 7.56 mmol), 4,4'-bis(hydroxy)-3,3'-diallyl-diphenylether from Step 1b (2.14 g, 7.56 mmol), $K_2CO_3$ (1.86 g, 13.46 mmol), NMP (19.5 ml) and CHP (19.5 ml). The reaction mixture was stirred at 150° C. for 16 hours and then at 180° C. for 25 hours more. After dilution with NMP (10 ml), the mixture was filtered while hot and the filtrate was precipitated into 200 ml of MeOH. After filtration, the solid was boiled in 100 ml of water for 10 min with vigorous stirring and filtered while hot. After washing with MeOH, the solid was dried under vacuum at 80° C. overnight. Finally, a light tan solid was obtained (3.5 g, yield 92%). GPC (THF, rt) analysis showed Mn=23.9 kDa with d=3.30. $^1$H NMR ($CDCl_3$, 400 MHz): δ=8.19-8.01 (m, 4H), 7.19-6.87 (m, 10H), 6.56-6.19 (m, 4H), 1.88-1.70 (m, 6H). Elemental Analysis for $(C_{32}H_{24}N_2O_4)_n$: Calcd. C, 76.79; H, 4.83; N, 5.60. Found: C, 76.13; H, 4.95; N, 5.71.

Step 2b—Synthesis of Polymer 4: A round-bottom flask was charged with Polymer 3 from Step 2a (3 g, 6 mmol) and DCM (23 ml). To this solution, a solution of meta-chloroperoxybenzoic acid (CPBA, 2.22 g, 9 mmol) in DCM (16 ml) was added dropwise with stirring. After stirring for 6 h, the mixture was then precipitated into MeOH. After filtration and drying under vacuum at room temperature, a white solid was obtained (3 g, yield 94%). GPC (THF, rt) analysis showed Mn=25.5 kDa with d=3.49. $^1$H NMR ($CDCl_3$, 400 MHz): δ=8.34-7.95 (m, 4H), 7.25-6.77 (m, 10H), 6.54-6.19 (m, 1H), 3.79-3.66 (m, 1.5H), 2.91-2.73 (m, 1.5H), 1.90-1.58 (m, 1.5H), 1.34-1.00 (m, 4.5; H). Elemental Analysis for $(C_{64}H_{48}N_4O_9)_n$: Calcd. C, 75.57; H, 4.76; N, 5.51. Found: C, 69.79; H, 4.52; N, 5.15.

Step 2c—Synthesis of Polymer 5: A round-bottom flask was charged with Polymer 4 from Step 2b (435 mg, 0.87 mmol) and DCM (8 ml). To this solution, a solution of mCPBA (217 mg, 0.89 mmol) in DCM (2 ml) was added dropwise with stirring. After stirring for 6 h, the mixture was then precipitated into MeOH. After filtration and drying under vacuum at room temperature, a white solid was obtained (270 mg, yield 60%). GPC (THF, rt) analysis showed Mn=22.0 kDa with d=3.90. $^1$H NMR ($CDCl_3$, 400 MHz): δ=8.11 (d, J=8.5 Hz, 4H), 7.15-6.82 (m, 10H), 3.73 (s, 2H), 2.90-2.75 (m, 2H), 1.25 (d, J=4.8 Hz, 6H). Elemental Analysis for $(C_{32}H_{24}N_2O_6)_n$: Calcd. C, 72.17; H, 4.54; N, 5.26. Found: C, 71.72; H, 4.67; N, 5.29.

Example 2B

Catalytic Synthesis of Polymer 3

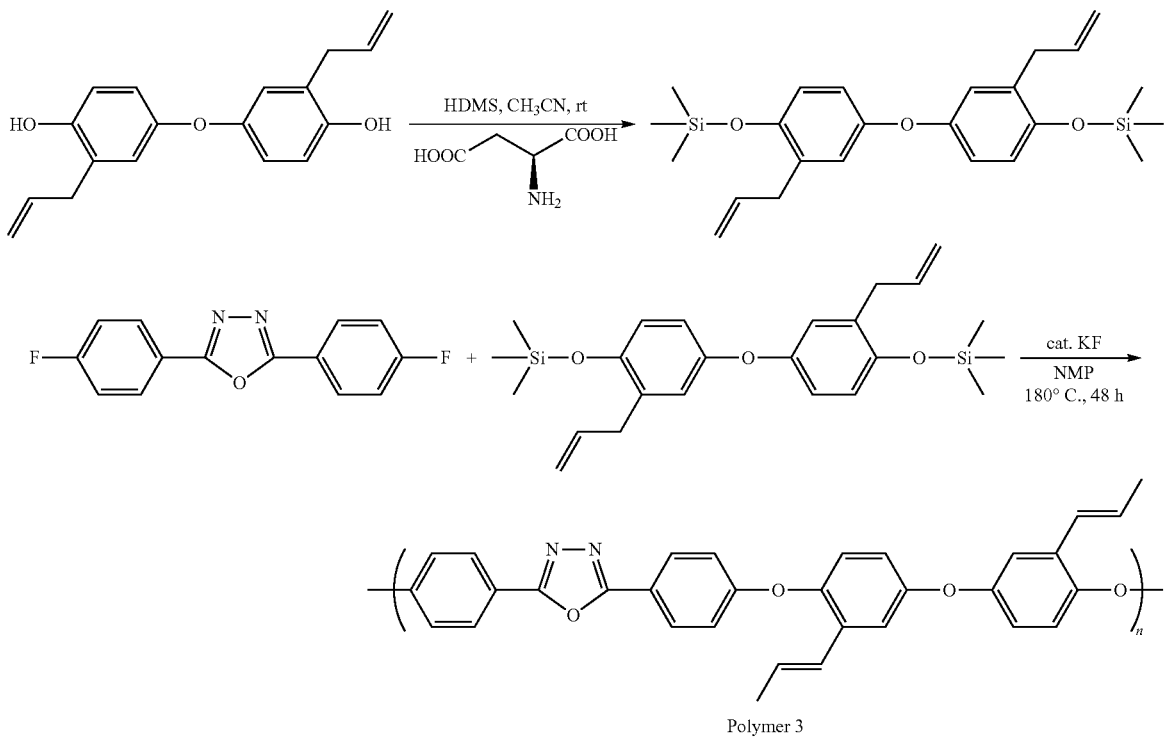

Polymer 3

Step 1—Synthesis of 4,4'-bis(trimethylsilyloxy)-3,3'-diallyl-diphenylether: 4,4'-bis(hydroxy)-3,3'-diallyl-diphenylether (5.00 g, 17.7 mmol, see Example 2A) was mixed with L-aspartic acid (180 mg, 1.4 mmol) and acetonitrile (CH$_3$CN, 25 ml). To the mixture at room temperature, hexamethyldisilazane (HDMS, 4.58 g, 5.9 ml, 28.4 mmol) was added. After stirring for 1 h, water (100 ml) was added to the reaction mixture and DCM (100 ml) was used for extraction. The separated organic phase was dried over Na$_2$SO$_4$, filtered and concentrated to give a pale yellow oil (7.43 g, yield 98%) which was used directly in the next step for polymerization. $^1$H NMR (CDCl$_3$, 500 MHz): δ=6.81 (d, J=2.5 Hz, 2H), 6.75-6.65 (m, 4H), 5.98-5.84 (m, 2H), 5.09-5.00 (m, 4H), 3.30 (d, J=6.6 Hz, 4H), 0.27 (s, 18H).

Step 2—Catalytic synthesis of Polymer 3: A round-bottom flask equipped with a condenser was charged with 2,5-bis(4-fluorophenyl)1,3,4-oxadiazole (4.492 g, 17.4 mmol), 4,4'-bis(trimethylsilyloxy)-3,3'-diallyl-diphenylether from Step 1 (7.423 g, 17.4 mmol), KF (101 mg, 1.74 mmol) and NMP (88.6 ml). The reaction mixture was stirred at 180° C. for 48 hours and then heated to reflux for 6 hours more. After cooling, the mixture was precipitated into a mixture of 350 ml of MeOH and 70 ml of water. After filtration, the solid was re-dissolved into CHCl$_3$ (150 ml) and precipitated into a mixture of 350 ml of MeOH and 2 ml of a 1M aqueous solution of HCl. After filtration, the solid was re-dissolved into CHCl$_3$ (150 ml), filtered and precipitated into a mixture of 350 ml of MeOH and 2 ml of a 1M aqueous solution of HCl. After drying at room temperature under vacuum, a pale tan solid was obtained (8.5 g, quantitative). GPC (THF, rt) analysis showed Mn=21.1 kDa with d=2.69.

$^1$H NMR (CDCl$_3$, 400 MHz): δ=8.19-8.01 (m, 4H), 7.19-6.87 (m, 10H), 6.56-6.19 (m, 4H), 1.88-1.70 (m, 6H). Elemental Analysis for (C$_{32}$H$_{24}$N$_2$O$_4$)$_n$: Calcd. C, 76.79; H, 4.83; N, 5.60. Found: C, 75.74; H, 4.76; N, 5.72.

Example 3

Synthesis of Polymers 6 and 7

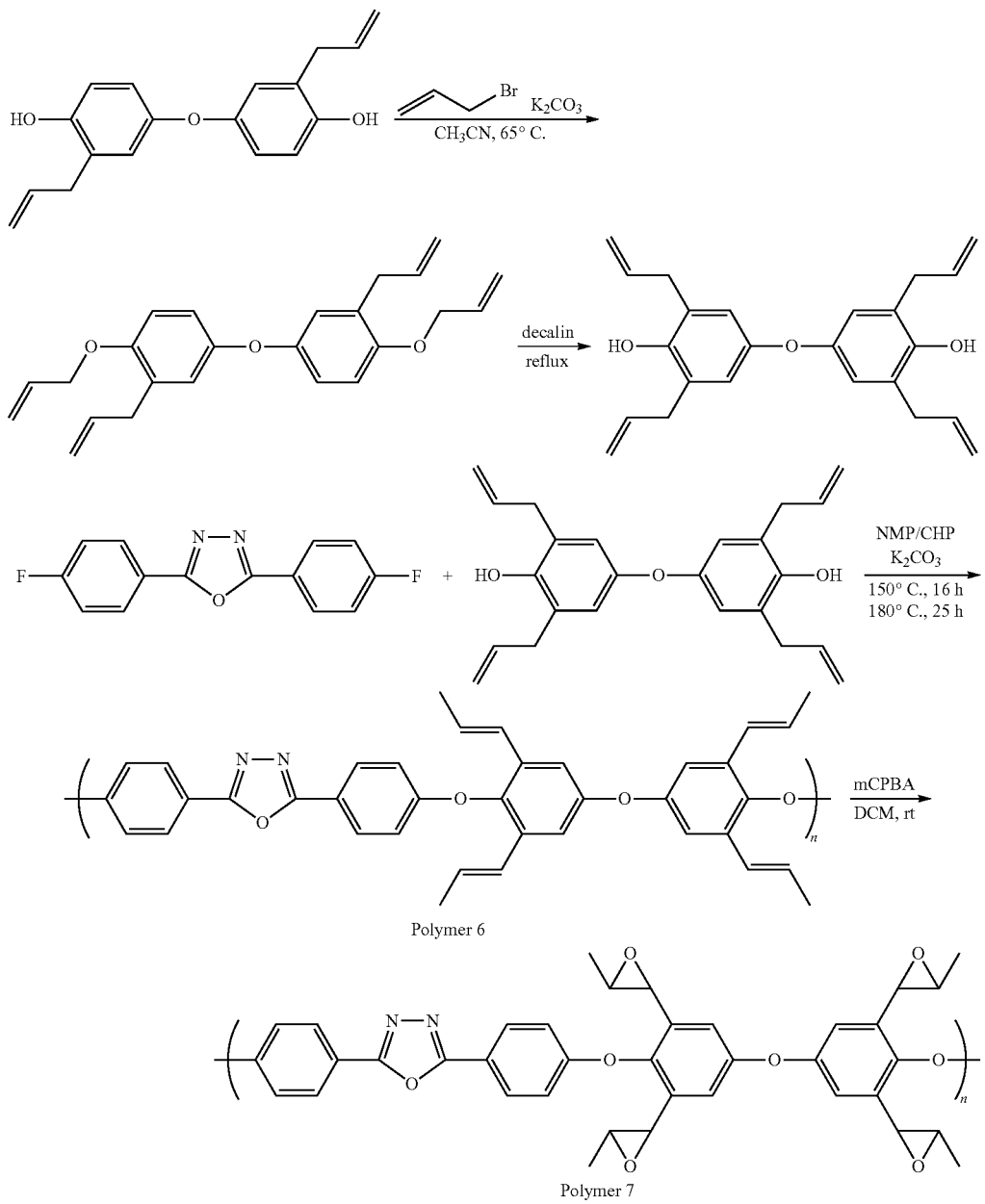

Polymer 6

Polymer 7

Step 1a—Synthesis of 4,4'-bis(allyloxy)-3,3'-diallyl-diphenylether: A round-bottom flask was charged with 4,4'-bis(hydroxy)-3,3'-diallyl-diphenylether (4.6 g, 16.3 mmol), $K_2CO_3$ (5.25 g, 38.0 mmol) and anhydrous acetonitrile (16 ml) under nitrogen and the mixture was heated to 65° C. with vigorous stirring. Allyl bromide (3.42 ml, 39.5 mmol) was added dropwise into the mixture and the reaction was kept at 65° C. for 18 h. After cooling, the mixture was filtered and concentrated to give a yellow oil which was used directly for the next step.

Step 1b—Synthesis of 4,4'-bis(hydroxy)-3,5,3',5'-tetraallyl-diphenylether: The crude 4,4'-bis(allyloxy)-3,3'-diallyl-diphenylether from Step 1a (4.6 g, 16.3 mmol) was mixed with decalin (100 ml) and heated to reflux under nitrogen for 23 hours. After cooling, MeOH (50 ml×2) was added to extract the target compound. After concentration, the crude product was dry loaded to a column for purification. After gradual change of the eluent from hexane to hexane:AcOEt 20:1, the crude was purified to give a pale yellow oil (1.98 g, yield 43% for two steps). $^1$H NMR ($CDCl_3$, 400 MHz): δ=6.67 (s, 4H), 6.06-5.89 (m, 4H), 5.17 (d, J=4.4 Hz, 4H), 5.13 (s, 4H), 4.92 (s, 2H), 3.37 (d, J=6.3 Hz, 8H).

Step 2a—Synthesis of Polymer 6: A round-bottom flask equipped with a Dean-Stark trap and a condenser was charged with 2,5-bis(4-fluorophenyl)1,3,4-oxadiazole (1.317 g, 5.10 mmol), 4,4'-bis(hydroxy)-3,5,3',5'-tetraallyl-diphenylether from Step 1b (1.849 g, 5.10 mmol), $K_2CO_3$ (1.25 g, 9.08 mmol), NMP (13 ml) and CHP (3 ml). The reaction mixture was stirred at 150° C. for 16 hours and then at 180° C. for 25 hours more. After dilution with 1-methyl-2-pyrrolidone (7 ml), the mixture was filtered while hot and the filtrate was precipitated into 140 ml MeOH. After filtration, the solid was dissolved into DCM (50 ml) and precipitated into MeOH (150 ml). Then the solid was boiled in 70 ml water for 10 min with vigorous stirring and filtered while hot. After washing with MeOH, the solid was dried under vacuum at 80° C. overnight. Finally, a light tan solid was obtained (2.1 g, yield 71%). GPC (THF, rt) analysis showed Mn=12.3 kDa with d=8.37. $^1$H NMR ($CDCl_3$, 400 MHz): δ=8.26-7.85 (m, 4H), 7.25-6.78 (m, 8H), 6.56-5.97 (m, 8H), 1.78 (d, J=6.1 Hz, 12H). Elemental Analysis for $(C_{38}H_{32}N_2O_4)_n$: Calcd. C, 78.60; H, 5.55; N, 4.82. Found: C, 77.47; H, 5.56; N, 4.91.

Step 2b—Synthesis of Polymer 7: A round-bottom flask was charged with Polymer 6 from Step 2a (400 mg, 0.69 mmol) and DCM (8 ml). To this solution, a solution of mCPBA (680 mg, 2.76 mmol) in DCM (5.5 ml) was added dropwise with stirring. After stirring for 6 h, the mixture was then precipitated into MeOH. After filtration and drying under vacuum at room temperature, a white solid was obtained (390 mg, yield 88%). $^1$H NMR ($CDCl_3$, 400 MHz): δ=8.20-7.85 (m, 4H), 7.24-6.60 (m, 8H), 4.13-3.47 (m, 4H), 3.24-2.60 (m, 4H), 1.42-0.82 (m, 12H). Elemental Analysis for $(C_{38}H_{32}N_2O_8)_n$: Calcd. C, 70.80; H, 5.00; N, 4.35. Found: C, 69.29; H, 4.96; N, 4.12.

Example 4

Synthesis of Polymers 8 and 9

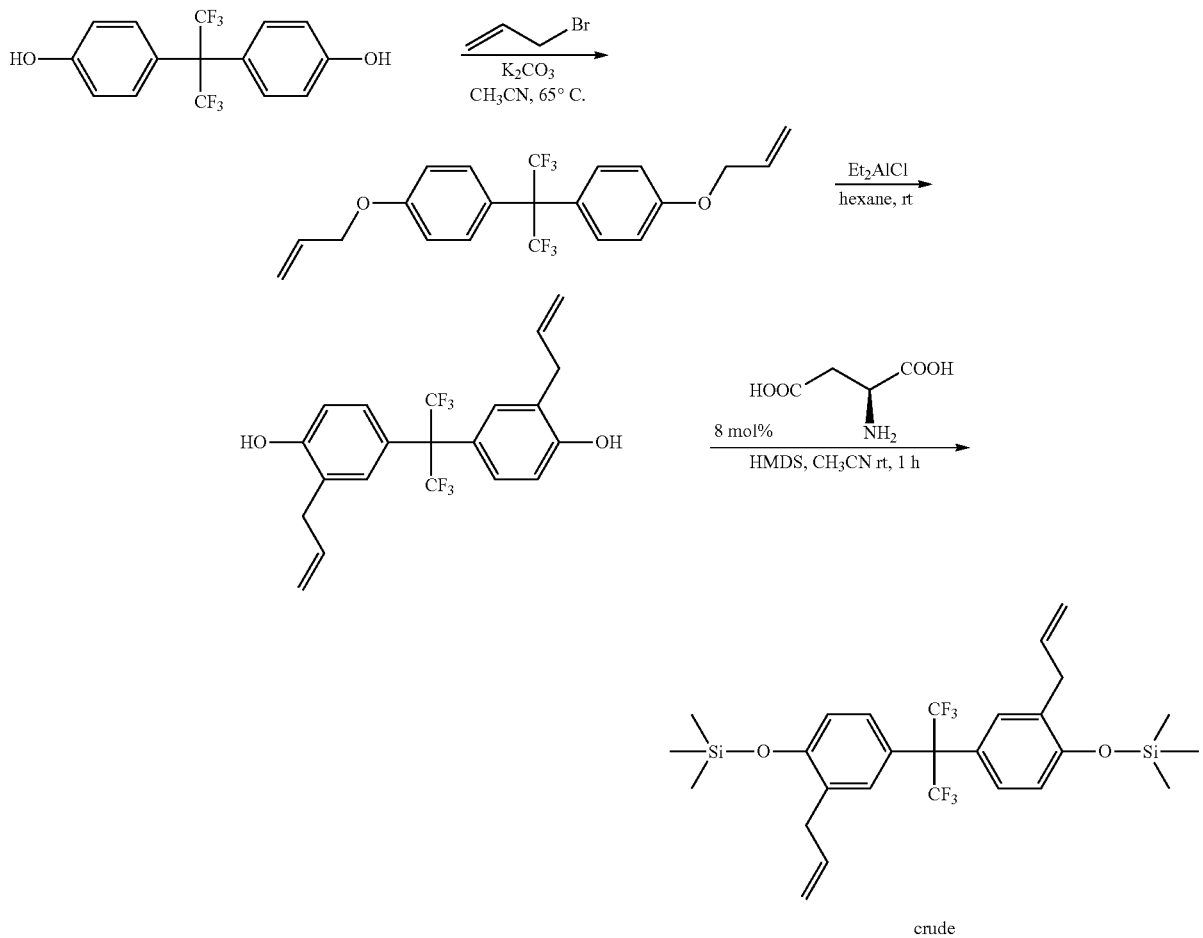

crude

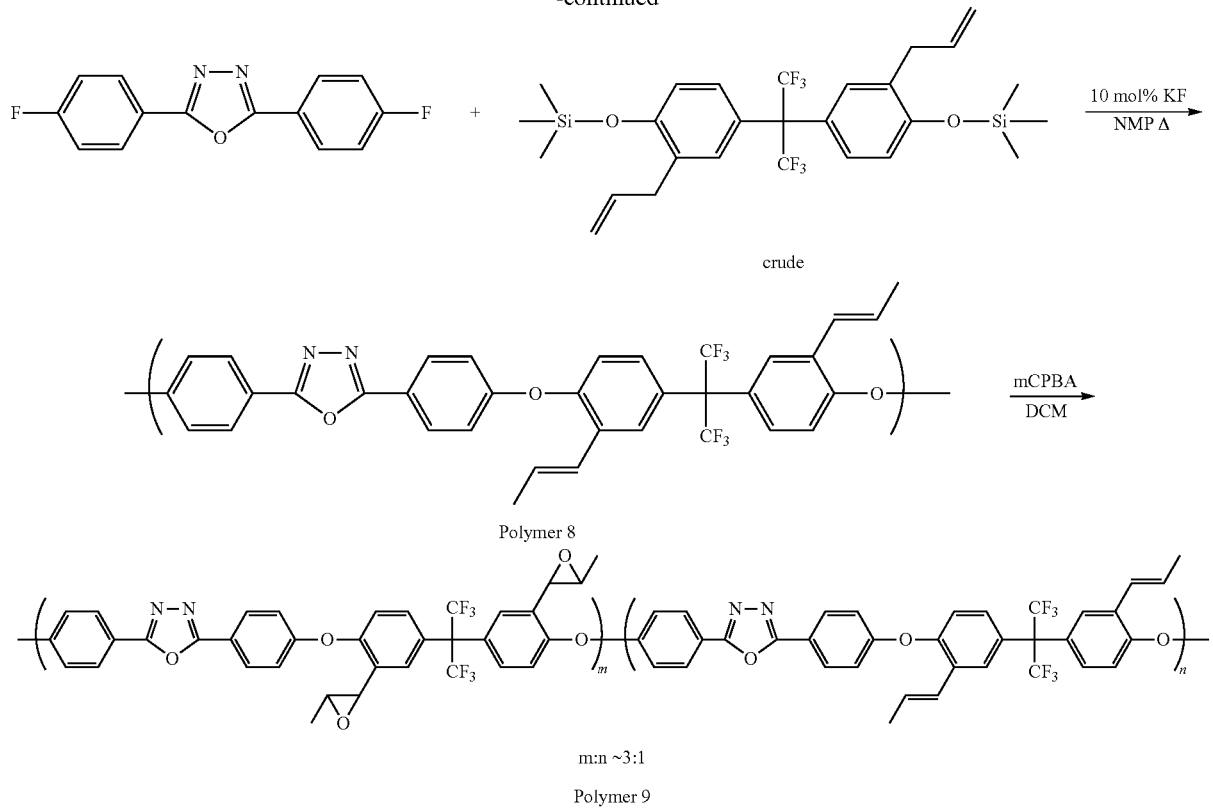

Step 1a—Synthesis of 2,2-bis(4-allyloxyphenyl)hexafluoropropane: A round-bottom flask was charged with 2,2-bis(4-hydroxyphenyl)hexafluoropropane (20 g, 59.48 mmol), $K_2CO_3$ (18.88 g, 136.8 mmol) and anhydrous acetonitrile (58 ml) under nitrogen and the mixture was heated to 65° C. with vigorous stirring. Allyl bromide (11.98 ml, 142 mmol) was added dropwise into the mixture and the reaction was kept at 65° C. for 18 h. After cooling, the mixture was filtered and concentrated to give a brown oil which was used directly for the next step.

Step 1b—Synthesis of 2,2-bis(3-allyl-4-hydroxyphenyl) hexafluoropropane: To 2,2-bis(4-allyloxyphenyl)hexafluoropropane from Step 1a (3.0 g, 7.2 mmol) under nitrogen was dropwise added diethylaluminum chloride (1.0M in hexane) (15.12 ml, 15.12 mmol). After completion of the addition, 1M HCl was added dropwise to quench the reaction under cooling bath. After extraction with DCM (30 ml×2) and washing with brine (30 ml), the organic phase was collected and dried under $Na_2SO_4$. After filtration and concentration, the crude was redissolved in DCM (40 ml), filtered and concentrated to give a clear oil (2.55 g, yield 85%). $^1$H NMR (CDCl$_3$, 500 MHz): δ=7.17 (d, J=8.0 Hz, 2H), 7.12 (s, 2H), 6.80 (d, J=8.5 Hz, 2H), 5.98 (m, 2H), 5.23-5.08 (m, 6H), 3.39 (d, J=6.0 Hz, 4H).

Step 1c—Synthesis of 2,2-bis(3-allyl-4-trimethylsilyloxyphenyl)hexafluoropropane: 2,2-bis(3-allyl-4-hydroxyphenyl)hexafluoropropane from step 1b (2.44 g, 5.86 mmol) was mixed with L-aspartic acid (60 mg, 0.45 mmol) and acetonitrile (CH$_3$CN, 8.2 ml). To the mixture at room temperature, hexamethyldisilazane (HDMS, 1.52 g, 1.96 ml, 9.42 mmol) was added. After stirring for 25 minutes, water (33 ml) was added to the reaction mixture and DCM (33 ml) was used for extraction. The separated organic phase was dried over $Na_2SO_4$, filtered and concentrated to give a pale brown oil (2.74 g, yield 83%) which was used directly in the next step for polymerization. $^1$H NMR (CDCl$_3$, 500 MHz): δ=7.14 (d, J=9.0 Hz, 2H), 7.10 (s, 2H), 6.75 (d, J=8.5 Hz, 2H), 5.87 (m, 2H), 5.04-4.91 (m, 4H), 3.23 (d, J=6.3 Hz, 4H), 0.30 (s, 18H).

Step 2a—Synthesis of Polymer 8:

A round-bottom flask equipped with a condenser was charged with 2,5-bis(4-fluorophenyl)1,3,4-oxadiazole (519.2 mg, 2.01 mmol), 2,2-bis(3-allyl-4-trimethylsilyloxyphenyl) hexafluoropropane from Step 1 (1.1275 g, 2.01 mmol), KF (13.4 mg, 0.23 mmol) and NMP (12 ml). The reaction mixture was stirred at 210° C. for 20 hours. After cooling, the mixture was precipitated into a mixture of 34 ml of MeOH and 5 ml of water. After filtration, the solid was re-dissolved into CHCl$_3$ (15 ml) and precipitated into a mixture of 34 ml of MeOH and 0.35 ml of a 1M aqueous solution of HCl. After filtration, the solid was re-dissolved into CHCl$_3$ (20 ml), filtered and precipitated into a mixture of 60 ml of MeOH and 0.35 ml of a 1M aqueous solution of HCl. After drying at room temperature under vacuum, a pale tan solid was obtained (1.03 g, yield 80.7%). GPC (THF, rt) analysis showed Mn=22.2 kDa with d=2.66. $^1$H NMR (CDCl$_3$, 400 MHz): δ=8.11 (d, J=8.4 Hz, 4H), 7.72-6.85 (m, 10H), 6.66-5.77 (m, 4H), 1.94-1.66 (m, 6H).

Step 2b—Synthesis of Polymer 9: A round-bottom flask was charged with Polymer 8 from Step 2a (913.5 mg, 1.44 mmol) and DCM (16 ml). To this solution, mCPBA (497 mg, 2.15 mmol) was added portionwise. After stirring for 2 h, the mixture was then precipitated into MeOH. After filtration and drying under vacuum at room temperature, a white solid was obtained (861 mg, yield 90.8%). $^1$H NMR (CDCl$_3$, 400 MHz): δ=8.24-7.97 (m, 4H), 7.68-6.85 (m, 10H), 6.64-5.75 (m, 1H), 4.22-2.69 (m, 3H), 1.91-0.96 (m, 6H).

Example 5

Synthesis of Polymers 10 and 11

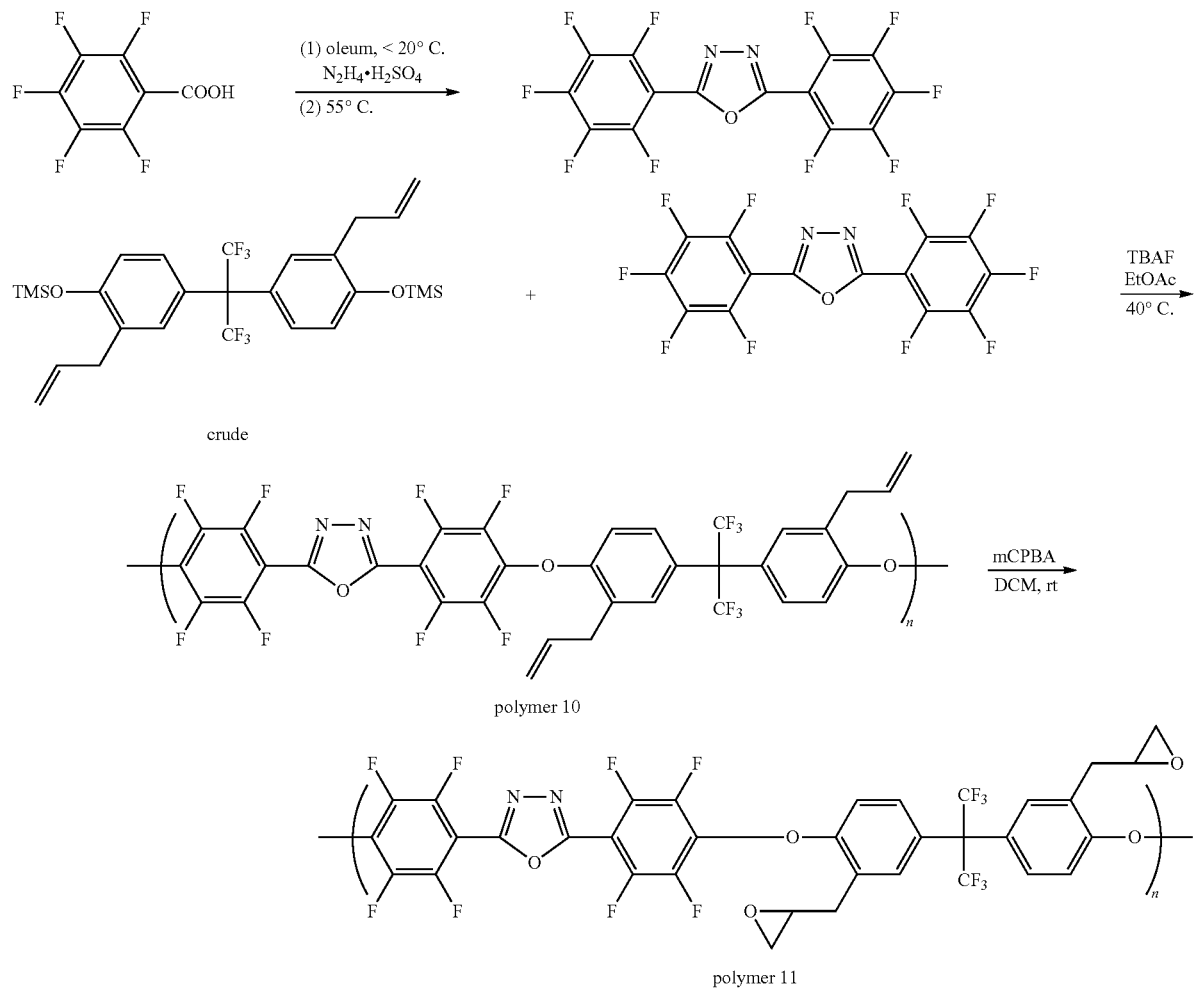

Step 1. Synthesis of 2,5-bis(2,3,4,5,6-pentafluorophenyl)-1,3,4-oxadiazole: A round bottom flask equipped with a mechanical stirrer, a drying tube and a condenser was charged with hydrazine sulfate (15.34 g, 118 mmol) and oleum (86 ml). To this solution with stirring, 2,3,4,5,6-pentafluorobenzoic acid (50.00 g, 236 mmol) was added in portions at 0° C. After stirring for 1 h until a homogeneous solution was obtained, the mixture was heated to 55° C. and stirred for overnight. The mixture was precipitated into ice water (2 L), filtered, washed with 5% $Na_2CO_3$ until neutral, and dried under high vacuum for 3 h. After recrystallizing in EtOH (900 ml), a white solid was obtained (20.88 g, yield 44%). $^{19}F$ NMR ($CDCl_3$, 400 MHz): δ=(−134.74)-(−134.90) (m, 2F), (−145.57)-(−145.74) (m, 1F), (−158.85)-(−159.07) (m, 2F).

Step 2a. Synthesis of Polymer 10: A round bottom flask was charged with 2,2-bis(3-allyl-4-trimethylsilyloxyphenyl) hexafluoropropane (6.97 g, 12.5 mmol), 2,5-bis(2,3,4,5,6-pentafluorophenyl)-1,3,4-oxadiazole (5.00 g, 12.5 mmol), and ethyl acetate (70 ml). After stirring for 2 min, tetrabutylammonium fluoride solution 1.0 M in THF (1.3 ml, 1.3 mmol) was added into the suspension. The clear reaction mixture was stirred at 40° C. for 24-48 hours until the sample showed the expected molecular weight of ~20 k. The mixture was then precipitated into 560 ml of MeOH. After filtration, the solid was dried under vacuum at 80° C. for 2 h, and re-dissolved by ethyl acetate (70 ml). The solution was filtered and precipitated into 560 ml of MeOH. After filtration, the solid was dried under high vacuum for 8 h. Finally, a white solid was obtained (8.5 g, yield 87.3%). GPC (THF, rt) analysis showed Mn=21.7 kDa with PDI=3.15. $^1H$ NMR ($CDCl_3$, 400 MHz): δ=7.28-7.19 (m, 4H), 6.74-6.65 (m, 2H), 6.00-5.86 (m, 2H), 5.12-4.98 (m, 4H), 3.58-3.48 (m, 4H).

Step 2b. Synthesis of Polymer 11: A round bottom flask was charged with polymer 10 from Step 2a (6.55 g, 8.42 mmol) and DCM (100 ml). To this solution with stirring, mCPBA (~70 wt %, 3.90 g, 16.8 mmol) was added in portions. After stirring until the sample showed complete epoxidation (typically 2-3 days), the mixture was filtered and then precipitated into MeOH (630 ml). After filtration and drying under vacuum at room temperature, a white solid was obtained (5.95 g, yield 87.3%). GPC (THF, rt) analysis showed Mn=27.0 kDa with PDI=2.95. $^1H$ NMR ($CDCl_3$, 400 MHz): δ=7.38-7.23 (m, 4H), 6.76-6.70 (m, 2H), 3.25-3.18 (m, 2H), 3.15-2.98 (m, 4H), 2.81-2.74 (m, 2H), 2.54-2.48 (m, 2H).

Example 6

Thermal Stability

Dynamic thermogravimetric analysis (TGA) scans were run by ramping up to 400° C. with a 5° C./min rate in $N_2$ (90 ml/min). The present polymers showed excellent thermal stability with an onset decomposition temperature ($T_d$, onset) under nitrogen of >320° C. (Table 1).

TABLE 1

| Polymer | $T_d$, onset (° C.) | $T_d$, 5% weight loss (° C.) |
|---|---|---|
| 1 | 362 | >400 (3.1% weight loss at 400° C.) |
| 2 | 325 | 357 |
| 3 | 374 | >400 (4.7% weight loss at 400° C.) |
| 4 | 343 | 376 |
| 5 | 326 | 358 |
| 6 | 362 | >400 (2.8% weight loss at 400° C.) |
| 7 | 320 | 342 |
| 8 | 352 | >400 (2.7% weight loss at 400° C.) |
| 9 | 346 | 370 |
| 10 | 370 | >400 (4.6% weight loss at 400° C.) |
| 11 | 330 | 360 |

Example 7

Formulation and UV Treatment

Figure 3:
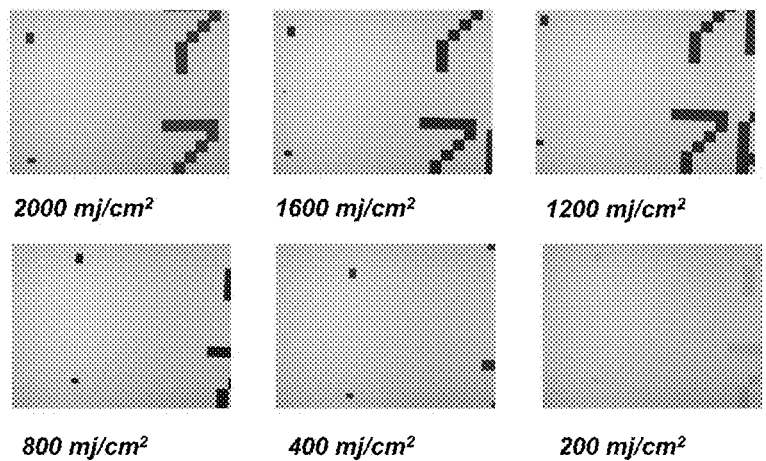
FIG. 3 shows images of polymeric films according to the present teachings that have been photo-patterned and cured at the curing dosages indicated.
Figure 4:
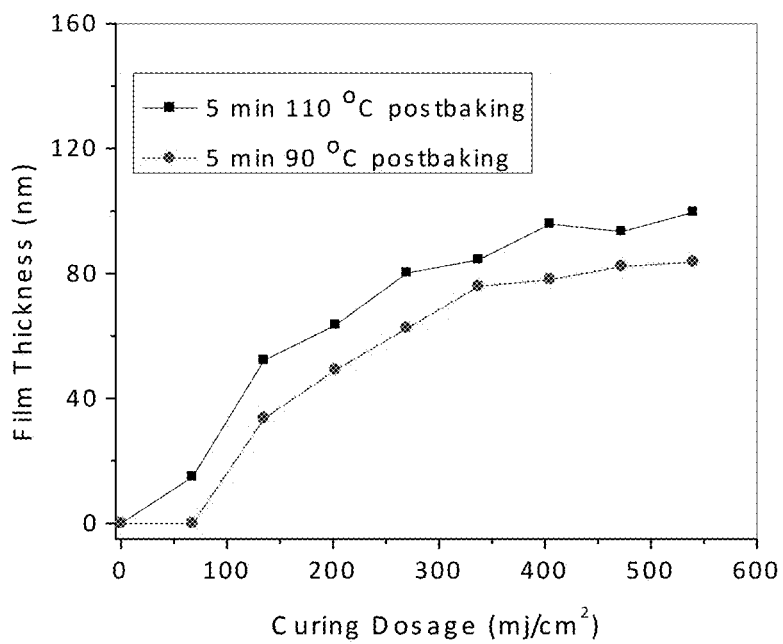
FIG. 4 shows the changes in film thickness against curing dosage at two different post-UV baking temperatures prior to developing.

A formulation containing 2.5 wt. % of Polymer 4 and 0.13 wt. % of Irgacure® PAG 290 (tris[4-(4-acetylphenyl)sulfanylphenyl]sulfonium tetrakis(pentafluorophenyl)borate, a sulfonium-based cationic photoinitiator commercially available from BASF) in cyclopentanone was spin-coated at 1000 rpm onto silicon substrates following a soft baking step at ~110° C. for 1 minute on a hot plate under ambient conditions to give thin films having a thickness of about 137 nm. The films were then photo-cured with UV I-line (λ=365 nm) at different curing dosages using a shadow mask, and developed using cyclopentanone as the stripping solvent. No post-UV baking step was used. The mask provided the desired pattern for the photolithography process. The patterned images obtained after I-line photolithography and stripping with cyclopentanone are shown in FIG. 3. Film thicknesses after the developing step are reported in Table 2. Post-UV baking conditions also were investigated. Specifically, after I-line photolithography, some film samples were baked at either 90° C. or 110° C. for 5 minutes. FIG. 4 shows the changes in film thickness against curing dosage at two different post-UV baking temperatures prior to developing with cyclopentanone.

TABLE 2

| Dosage (mJ/cm$^2$) | Final thickness after developing (nm) | Change in film thickness |
|---|---|---|
| 200 | 30 | −78.1% |
| 400 | 68 | −50.4% |
| 800 | 85 | −38.2% |
| 1200 | 96 | −30.0% |
| 1600 | 98 | −28.5% |
| 2000 | 110 | −19.7% |

Example 8

Fabrication of MIS and Leakage Properties

Figure 5:
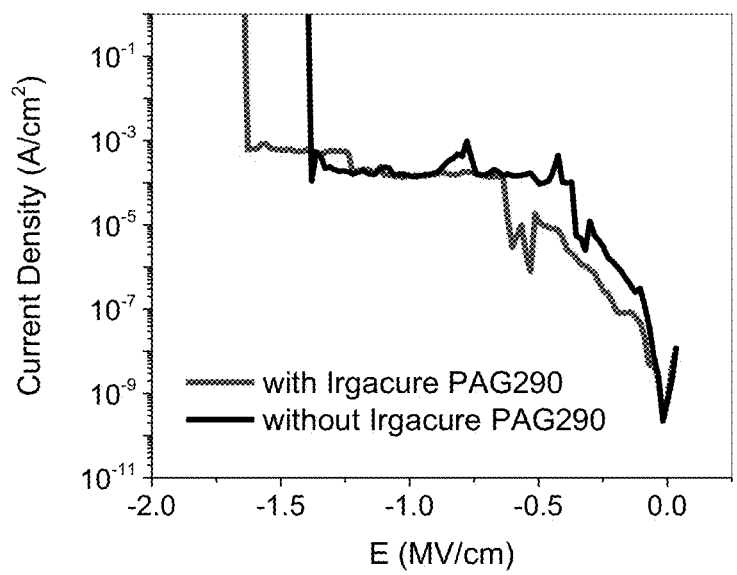
FIG. 5 shows plots of leakage current density (J) (I/area of Au pads) versus electric field (E) (V/thickness of dielectric layer) for representative polymeric films (prepared with or without a photoacid generator) according to the present teachings.

Metal-insulator-semiconductor (MIS) capacitor structures were fabricated using heavily doped n-type Si (MEMC Electronic Materials, Antimony/n-doped) as conductive substrate, on top of which formulations containing Polymer 4 (either with or without Irgacure® PAG 290) in cyclopentanone was spin-coated and used as the insulator. The polymer films were soft-baked at 110° C. on a hot plate for 1 minute, UV-I-line photo-cured with a dosage of 2 J/cm$^2$, then hard baked at 300° C. in a nitrogen flow oven for 30 minutes. The top metal electrodes were vacuum-evaporated through a stencil mask onto the insulator layer at a pressure of <6×10$^{-6}$ torr. The mask provided several different rectangular and square shaped gold pads of varying areas (area 1=100 μm×100 μm; area 2=200 μm×200 μm; area 3=500 μm×1000 μm; area 4=1000 μm×1000 μm; area 5=1.5 mm×1.5 mm area 6=1 cm×2 cm). Unless otherwise specified, leakage currents in this and the following examples were determined using capacitor structures with gold pads having a feature size of 200 μm×200 μm and k-values were calculated using the capacitances as measured on gold pads both 1.5 mm×1.5 mm and 200 μm×200 μm in dimensions. The current (I)-voltage (V) responses of the MIS structures were measured using a high sensitivity Keithley 4200 Sub-Femtoamp Source Meter with Remote Preamplifier, operated by a local Keithley Interactive Test Environment (KITE) program and general purpose interface bus communication. All of the measurements were performed in ambient conditions (relative humidity=10-80%). To minimize electrical noise during the I-V scan, a triaxial cabling and probing system (Signatone H100 Series, Gilroy, Calif.) was employed to probe the MIS structures. FIG. 5 shows plots of leakage current density (J) (I/area of Au pads) versus electric field (E) (V/thickness of dielectric layer). Dielectric properties, i.e., leakage current density, capacitance ($C_i$), and breakdown voltage (BV), of the polymer films, as well as film thickness are summarized in Table 3. The J-E characteristics of capacitors based on the dielectric materials of the present teachings appear to be independent of the area of the gold pads.

TABLE 3

| Dielectric/Insulating Layer | Leakage current density (A/cm$^2$) at 1 MV/cm | Leakage current density (A/cm$^2$) at 1.5 MV/cm | $C_i$ (nF/cm$^2$) | Thickness (nm) | Dielectric constant |
|---|---|---|---|---|---|
| Polymer 4 with Irgacure ® PAG 290 | 1.5 × 10$^{-4}$ | 1.5 × 10$^{-3}$ | 6.4 | 590 | 4.3 |
| Polymer 4 without Irgacure ® PAG 290 | 1.5 × 10$^{-4}$ | Breakdown | 6.3 | 570 | 4.0 |

Example 9

Fabrication of ES-IGZO-TFT and Device Properties

A full photolithography process that is compatible with standard fabrication process used by the microelectronics industry was utilized to fabricate Indium Gallium Zinc Oxide (IGZO) thin film transistors with an etch stop layer composed of Polymer 4 in a bottom gate staggered structure. To fabricate the transistor, highly doped n-type silicon wafers (WRS Materials, each having a 300 nm-thick thermally grown $SiO_2$ top layer) were adopted as substrates and cleaned by sonication in organic solvents prior to use. The silicon wafer has a resistivity less than 0.015 ohm·cm and also functions as the gate electrode for the transistor, while the $SiO_2$ layer serves as gate insulator providing a sheet capacitance around 10 $nF/cm^2$. A 20~500 nm thick IGZO layer was then deposited using magnetron-sputtering equipment. The base pressure was below $10^{-5}$ torr and a mixture of argon and oxygen was used as the carrier gas. An annealing process at a temperature below 300° C. was applied to improve the quality of IGZO, followed by a standard photolithography process to pattern the IGZO film. Specifically, a commercial positive photoresist AZ® 650 (Clariant AG) was spin-coated on top of the IGZO film and exposed through a dark field photomask under GHI line UV illumination at an intensity of approximately 20 $mJ/cm^2$. The substrates were then baked on a hot plate at 110° C. for 3 minutes, followed by soaking the substrates in tetramethylammonium hydroxide (TMAH, 2.38%) in DI water for ~1 minute to develop the photoresist patterns. After rinsing with DI water, oxalic acid (2.38% in DI water) was casted onto the substrates and allowed to sit for ~3-5 minutes to etch away the unprotected IGZO completely. The photolithography process for patterning the IGZO was completed by an additional flood exposure of ~50 $mJ/cm^2$ and developing it in the TMAH solution to strip away the remaining photoresist. A formulation of Polymer 4 (Example 6) was then spin-coated on top, followed by UV exposure through a bright-field photomask and developing it in cyclopentanone solution as explained in Example 6. An additional annealing step from 120° C. to 350° C. in an oven was applied to improve the quality of the film. Finally, a layer of Mo was sputtered and patterned through similar photolithography process as described above to pattern IGZO, while a Mo etchant (BASF) was used instead of oxalic acid. The patterned Mo served as source and drain electrodes and defined the channel of the IGZO thin film transistors. The channel lengths were between 10~100 µm, and the channel widths were between 10~100 µm. No annealing step was performed after etching of the Mo layer.

Figure 6:
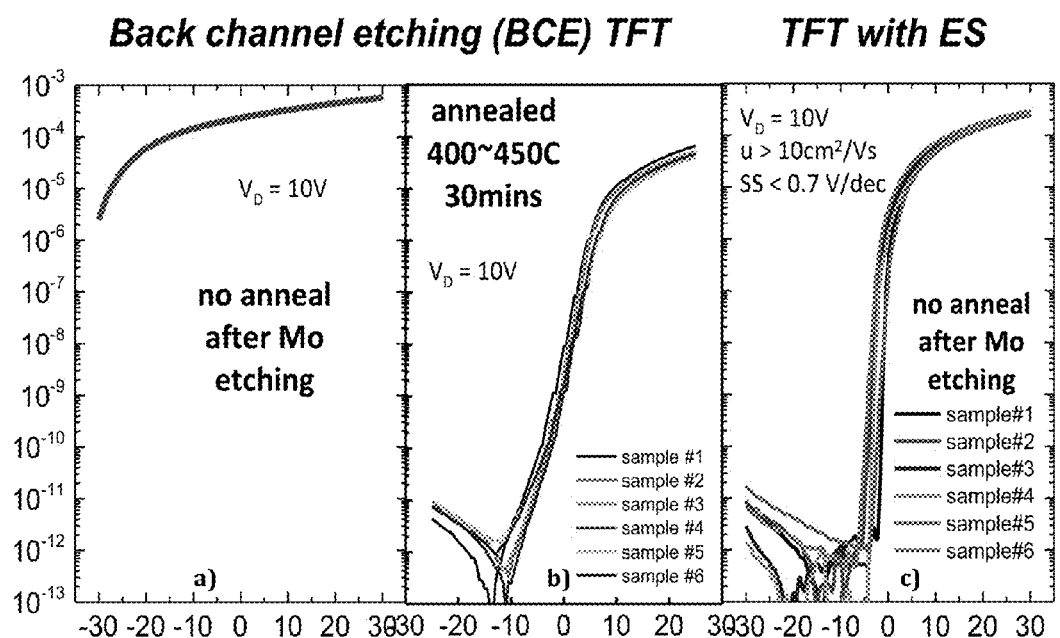
FIG. 6 shows $I_d V_g$ characteristics of a) standard back-channel-etch (BCE) IGZO TFTs without annealing after etching of the source and drain electrodes, b) standard back-channel-etch (BCE) IGZO TFTs with annealing after etching of the source and drain electrodes (sample size=6), and c) etch-stop (ES) IGZO TFTs without annealing after etching of the source and drain electrodes (sample size=6).

The transistors described above were found to perform reasonably well, with mobility (µ) approximating 10 $cm^2/Vs$, an $I_{on}:I_{off}$ ratio up to $10^8$, subthreshold swing smaller than 0.7 V/dec, negligible hysteresis, and low gate leakage currents. The transfer characteristics of a representative ES-IGZO-TFT are illustrated in FIG. 6c. For comparison purposes, IGZO-TFTs following the same fabrication process without employing an etch stop layer (i.e., back-channel-etch type TFT (BCE-TFT)) were made and their transfer characteristics are illustrated in FIGS. 6a and b. It can be seen that without an etch stop layer, the Mo deposition and photolithography process could and did cause damage to the IGZO back-surface, thus deteriorated transistor performance with significantly increased off-current. By performing an additional annealing step after etching of the Mo layer, it was found that the off-current was improved to some degree, but the transistors still showed earlier turn-on and larger subthreshold swing compared to ES-IGZO-TFTs fabricated without performing an additional annealing step post-Mo etching.

Figure 7:
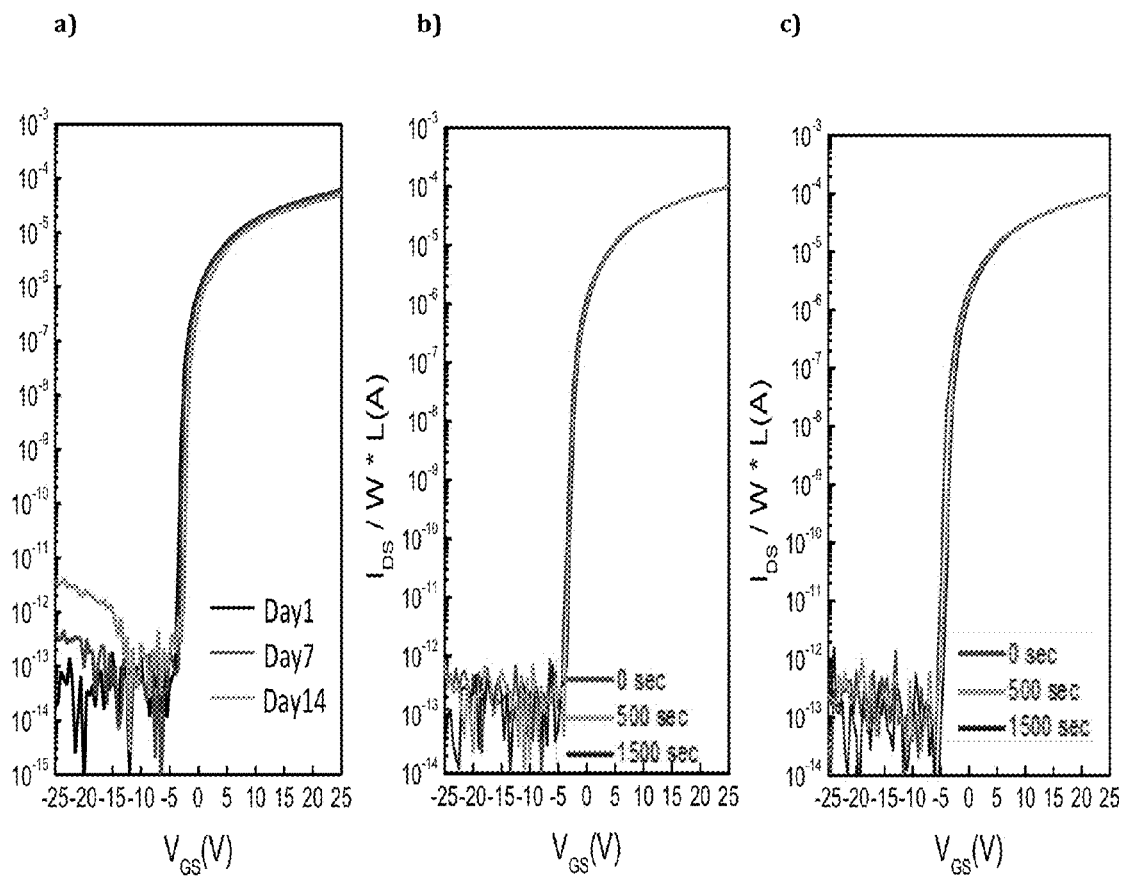
FIG. 7 shows the transfer characteristics of a representative ES IGZO TFT having a passivation layer prepared from a polymer according to the present teachings a) that has been stored for 14 days under 50 RH %, b) when subjected to a positive gate bias stress of 30V for 1500 seconds under 80° C., c) that has been stored for 14 days under 50 RH % when subjected to a positive gate bias stress of 30V for 1500 seconds under 80° C.

FIG. 7 illustrates the performance of a representative ES-IGZO-TFT fabricated as described above, with an organic passivation layer coated on top to enhance its environmental stability. As can be seen, storing the TFT under relative humidity percentage (RH %) of about 50% for 14 days did not significantly affect its transfer characteristics (FIG. 7a). In addition, applying positive gate bias stress of 30V for 1500 seconds under 80° C. (PTBS) did not result in a pronounced shift in turn-on voltage or on-current (FIG. 7b). Similar bias stress performance was observed after the TFT was stored under 50 RH % for 14 days (FIG. 7c). These results indicate that etch stop layers according to the present teachings show good compatibility with both the back surface of the IGZO layer underneath it as well as the organic passivation layer on top of it.

Example 10

IGZO TFT with Polymeric Passivation Layer

Figure 8:
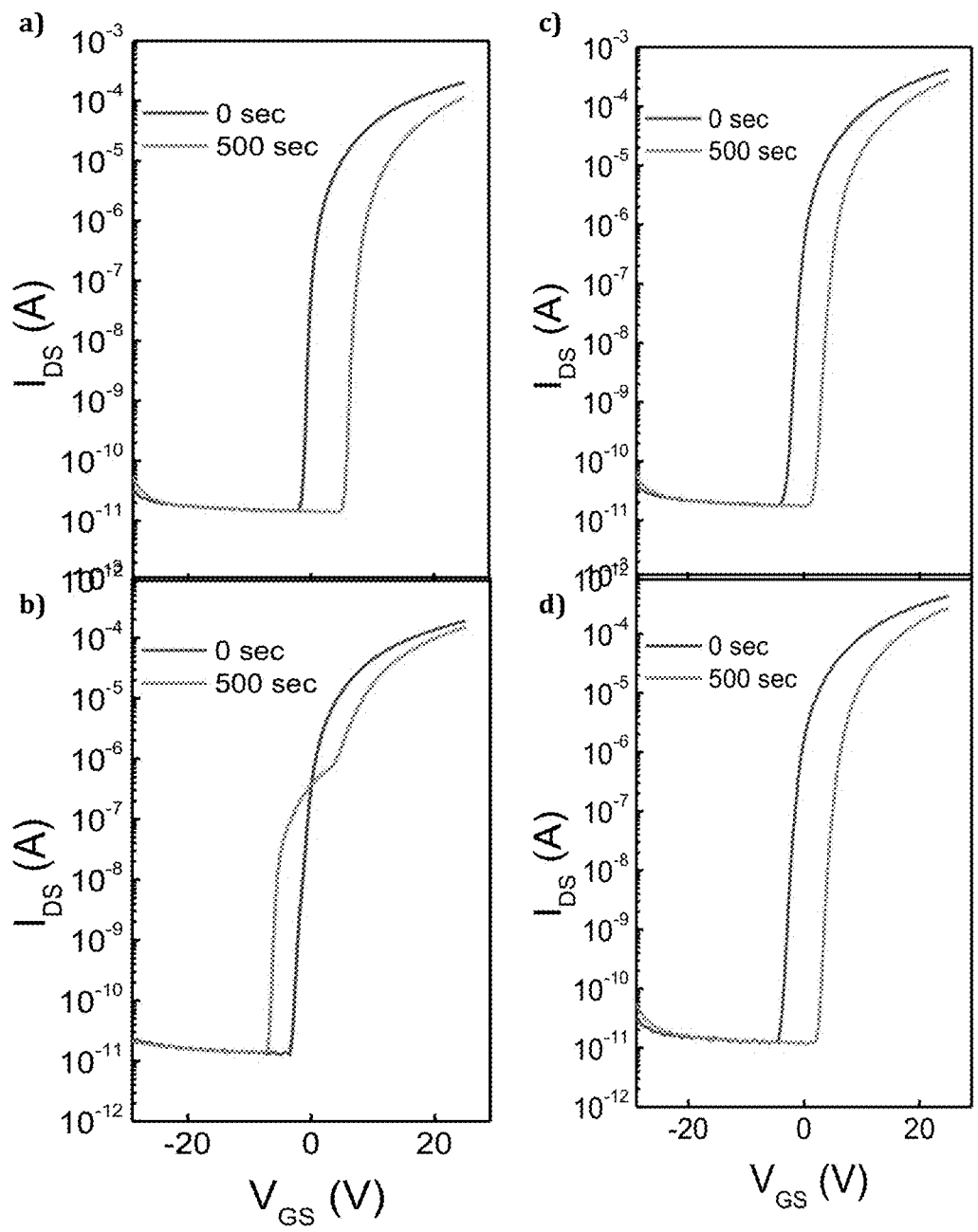
FIG. 8 compares the positive temperature bias stress stability of a) a control BCE IGZO TFT without a passivation layer immediately after fabrication, b) the same control device after having been stored under 95 RH % for 8 days, c) a BCE IGZO TFT with a passivation layer prepared from a polymer according to the present teachings immediately after fabrication, and d) the same device after having been stored under 95 RH % for 8 days.

Polymer 4 was investigated as a passivation layer to protect an IGZO TFT from environmental effect, particularly the influence of water vapor. In order to study this effect, back-channel-etch (BCE) type TFTs with exposed IGZO back-surface were fabricated using standard photolithography process as described in the previous example. A cyclopentanone-based formulation containing 12.2% of Polymer 4 and 0.6% of Irgacure® PAG 290 and a small amount of leveling agent was spin-coated on the BCE TFTs at 1000 rpm, followed by a soft baking step at ~110° C. for 1 minute on a hot plate under ambient conditions to give films of ~2-3 um in thickness. The passivation-coated TFTs were then photo-cured under UV-I-line for a dosage of 4 $J/cm^2$, followed by a baking step at about 250° C. in a nitrogen-flow oven for about 30 minutes. For comparison purposes, control BCE-IGZO-TFTs were made with no passivation, and their electrical properties were measured before and after storage under 95 RH % for 8 days as shown in FIG. 8. As can be seen, the turn-on voltage of the initial BCE-IGZO-TFTs showed positive shift in the range of ~5-8V under +30V gate-to-source bias stress at 80° C. for 500 seconds (PTBS). Such shift is commonly attributed to the IGZO back channel damage during the BCE-TFT fabrication process. The application of the passivation layer did not seem to have enhanced the bias stress shift. Nevertheless, after storage under 95 RH % for 8 days, the transistor without a passivation layer suffered a "hump" under the same PTBS condition, while the transistor with the passivation layer showed a similar degree of turn-on voltage shift compared to the initial condition. The "hump" in IGZO transistor IdVg characteristics is believed to be caused by an additional semiconductive back channel originated from the adsorption and diffusion of water molecules into the IGZO layer. The results indicate that a passivation layer according to the present teachings can block water penetration effectively under the testing conditions described here.

Example 11

Top-Gate IGZO TFT with Polymeric Dielectric Layer

Figure 9:
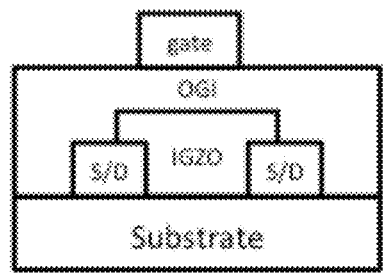
FIG. 9 illustrates the structure of a top-gate bottom-contact IGZO TFT incorporating a polymer according to the present teachings (Polymer 10) as the organic gate insulator (OGI).

Polymer 10 was investigated as the dielectric layer in IGZO TFTs having a bottom-contact, top-gate structure as shown in FIG. 9. Specifically, a composition consisting of Polymer 10

(7 wt %) formulated with a bis-maleimide crosslinker (4 wt %), a type I photo radical generator (0.3 wt %), a coumarin derivative photosensitizer (0.3 wt %), and surfactant (0.1 wt %) in PGMEA was spin-coated at 1200 rpm for 60 s into a ~550 nm film onto different substrates (bare glass, glass prebaked at 450° C., and glass coated with a SiO$_2$ layer deposited by PECVD) on which source-drain electrodes and the IGZO layer have already been formed. The spin-coating step was followed by soft baking at ~110° C. for 1 minute on a hot plate under ambient conditions to dry the film. The dielectric layer was exposed to UV flood exposure for 120 s under a mask then developed with PGMEA to form patterns. The patterned dielectric layer was annealed at 250° C. for 1 h in flowing N$_2$ inside an oven. To complete the device, a gate metal was patterned on top as the gate electrode.

Figure 10:
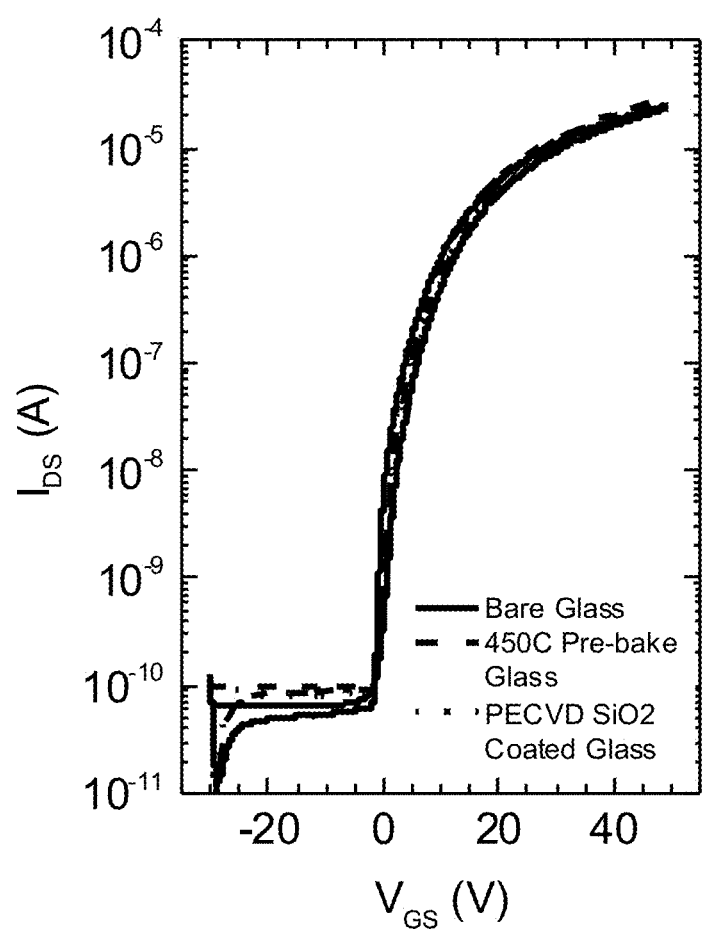
FIG. 10 shows the $I_d V_g$ characteristics of the TFT shown in FIG. 9.

FIG. 10 shows the $I_d V_g$ characteristics of the TFTs. Table 4 below summarizes the average device characteristics. All the devices showed a very low leakage current (~$10^{-10}$ A) and a high mobility (~9 cm$^2$/V-s).

TABLE 4

| μ (cm$^2$/V-s) | $V_{ON}$(V) | SS (V/decade) | On/off |
|---|---|---|---|
| ~9 | −1 | 1.0 | ~$10^5$ |

All publications, patent applications, patents, and other references mentioned herein are incorporated by reference in their entirety. In case of conflict, the present specification, including definitions, controls.

The present teachings can be embodied in other specific forms without departing from the spirit or essential characteristics thereof. The foregoing embodiments are therefore to be considered in all respects illustrative rather than limiting on the present teachings described herein. The scope of the present teachings is thus indicated by the appended claims rather than by the foregoing description, and all changes that come within the meaning and range of equivalency of the claims are intended to be embraced therein.

The invention claimed is:

1. An optical, electronic or optoelectronic device comprising a thin film transistor, the thin film transistor comprising:
   a substrate;
   a metal oxide semiconductor layer;
   source and drain electrodes in contact with the metal oxide semiconductor layer;
   a gate electrode;
   a gate dielectric layer disposed between the metal oxide semiconductor layer and the gate electrode, the gate dielectric layer being in contact with a first surface of the metal oxide semiconductor layer; and
   an organic layer in contact with a second surface of the metal oxide semiconductor layer; wherein at least one of the gate dielectric layer and the organic layer comprises a crosslinked product of a polymer having the formula:

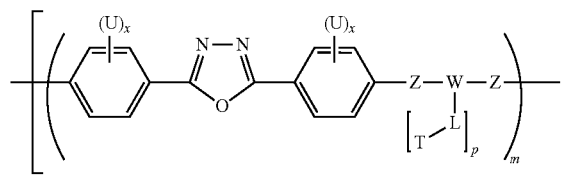

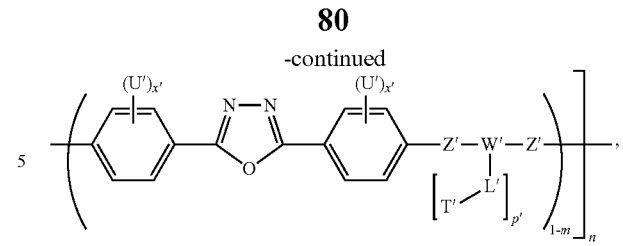

wherein:

U and U', at each occurrence, independently are selected from the group consisting of a halogen, CN, a C$_{1-6}$ alkyl group, and a C$_{1-6}$ haloalkyl group;

W and W' independently are —Ar[—Y—Ar]$_q$—, wherein:
   Ar, at each occurrence, independently is a divalent C$_{6-18}$ aryl group;
   Y, at each occurrence, independently is selected from the group consisting of O, S, S(O)$_2$—, —(CR'R")$_r$—, —C(O)—, and a covalent bond, wherein R' and R", at each occurrence, independently are selected from the group consisting of H, a halogen, CN, a C$_{1-10}$ alkyl group, and a C$_{1-10}$ haloalkyl group; and r is selected from 1, 2, 3, 4, 5, 6, 7, 8, 9 and 10; and
   q is selected from 0, 1, 2, 3, 4, 5, 6, 7, 8, 9 and 10;

Z and Z' independently are selected from the group consisting of —O—, —S—, and —Se—;

L and L', at each occurrence, independently are selected from the group consisting of —O—, —S—, a divalent C$_{1-10}$ alkyl group, a divalent C$_{6-18}$ aryl group, and a covalent bond;

T and T', at each occurrence, independently are Q or R, wherein:
   Q is a crosslinkable group comprising an ethenyl moiety, an ethynyl moiety, a dienyl moiety, an acrylate moiety, a coumarinyl moiety, an epoxy moiety, or a combination thereof; and
   R is selected from the group consisting of H, a halogen, a C$_{1-10}$ alkyl group, a C$_{1-10}$ haloalkyl group, and a C$_{6-10}$ aryl group optionally substituted with 1 to 5 substituents independently selected from the group consisting of a halogen and CN, provided that W comprises at least one -L-T group that is -L-Q;

p is 1, 2, 3, 4, 5, 6, 7 or 8;

p' is 0, 1, 2, 3, 4, 5, 6, 7 or 8;

x and x' independently are 0, 1, 2, 3 or 4;

m is a real number, wherein 0<m≤1; and n is an integer ranging from 10 to 500.

2. The device of claim 1, wherein the metal oxide semiconductor layer comprises indium gallium zinc oxide.

3. The device of claim 1, wherein the organic layer functions as an etch-stop layer or a passivation layer.

4. The device of claim 1, wherein U and U', at each occurrence, independently are selected from the group consisting of F, Cl, CH$_3$, and CF$_3$; and x and x', at each occurrence, independently are 0, 1, 2 or 4.

5. The device of claim 1, wherein the polymer has the formula:

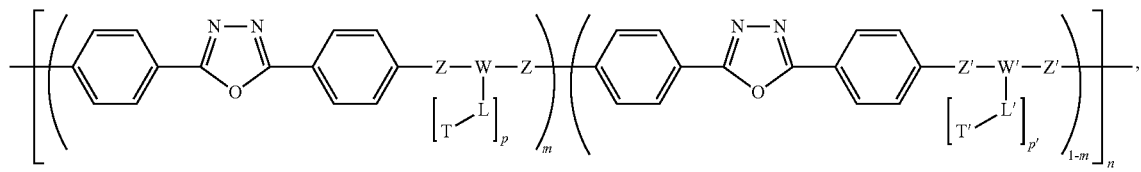
6. The device of claim 4, wherein at least one of x is not 0.
7. The device of claim 1, wherein the polymer has the formula:
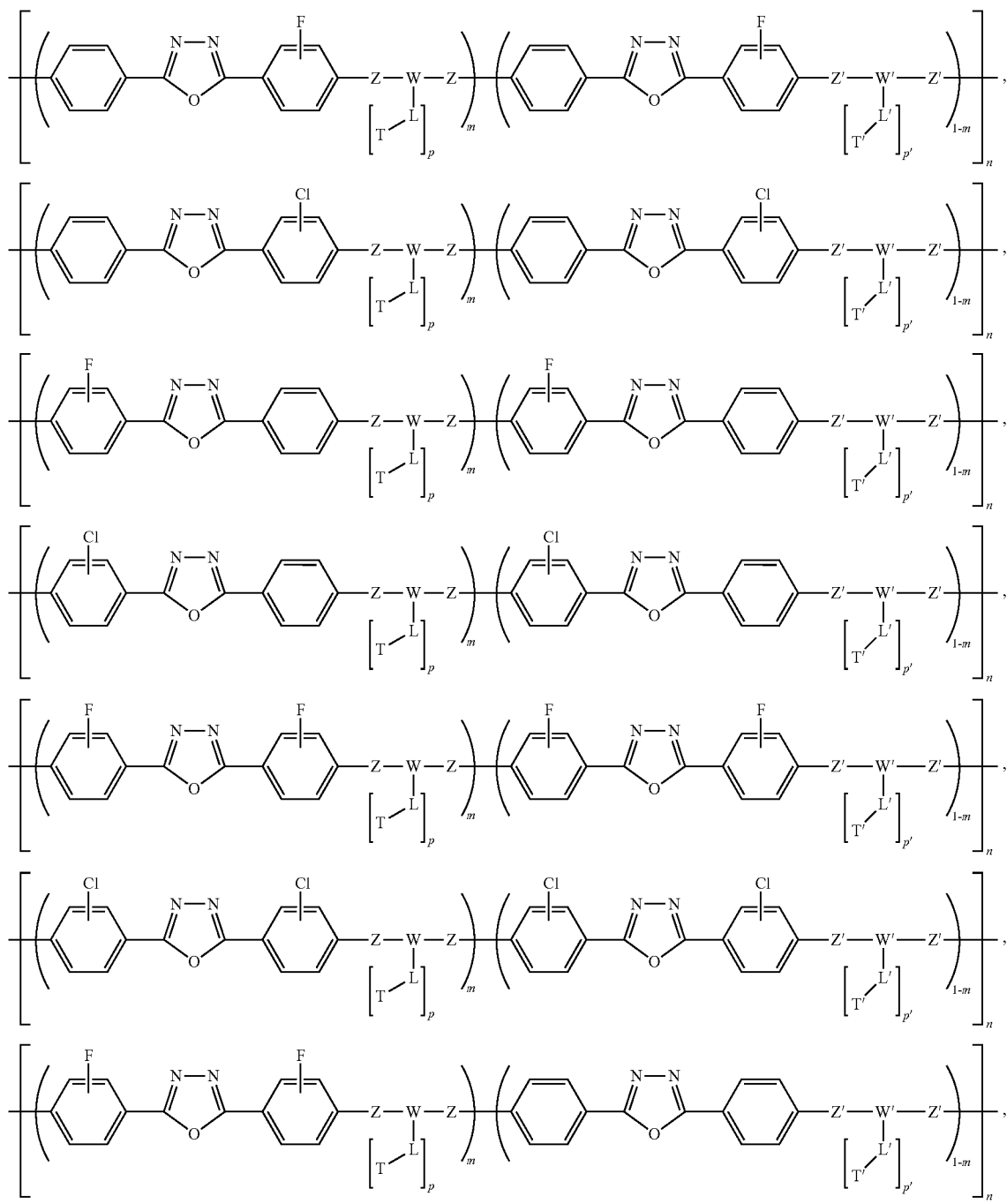

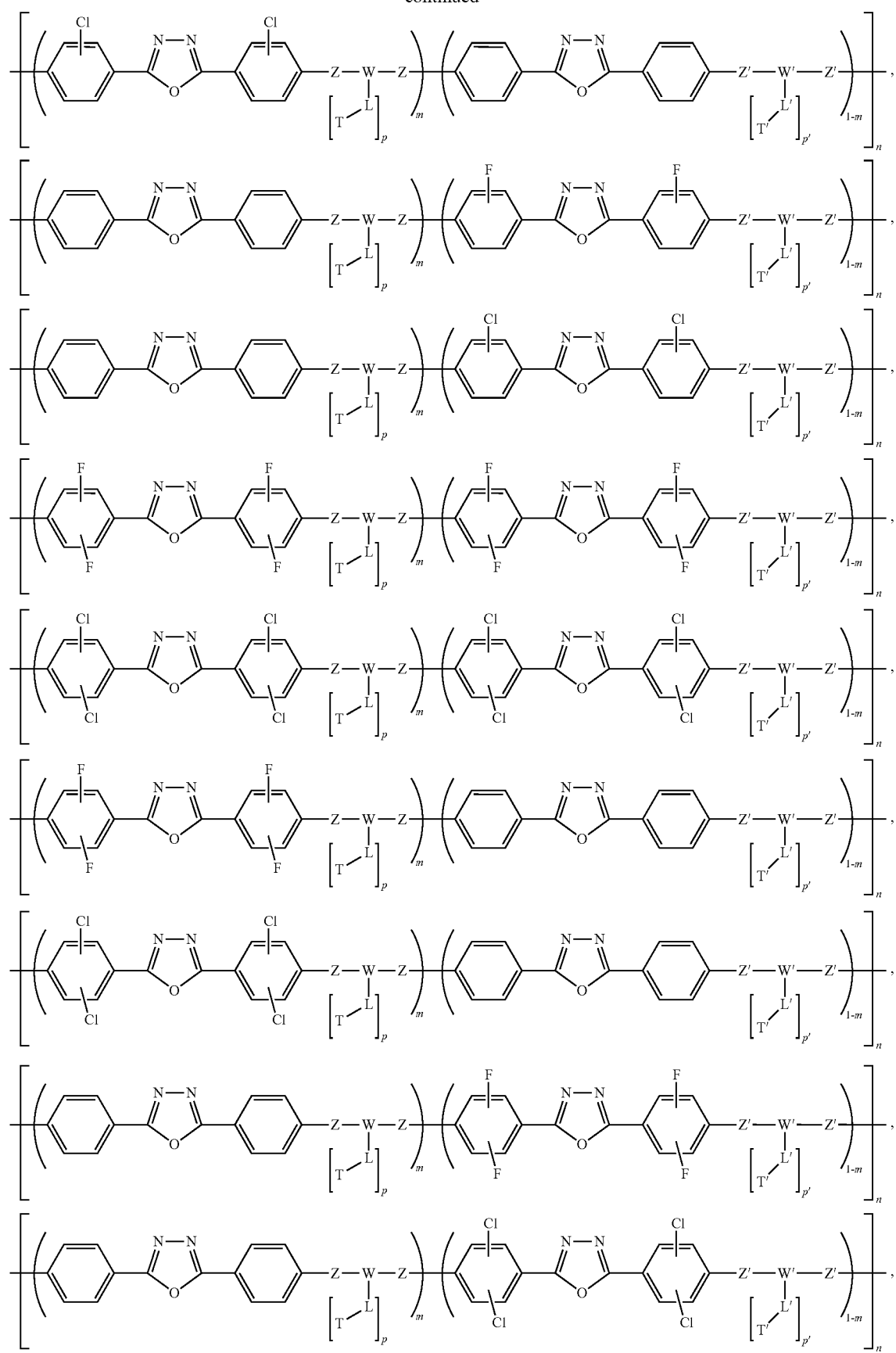

-continued
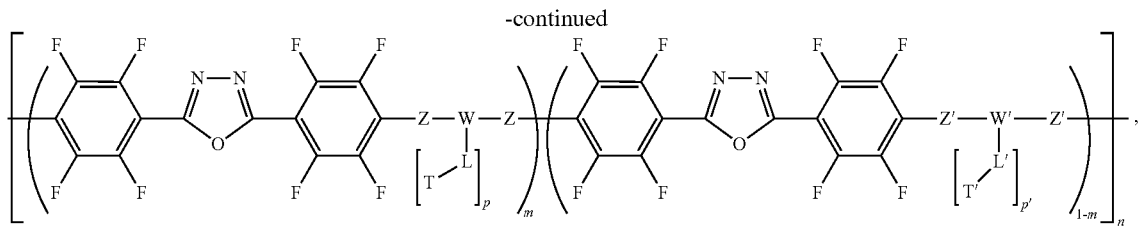
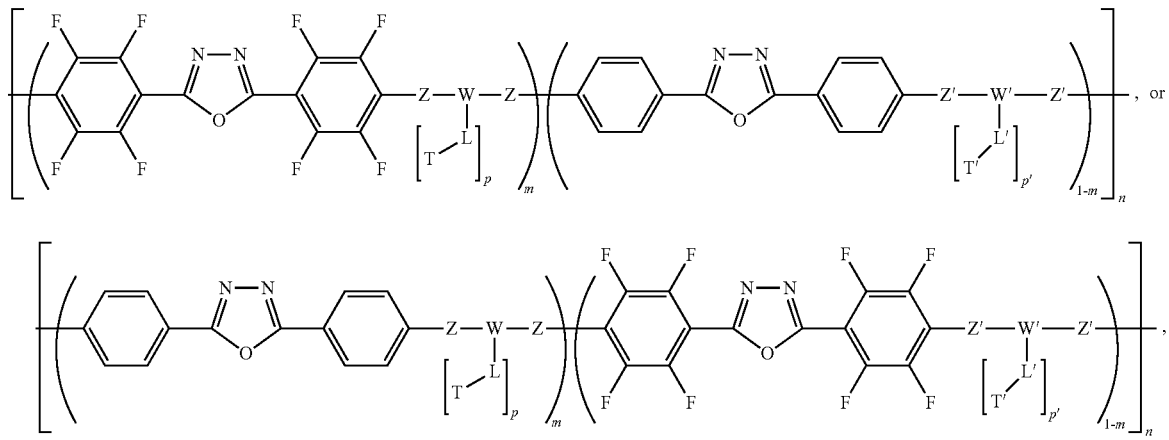
8. The device of claim 1, wherein Z and Z' are O or S.
9. The device of claim 8, wherein W and W' are selected from:
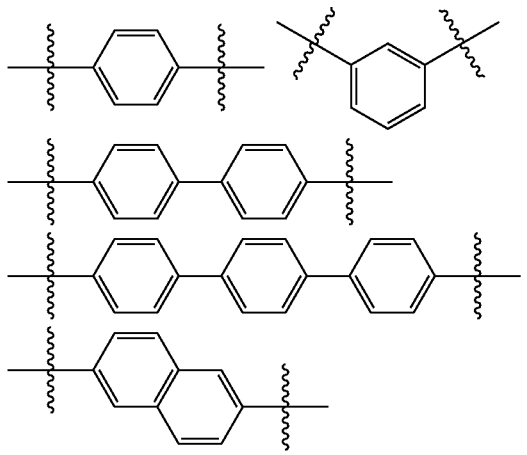
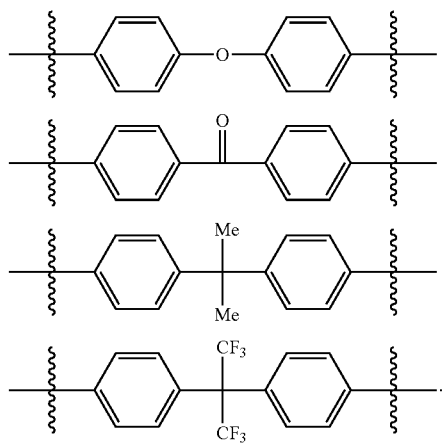
10. The device of claim 1, wherein the polymer is a homopolymer of a repeat unit selected from the group consisting of:
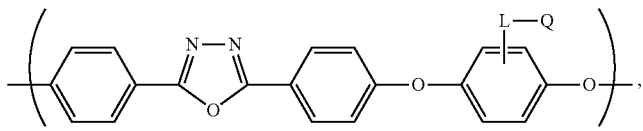
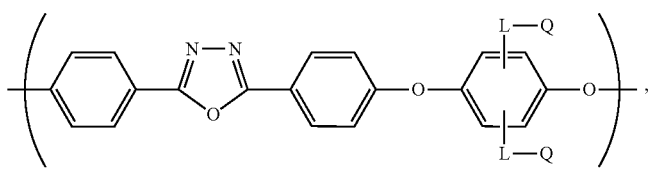

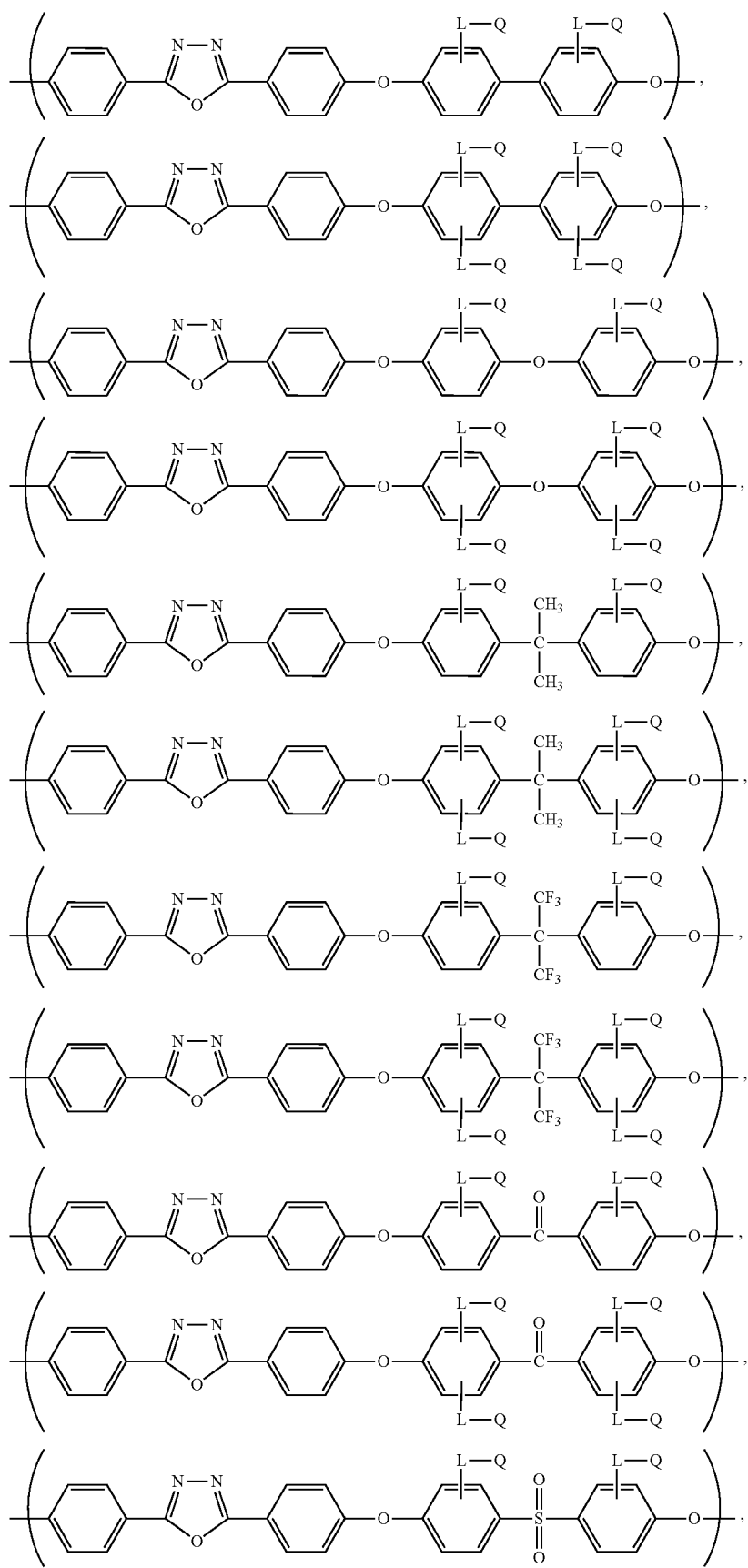

-continued
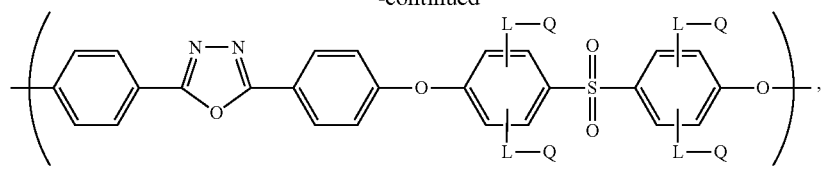
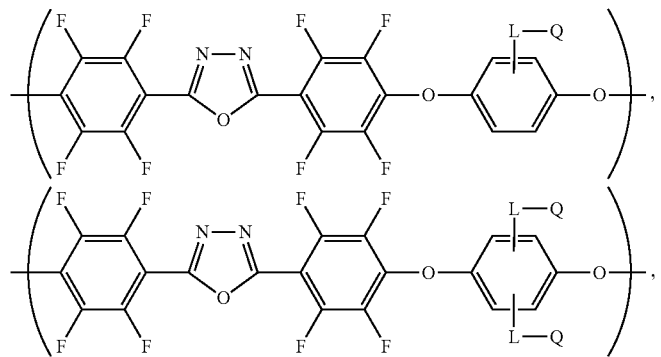
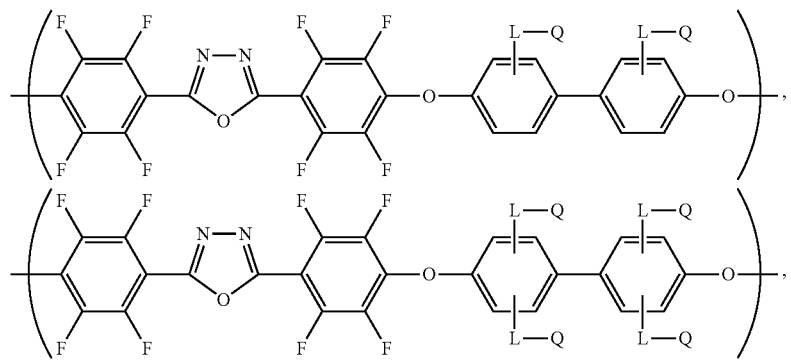
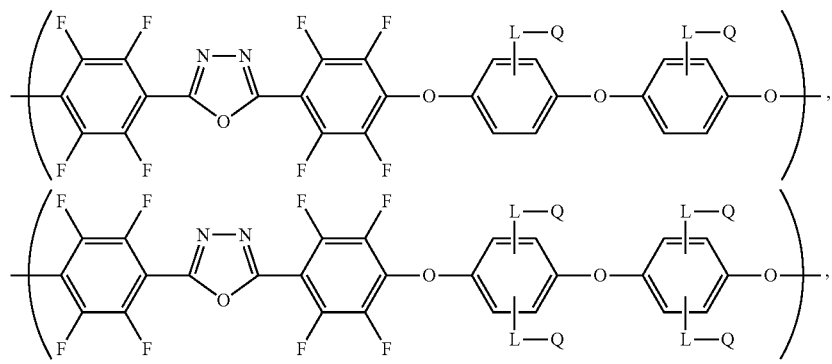
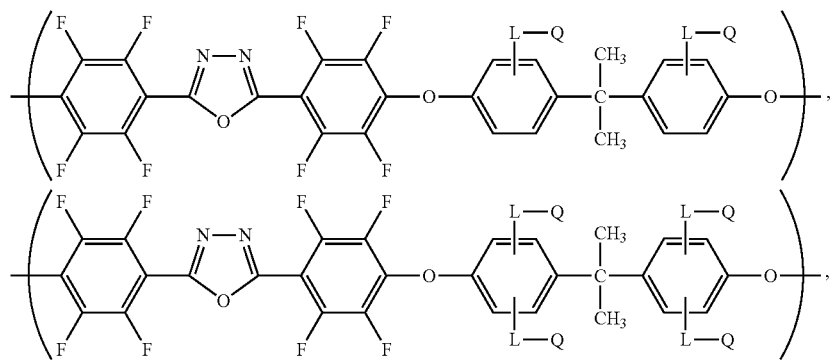

-continued
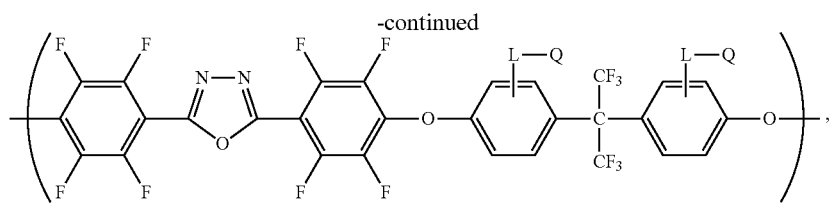
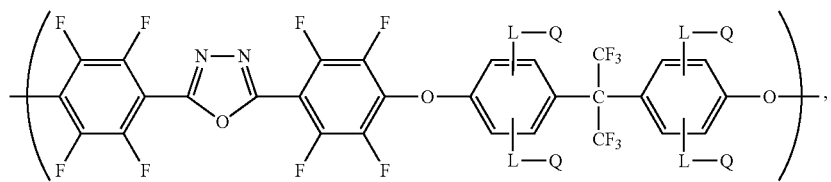
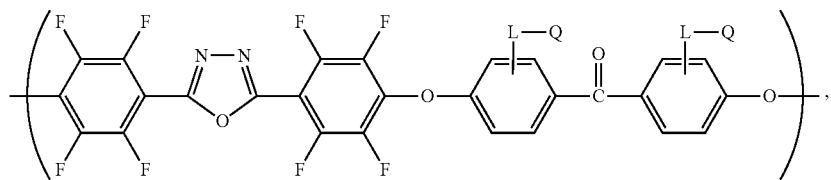
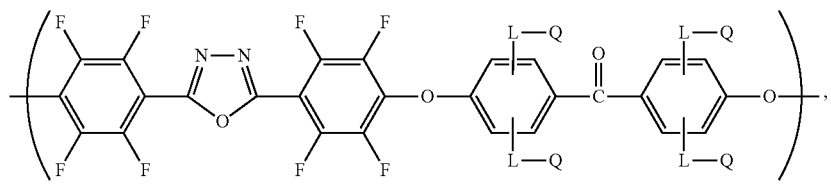
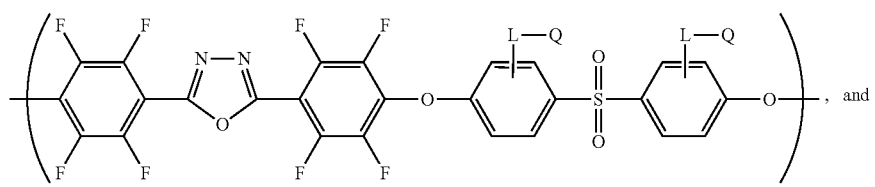, and
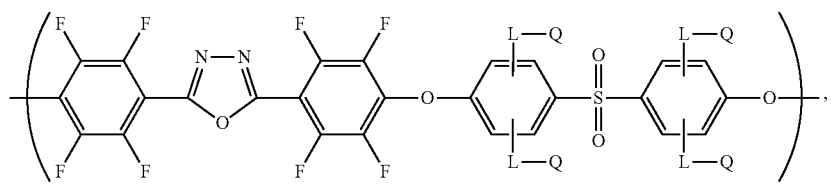
11. The device of claim 10, wherein Q is selected from the group consisting of:
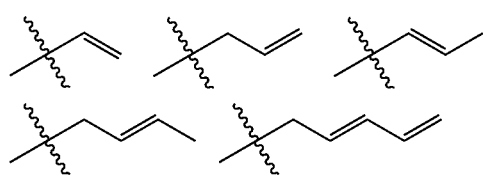
-continued
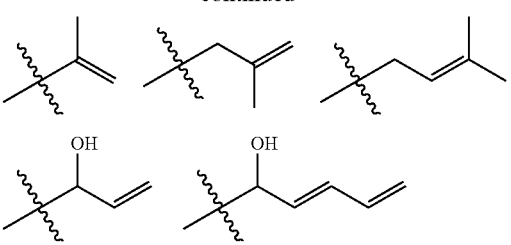

-continued
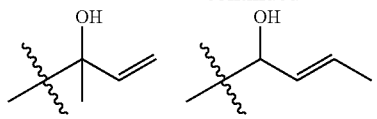
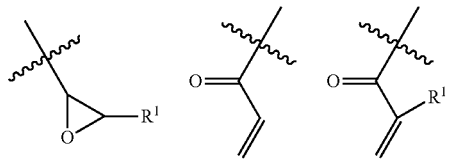
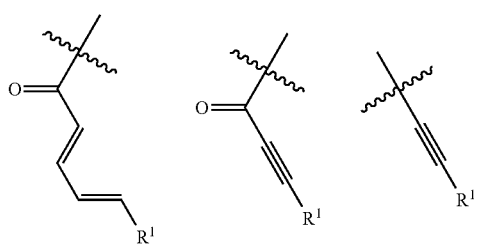
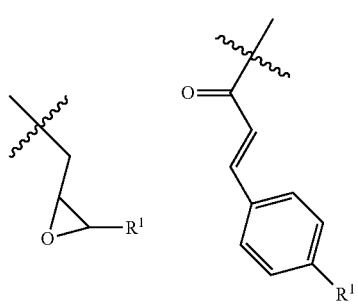
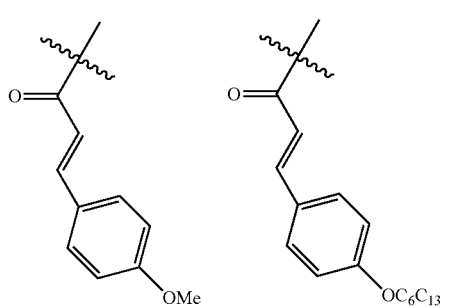
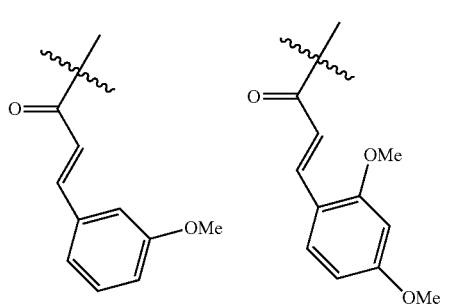
-continued
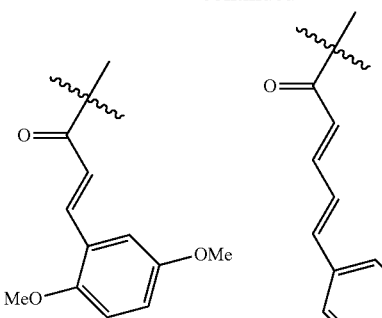
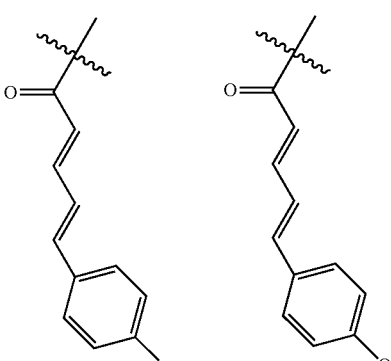
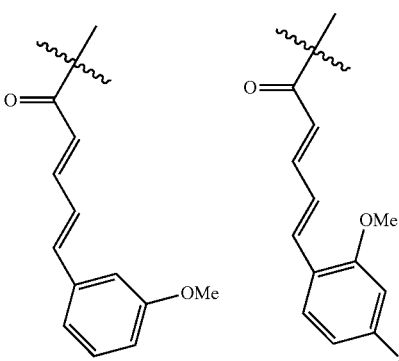
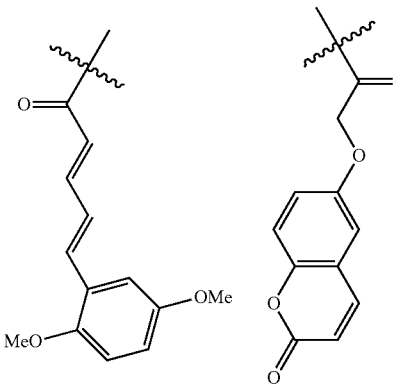

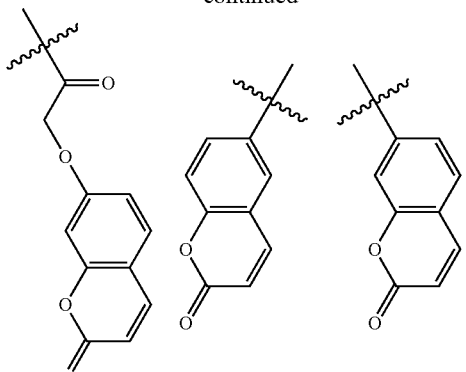
and
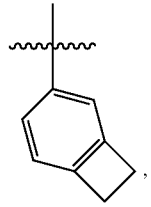
wherein $R^1$ is H or a $C_{1\text{-}20}$ alkyl group.
12. The device of claim 1, wherein the polymer is a homopolymer of a repeat unit selected from the group consisting of:
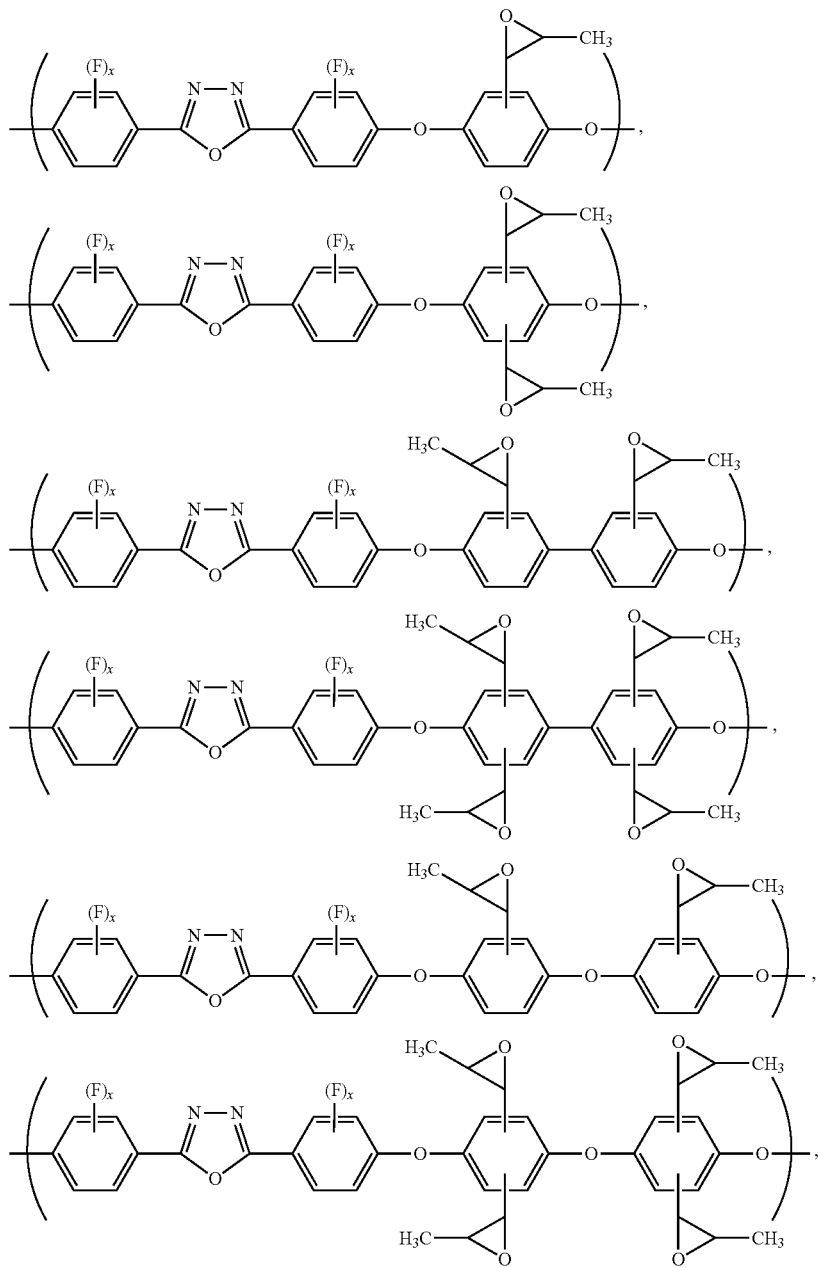

-continued
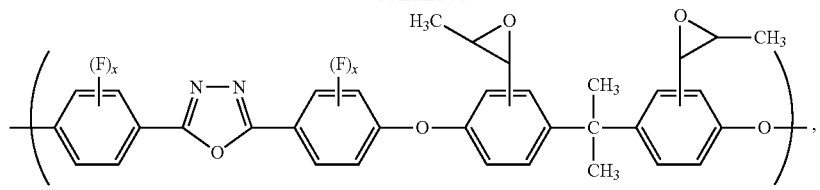
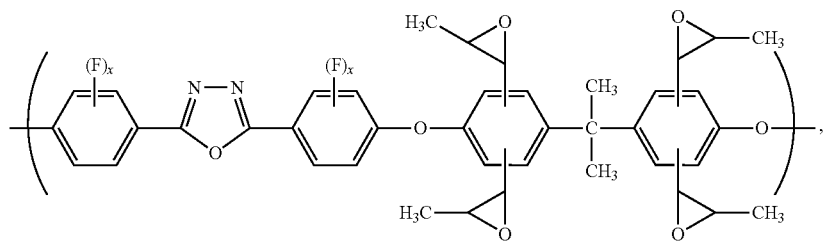
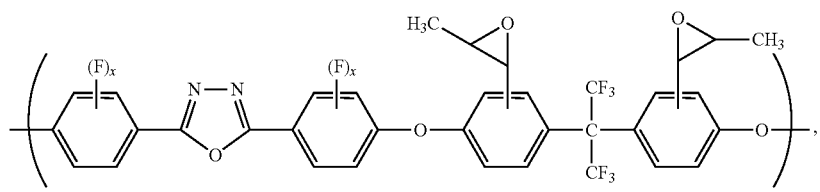
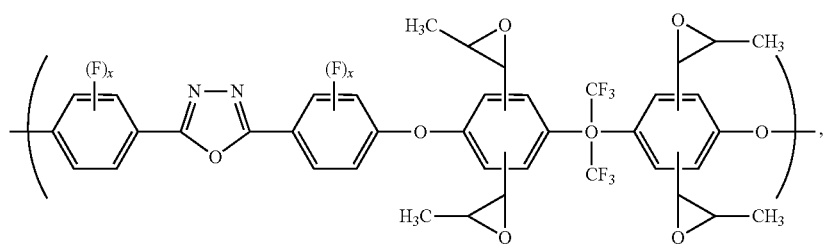
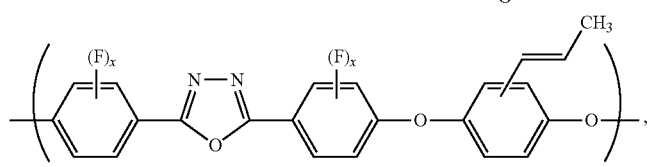
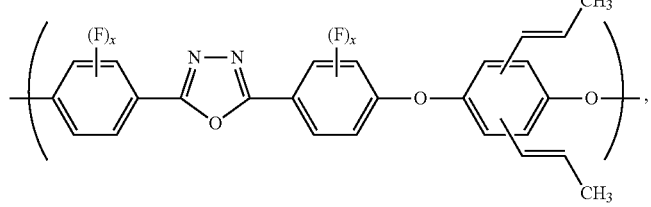
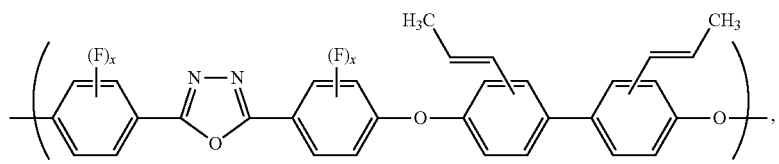
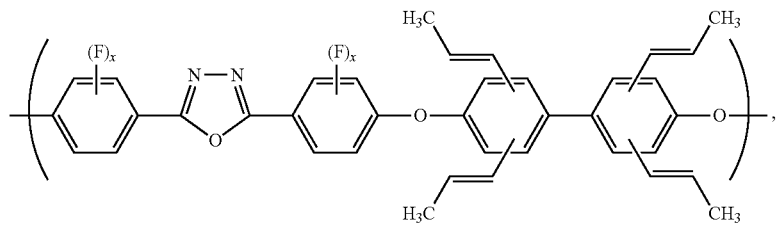

-continued
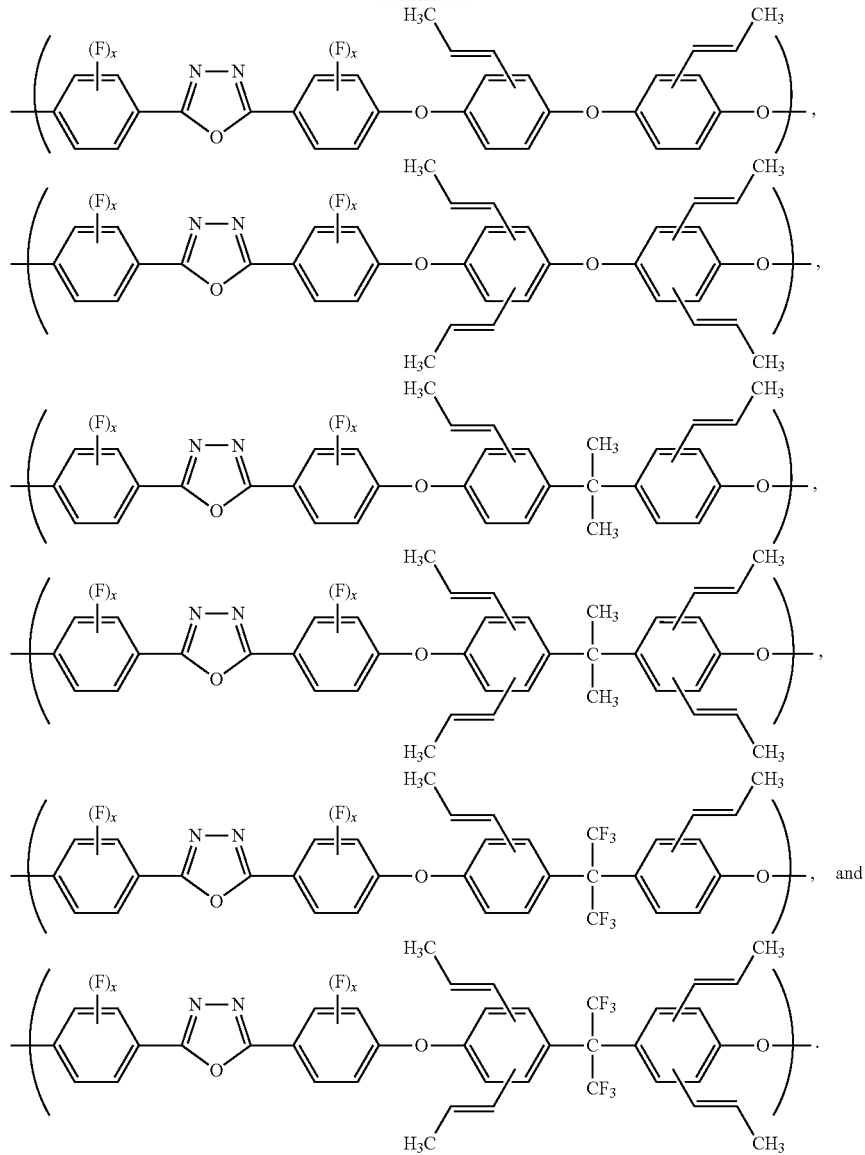
13. The device of claim 1, wherein m<1, and wherein the polymer is a copolymer of the repeat units
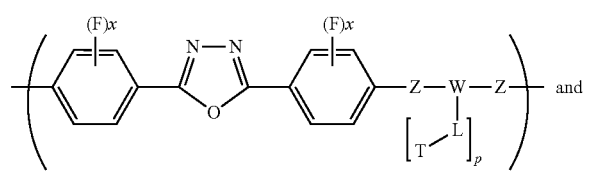
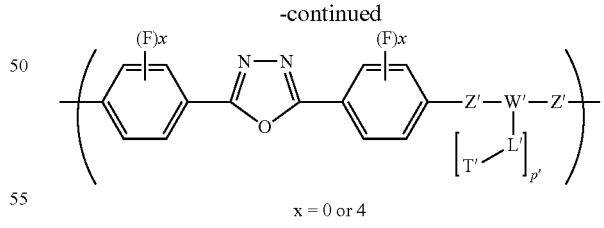
which are different and independently are selected from the group consisting of:
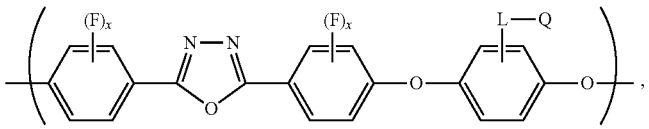

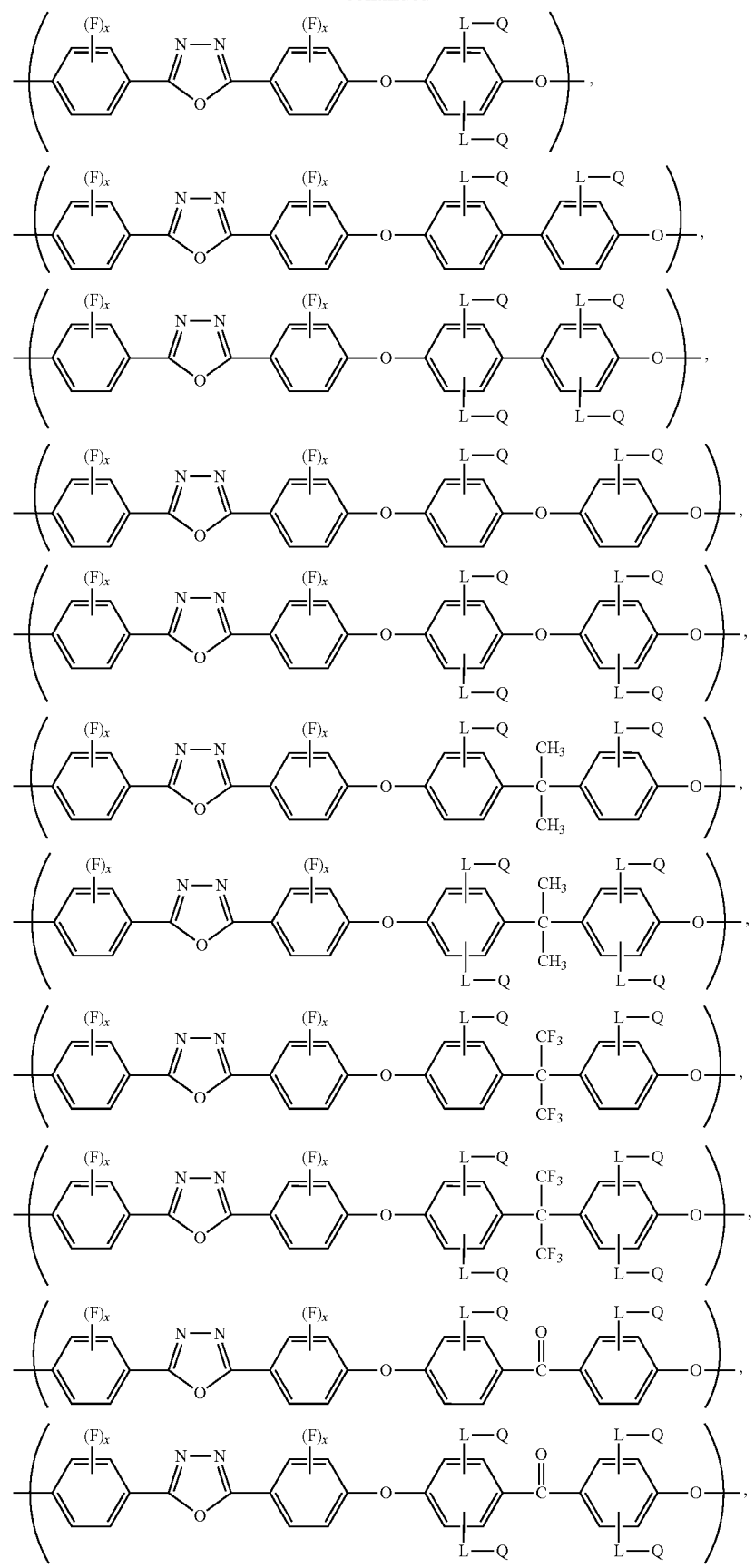

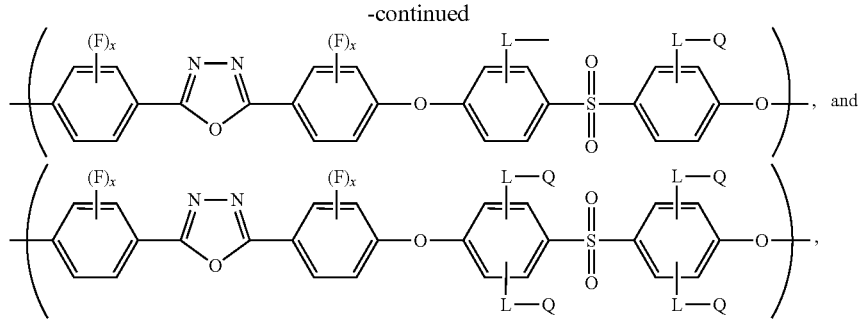
wherein each -L-Q group independently is selected from the group consisting of:
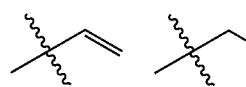  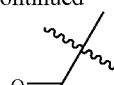
-continued
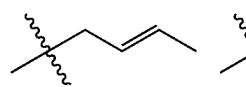 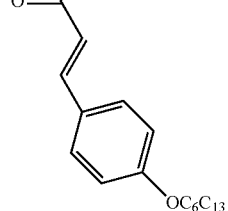
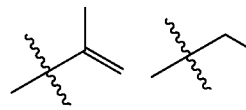
 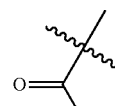 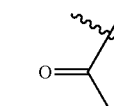
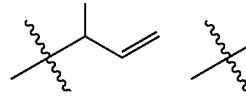 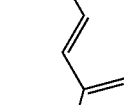 
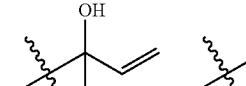  
 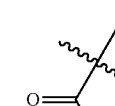 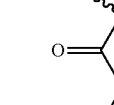
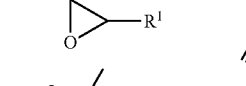  
 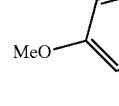 
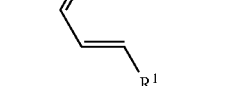  
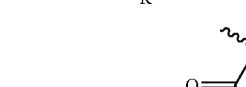 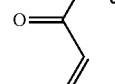 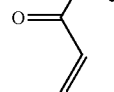
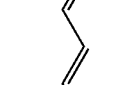 
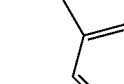 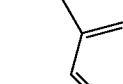
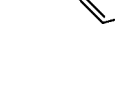 

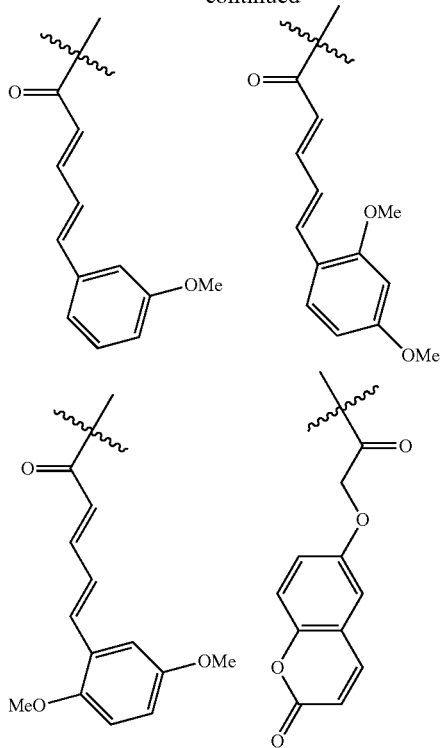
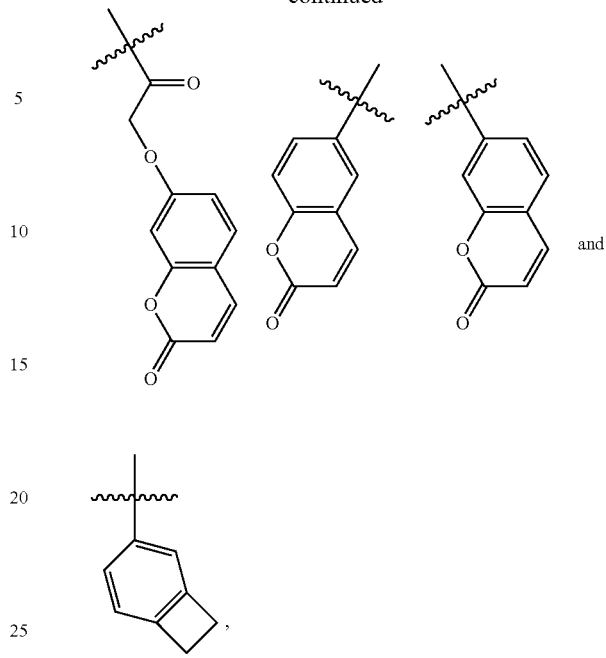
wherein $R^1$ is H or a $C_{1-20}$ alkyl group.
14. The device of claim 1, wherein the polymer is a copolymer of:
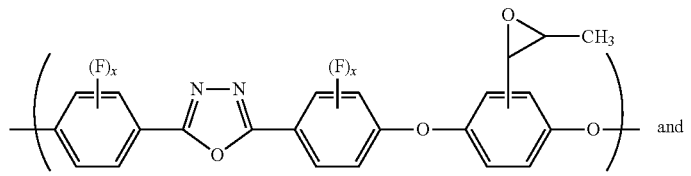
and
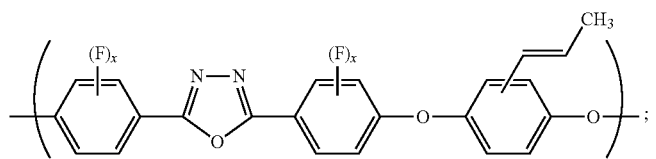
;
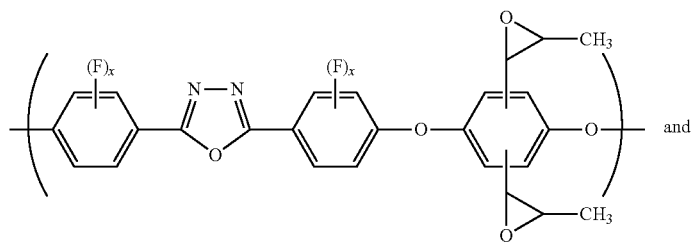
and
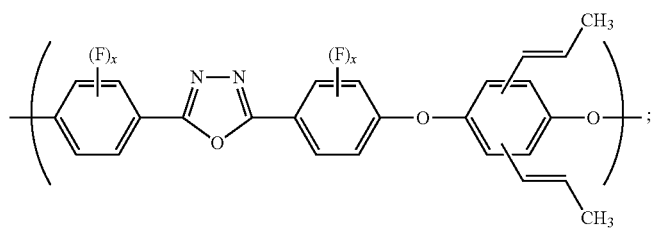
;

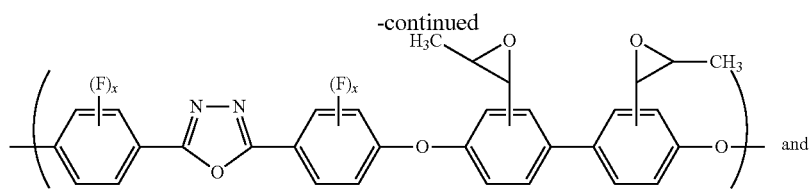 and
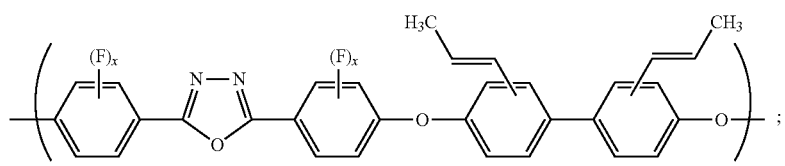;
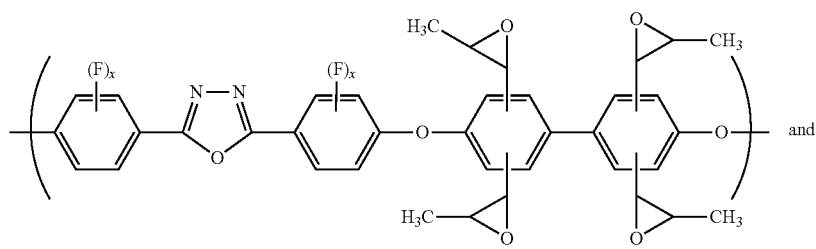 and
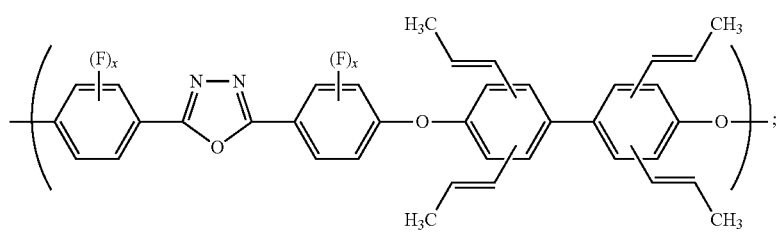;
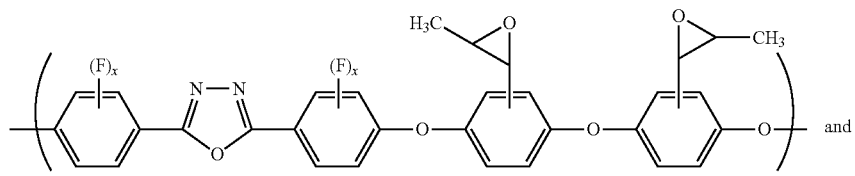 and
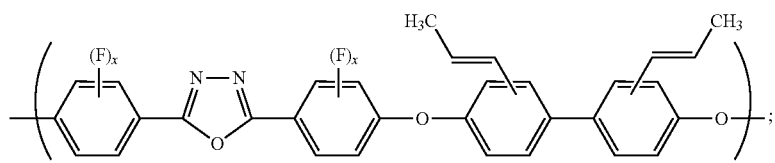;
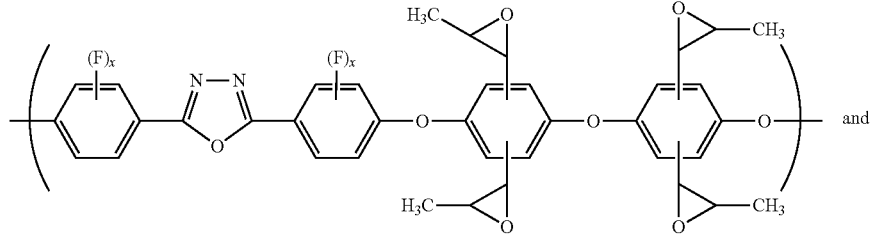 and
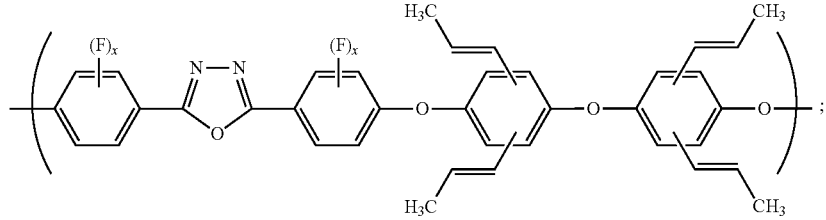;

-continued
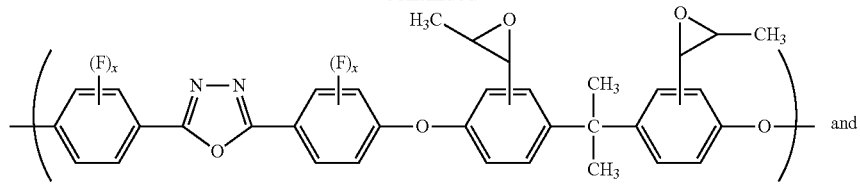 and
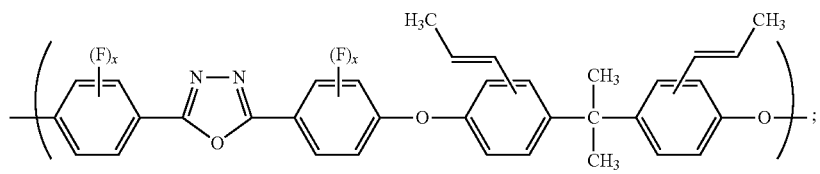;
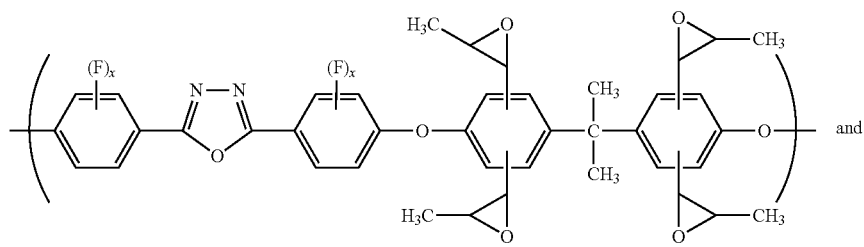 and
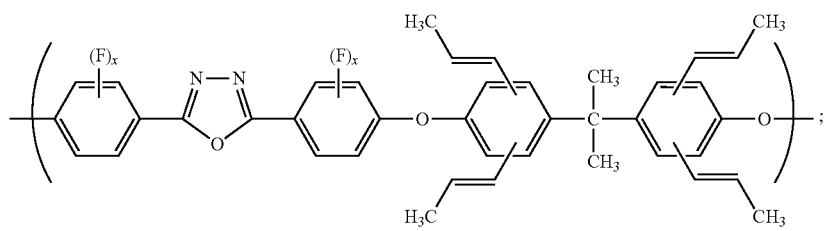;
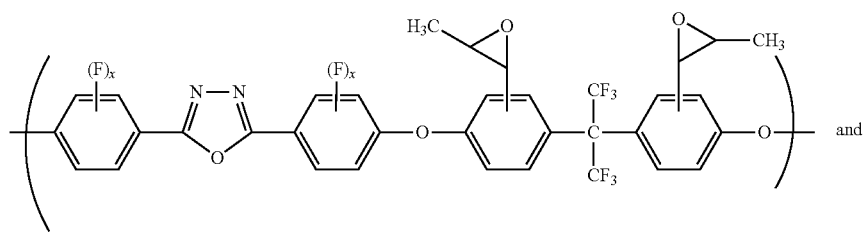 and
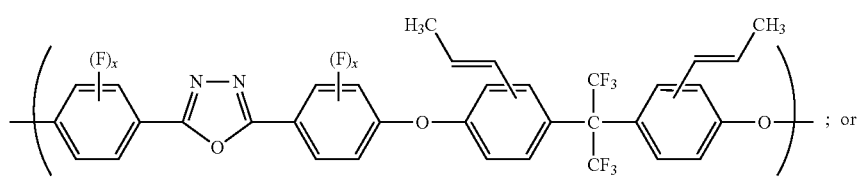; or
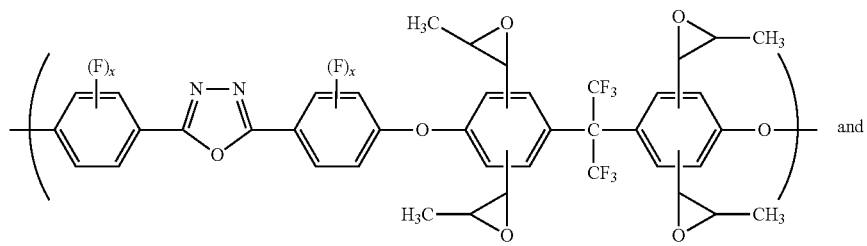 and -continued
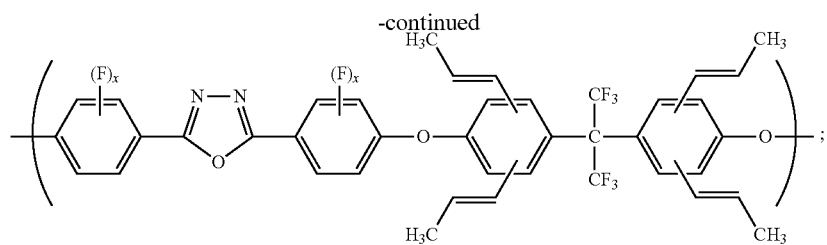
wherein x is 0 or 4.
15. The device of claim 1, wherein the polymer is a copolymer of:
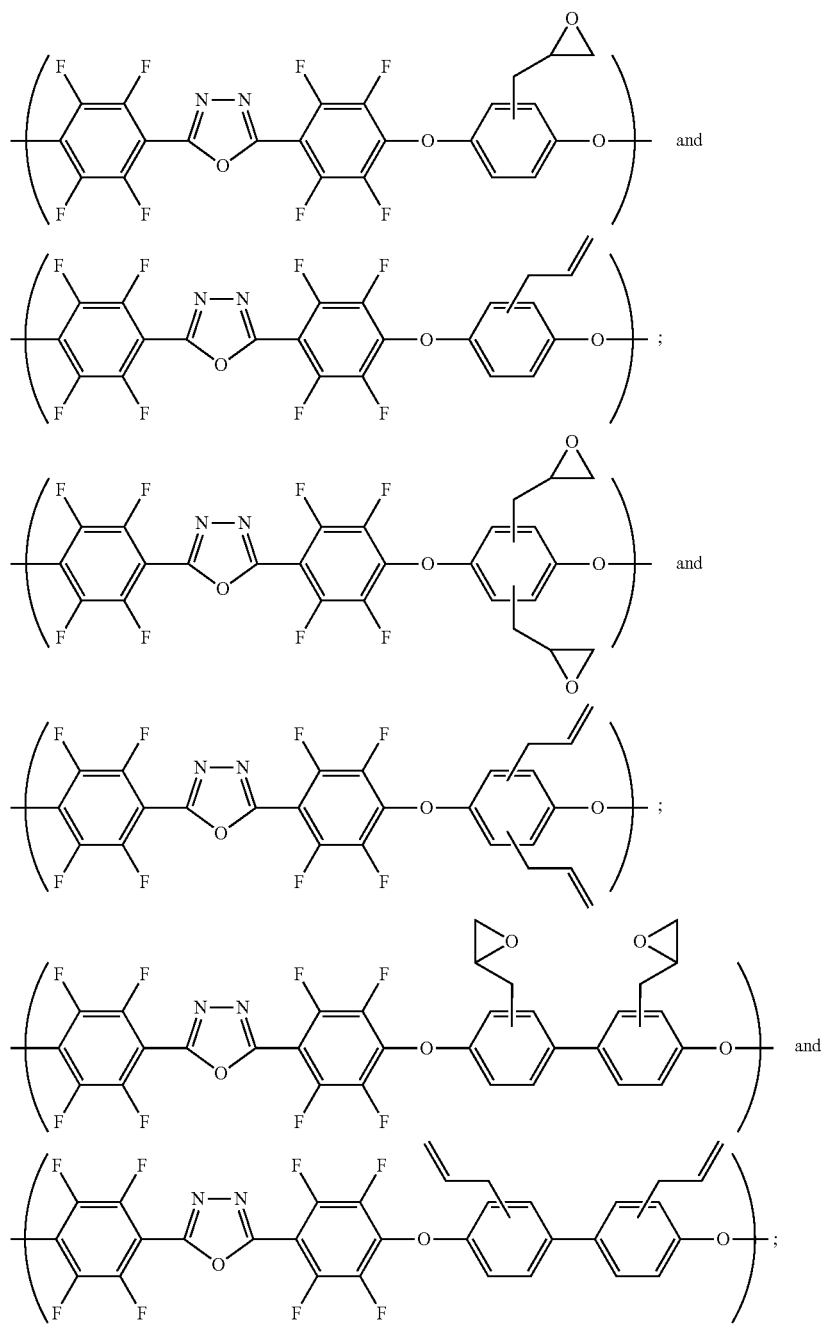

-continued
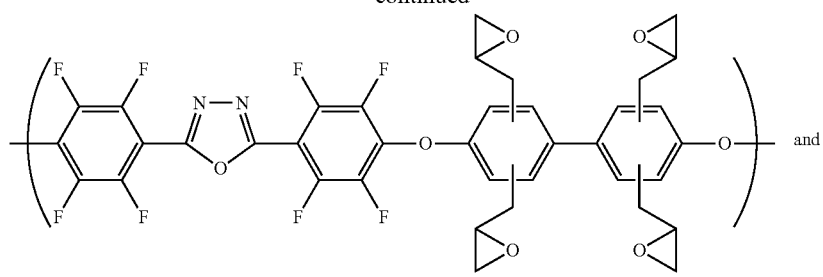
and
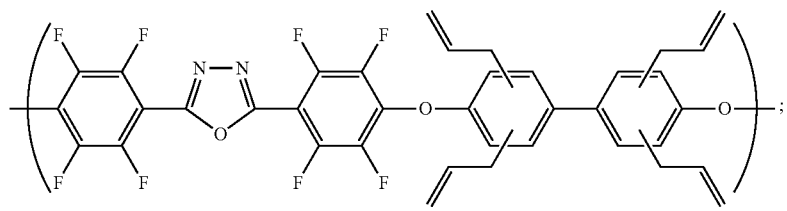
;
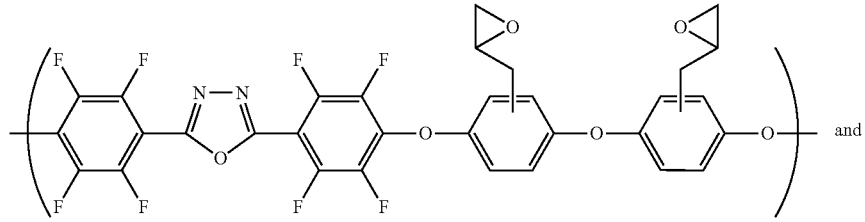
and
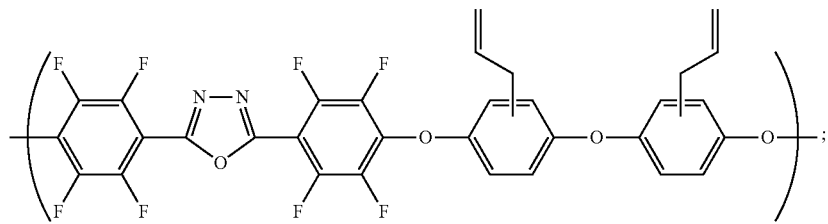
;
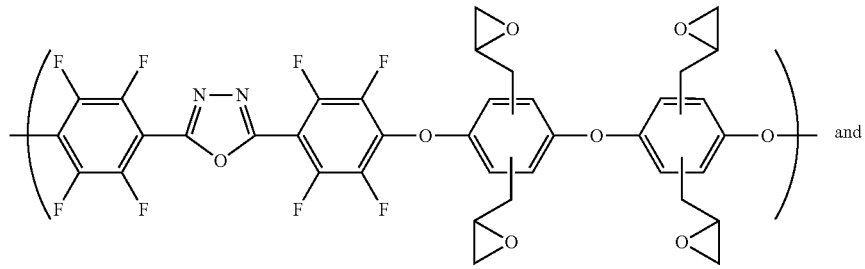
and
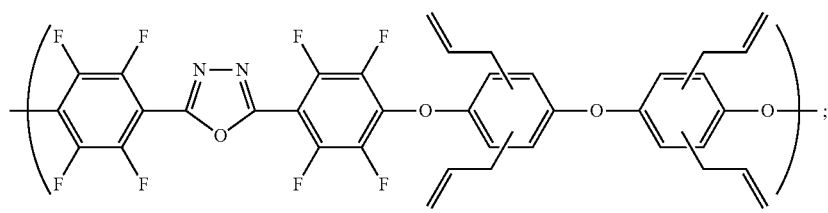
;
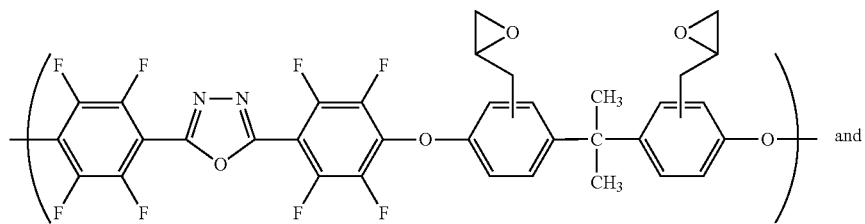
and -continued
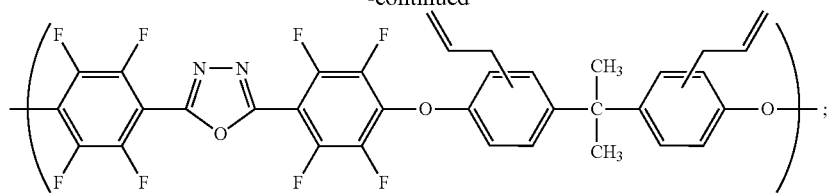
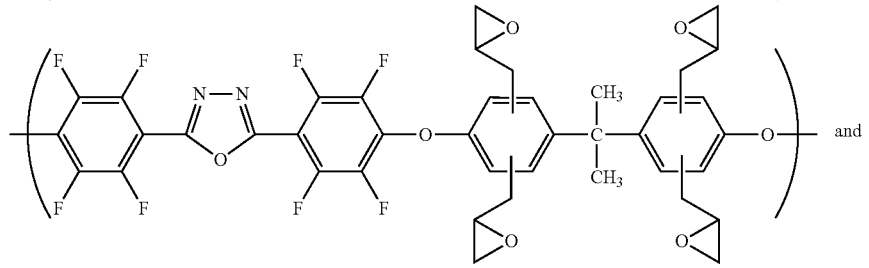
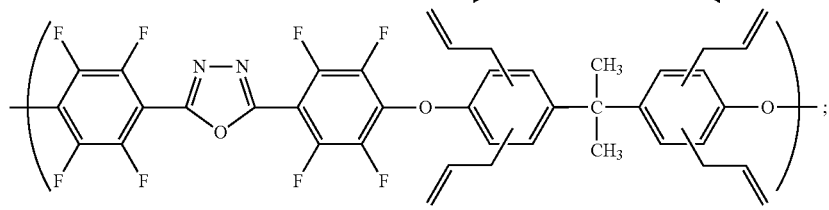
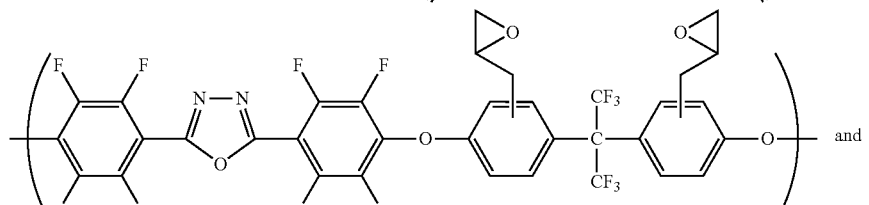
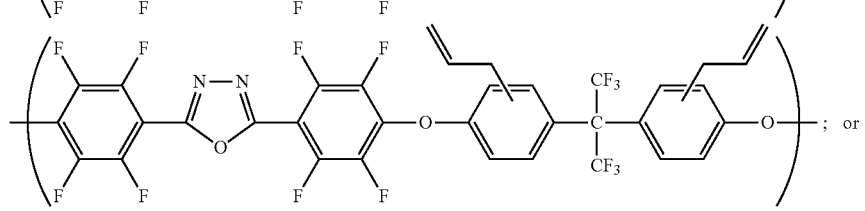
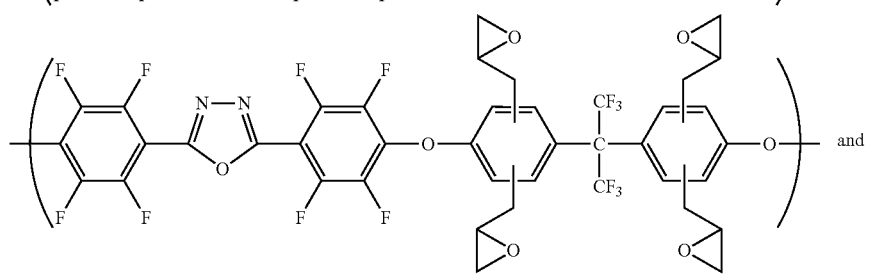
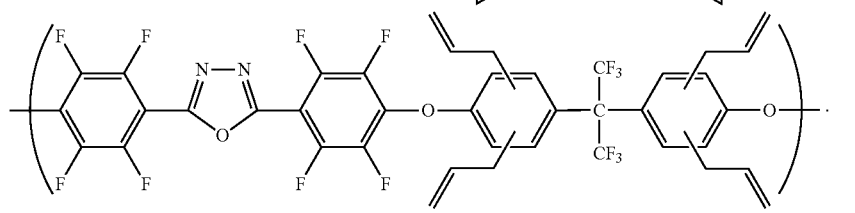
* * * * *